United States Patent
Tokumitsu et al.

(10) Patent No.: US 9,786,594 B2
(45) Date of Patent: Oct. 10, 2017

(54) SEMICONDUCTOR DEVICE

(71) Applicant: Renesas Electronics Corporation, Kawasaki-shi, Kanagawa (JP)

(72) Inventors: Shigeo Tokumitsu, Kawasaki (JP); Takahiro Mori, Kawasaki (JP); Tetsuya Nitta, Kawasaki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 147 days.

(21) Appl. No.: 14/516,806

(22) Filed: Oct. 17, 2014

(65) Prior Publication Data
US 2015/0115410 A1   Apr. 30, 2015

(30) Foreign Application Priority Data
Oct. 30, 2013 (JP) ................. 2013-225212

(51) Int. Cl.
*H01L 23/522* (2006.01)
*H01L 49/02* (2006.01)
(Continued)

(52) U.S. Cl.
CPC ...... *H01L 23/5228* (2013.01); *H01L 27/0802* (2013.01); *H01L 28/20* (2013.01);
(Continued)

(58) Field of Classification Search
CPC ......... H01L 2924/0002; H01L 2924/00; H01L 23/5228; H01L 23/5223; H01L 28/20;
(Continued)

(56) References Cited

U.S. PATENT DOCUMENTS 6,709,918 B1 *  3/2004  Ng ................. H01L 23/5223
                                              257/E21.004
8,367,514 B2 *  2/2013  Goebel ........... H01L 21/31687
                                              257/E21.011
(Continued)

FOREIGN PATENT DOCUMENTS

| JP | 2001-267320 A | 9/2001 |
| JP | 2008-130918 A | 6/2008 |
| JP | 2011-155192 A | 8/2011 |

OTHER PUBLICATIONS

Communication dated Aug. 3, 2015 from the European Patent Office in counterpart application No. 14190281.7.

*Primary Examiner* — Edward Chin
(74) *Attorney, Agent, or Firm* — Sughrue Mion, PLLC

(57) ABSTRACT

A plurality of first wiring layers are arranged on a main surface of a substrate, a first insulating film is arranged on upper faces of the plurality of first wiring layers, a second insulating film is arranged on an upper face of the first insulating film, and a plurality of second wiring layers are arranged on the second insulating film. A metal resistive element layer is arranged just below at least one second wiring layer among the plurality of second wiring layers. A plurality of conductive layers extend from the plurality of second wiring layers respectively to the metal resistive element layer in a Z direction perpendicular to the main surface. The metal resistive element layer includes a metal wiring layer. At least one part of a side face of at least one conductive layer among the plurality of conductive layers is connected to the metal wiring layer.

6 Claims, 35 Drawing Sheets

(51) Int. Cl.
*H01L 27/08* (2006.01)
*H01L 23/532* (2006.01)

(52) U.S. Cl.
CPC .. *H01L 23/53223* (2013.01); *H01L 23/53266* (2013.01); *H01L 28/24* (2013.01); *H01L 2224/05554* (2013.01)

(58) Field of Classification Search
CPC ............... H01L 28/40; H01L 21/31687; H01L 23/53228; H01L 27/016; H01L 27/0802; H01L 27/0805; H01L 29/7833
USPC ... 257/E21.004, E21008, E21.011, E23.161, 257/E29.002, 536, 758; 438/253, 393, 438/396, 638, 672, 959
See application file for complete search history.

(56) References Cited

U.S. PATENT DOCUMENTS

| | | | |
|---|---|---|---|
| 2004/0238962 A1* | 12/2004 | Jung | H01L 23/5228 257/758 |
| 2010/0295661 A1* | 11/2010 | Subramanian | G06K 7/0008 340/10.1 |
| 2011/0180901 A1 | 7/2011 | Matsumura | |
| 2013/0234292 A1* | 9/2013 | Wei | H01L 23/5228 257/536 |

\* cited by examiner

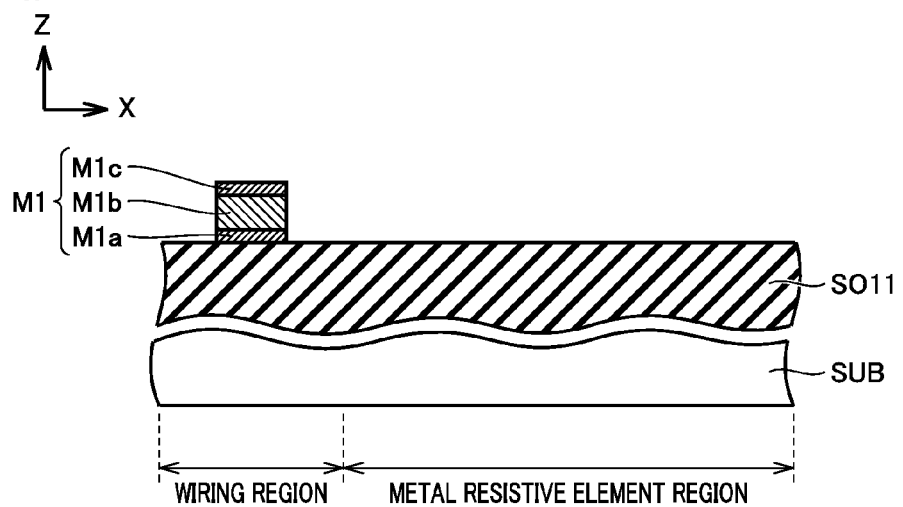
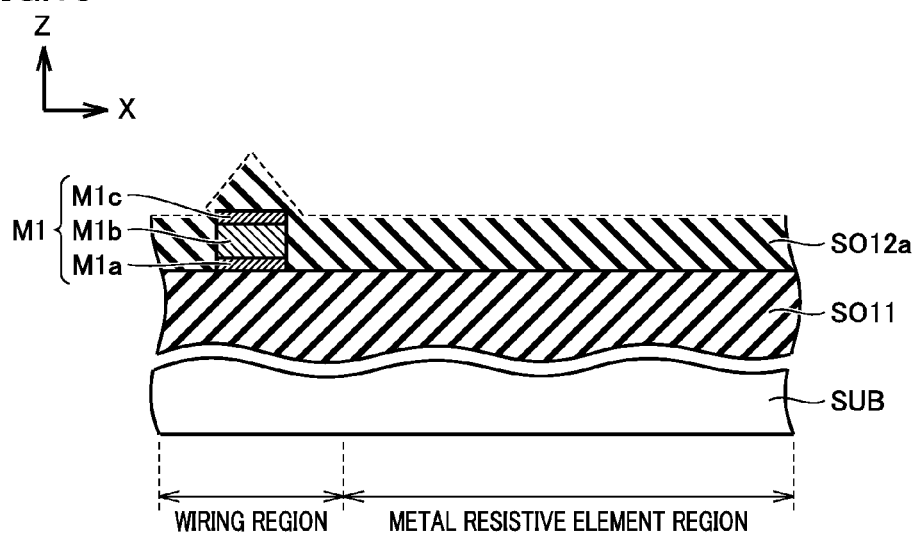

SEMICONDUCTOR DEVICE

BACKGROUND OF THE INVENTION

Field of the Invention

The present invention relates to a semiconductor device and more particularly, to a semiconductor device having a metal resistive element layer.

Description of the Background Art

Conventionally, a microcomputer product and an oscillator are different in structure, but recently, by incorporating the oscillator in a microcomputer chip, a layout area has become small and the cost has been reduced, and the like. In the case where the oscillator is incorporated in the microcomputer chip, it is necessary to output a stable oscillation frequency in various environments (such as voltage and temperature), so that as for a high-speed OCO (On Chip Oscillator) circuit of the microcomputer product, it is required to attain 40 MHz±1% as target precision.

Here, as a resistor of a constant-current generation circuit in the high-speed OCO (On Chip Oscillator) circuit serving as an analog circuit, a polysilicon resistor is used. However, as for the polysilicon resistor, its resistance value is fluctuated by a stress due to a piezo resistance effect. Especially, the resistance value is considerably fluctuated due to a mold stress that occurs in a packaging step or thereafter. Thus, a frequency of the high-speed OCO circuit is largely fluctuated, which could make it difficult to attain the target precision of the high-speed OCO.

The high-speed OCO circuit in the microcomputer product is normally formed to have a multilayer wiring structure, and the resistor is mostly formed on a uppermost layer of the multilayer wiring structure. Therefore, an upper face of the resistor is directly covered with a protective film, and it is likely to receive a stress from the protective film. With a view to suppressing a variation in resistance value due to the stress from the protective film, a technique in which the resistor is formed on the layer under the uppermost layer of the multilayer wiring structure has been disclosed in Japanese Patent Laying-Open No. 2001-267320, Japanese Patent Laying-Open No. 2011-155192, and Japanese Patent Laying-Open No. 2008-130918.

According to Japanese Patent Laying-Open No. 2001-267320, a wiring layer and a resistor are electrically connected through a conductive layer (buried contact hole) extending from the wiring layer positioned above the resistor to the resistor. Meanwhile, according to Japanese Patent Laying-Open No. 2011-155192, a resistor and a wiring layer positioned below the resistor are electrically connected through a conductive layer (contact plug) extending downward from the resistor.

However, Japanese Patent Laying-Open No. 2001-267320 and Japanese Patent Laying-Open No. 2011-155192, and Japanese Patent Laying-Open No. 2008-130918 in which an electrical connection is not made by the conductive layer do not disclose an idea that simultaneously forms, with the same mask, a conductive layer to be electrically connected to the resistor formed on the layer lower than the uppermost layer, and a conductive layer to connect the wiring layers that are not the resistor. Thus, as long as there is no idea that simultaneously forms the conductive layer for the resistor, and the conductive layer for the wiring layers that are not the resistor, with the same mask, there is a need to form the conductive layer for the resistor and the conductive layer for the wiring layers that are not the resistors, with different masks, which could considerably complicate the step, and increase the manufacturing cost.

The other problems and new characteristics will become more apparent from the description in this specification and the accompanying drawings.

SUMMARY OF THE INVENTION

A semiconductor device according to one embodiment includes a plurality of first wiring layers, a first insulating film, a second insulating film, a plurality of second wiring layers, a metal resistive element layer, and a plurality of conductive layers. The plurality of first wiring layers are arranged on a main surface of a substrate. The first insulating film is arranged so as to cover upper faces of the plurality of first wiring layers. The second insulating film is arranged so as to cover an upper face of the first insulating film. The plurality of second wiring layers are arranged on the second insulating film. The metal resistive element layer is arranged on an upper face of the first insulating film so as to be positioned just below at least one second wiring layer among the plurality of second wiring layers. The plurality of conductive layers extends from the plurality of second wiring layers, respectively to the metal resistive element layer in a direction perpendicular to the main surface. The metal resistive element layer includes a metal wiring layer. At least one part of a side face of at least one conductive layer among the plurality of conductive layers is connected to the metal wiring layer.

A semiconductor device according to another embodiment includes at least one first wiring layer, a first insulating film, a second wiring layer, a metal resistive element layer, and a plurality of conductive layers. At least one first wiring layer is arranged on a main surface of a substrate. The first insulating film is arranged so as to cover an upper face of the first wiring layer. The plurality of second wiring layers are arranged on the first insulating film. The metal resistive element layer is arranged closer to the first wiring layer than to the plurality of second wiring layers in a direction perpendicular to the main surface so as to be positioned just below at least one second wiring layer among the plurality of second wiring layers. The plurality of conductive layers extend from the plurality of second wiring layers, respectively to the metal resistive element layer in the direction perpendicular to the main surface. At least one conductive layer among the plurality of conductive layers serves as a resistive element region conductive layer arranged in a metal resistive element region so as to planarly overlap with the metal resistive element layer and extend from at least one second wiring layer, arranged in the metal resistive element region, among the plurality of second wiring layers to the metal resistive element layer. At least one conductive layer among the plurality of conductive layers serves as a wiring region conductive layer extending from at least one second wiring layer among the plurality of second wiring layers to at least one first wiring layer in a wiring region other than the metal resistive element region, and a depth of the resistive element region conductive layer is equal to a depth of the wiring region conductive layer, in the direction perpendicular to the main surface.

A semiconductor device according to still another embodiment includes a plurality of first wiring layers, a first insulating film, at least one metal resistive element layer, a plurality of second wiring layers, and a plurality of conductive layers. The plurality of first wiring layers are arranged on a main surface of a substrate. The first insulating film is arranged so as to cover upper faces of the plurality of first wiring layers. At least one metal resistive element layer is arranged just above at least one first wiring layer among the plurality of first wiring layers so as to cover an upper face of the first insulating film. The plurality of second wiring layers are arranged on the first insulating film. The plurality of conductive layers extend from at least one metal resistive element layer and at least one second wiring layer to the plurality of first wiring layers, respectively in a direction perpendicular to the main surface. An upper face of at least one metal resistive element layer is covered with at least one of the plurality of second wiring layers.

According to one embodiment, since the second wiring layer is arranged just above the metal resistive element layer, it is possible to provide the semiconductor device capable of reducing the possibility that the precision as the oscillator is deteriorated because the metal resistive element layer receives a stress from the upper layer.

According to the other embodiment, since each of the resistive element region conductive layer and the wiring region conductive layer is formed so as to extend from the second wiring layer on the first insulating film, it is not necessary to separately prepare the mask for forming only the conductive layer to be connected to the metal resistive element layer at the time of forming the semiconductor device. That is, the resistive element region conductive layer can be formed with the mask to be used for forming the wiring region conductive layer. As a result, it is possible to provide the semiconductor device capable of reducing the manufacturing cost.

According to the still other embodiment, since the upper face of the metal resistive element layer is covered with the second wiring layer, the metal resistive element layer is protected by the second wiring layer. Therefore, it is possible to provide the semiconductor device capable of enhancing reliability of the metal resistive element layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a schematic cross-sectional view showing a first step of a method of manufacturing the structure in FIG. 16 especially, in the second embodiment.

FIG. 18 is a schematic cross-sectional view showing a second step of the method of manufacturing the structure in FIG. 16 especially, in the second embodiment.

DESCRIPTION OF THE PREFERRED EMBODIMENTS

Hereinafter, embodiments will be described with reference to the drawings.

First Embodiment

First, a description will be given to a configuration of a microcomputer chip as a configuration of a semiconductor device in this embodiment with reference to FIG. 1.

Figure 1:
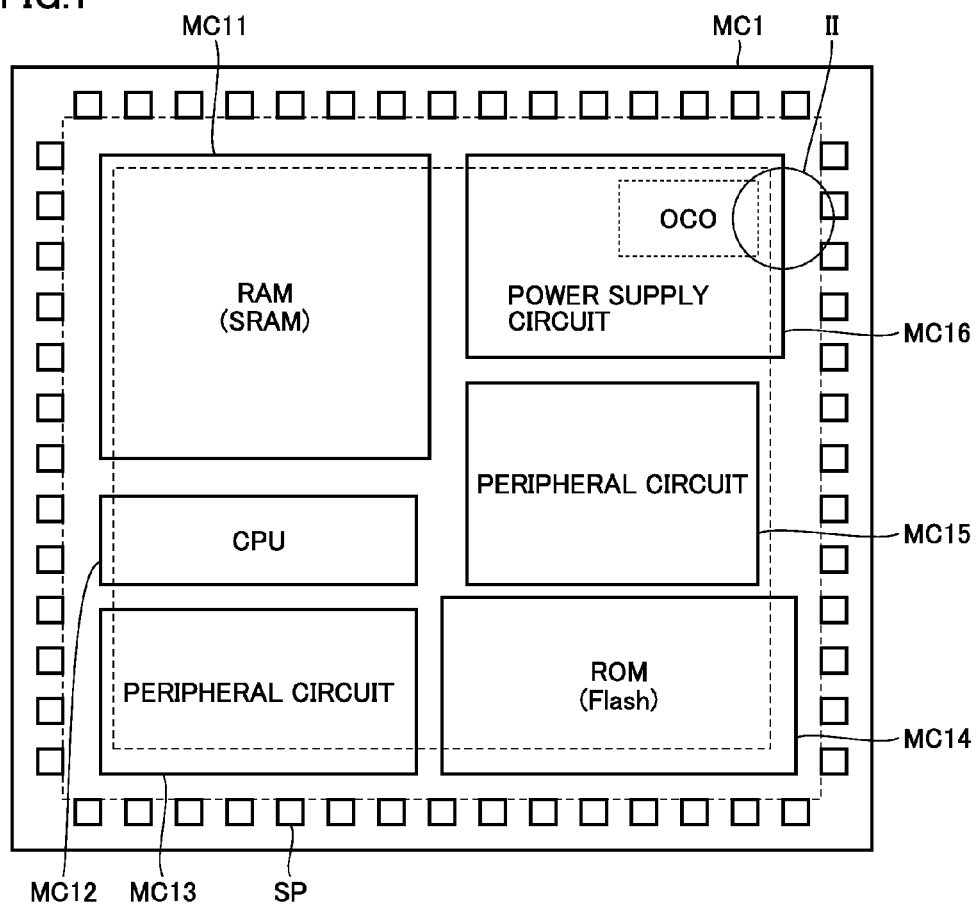
FIG. 1 is a plan view showing an entire structure of a microcomputer chip mounting a semiconductor device in a first embodiment.

Referring to FIG. 1, a microcomputer chip MC1 includes a RAM-forming region MC11, a CPU-forming region MC12, peripheral circuit-forming regions MC13 and MC15, a ROM-forming region MC14, and a power supply circuit region MC16. Power supply circuit region MC16 includes a high-speed OCO circuit. A plurality of electrode pads SP are arranged apart from each other so as to surround these regions. In addition, this layout configuration is just one example of the microcomputer chip, and the present invention is not limited to this.

Next, a description will be given to a partial structure of the high-speed OCO circuit, as one example of the semiconductor device, with reference to FIG. 2.

Figure 2:
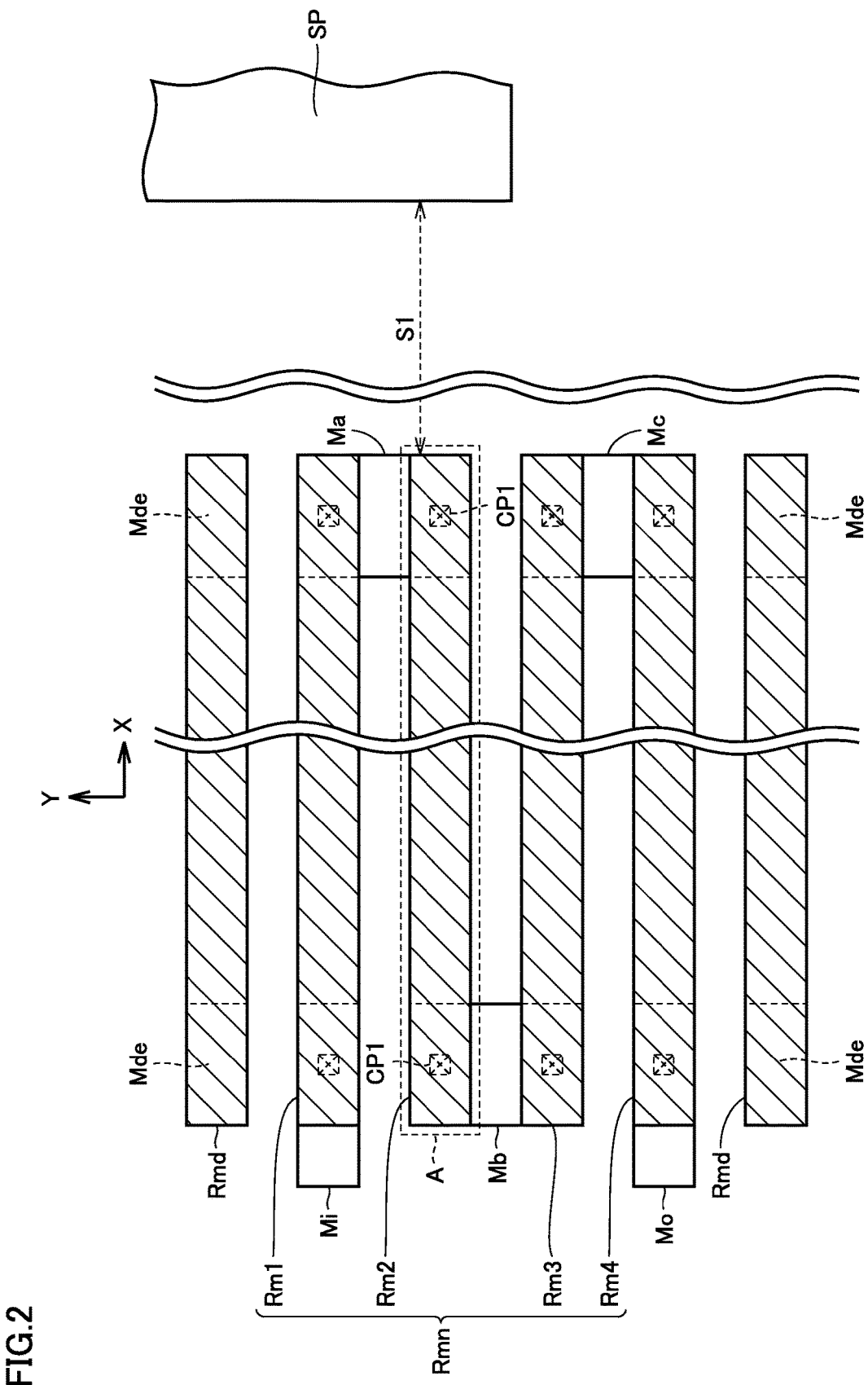
FIG. 2 is an enlarged plan view of a region II surrounded by a circle in FIG. 1.

Referring to FIG. 2, the high-speed OCO circuit has a metal resistive element layer Rmn arranged on one main surface of a substrate. Metal resistive element layer Rmn collectively represents a plurality of (such as four) metal resistive element layers Rm1, Rm2, Rm3, and Rm4. Furthermore, the metal includes a transition metal and a metal other than the transition metal, and does not include a semimetal, a semiconductor, and a non-metal.

In a planar view shown in FIG. 2, metal resistive element layers Rm1 to Rm4 each extend in an X direction and are arranged apart from each other by a predetermined interval in a Y direction. Both ends of respective metal resistive element layers Rm1 to Rm4 are connected to tap layers Mi, Ma to Mc, and Mo through contact plugs CP1 serving as conductive layers. In addition, a predetermined interval S1 is provided between metal resistive element layers Rm1 to Rm4 (Rmn) and electrode pads SP.

In addition, with a view to improving a degree of manufacturing precision in a photoengraving technique, a dummy metal resistive element layer Rmd and a dummy tap layer Mde are provided on each outer side of metal resistive element layers Rm1 and Rm4.

Thus, metal resistive element layers Rm1 to Rm4 are electrically connected in series such that tap layer Mi→contact plug CP1→metal resistive element layer Rm1→contact plug CP1→tap layer Ma→contact plug CP1→metal resistive element layer Rm2→contact plug CP1→tap layer Mb→contact plug CP1→metal resistive element layer Rm3→contact plug CP1→tap layer Mc→contact plug CP1→metal resistive element layer Rm4→contact plug CP1→tap layer Mo.

Next, with reference to FIG. 3, a description will be given to a part of a multilayer wiring structure of the high-speed OCO circuit including a region A surrounded by a dotted line in FIG. 2, that is, metal resistive element layer Rmn.

Figure 3:
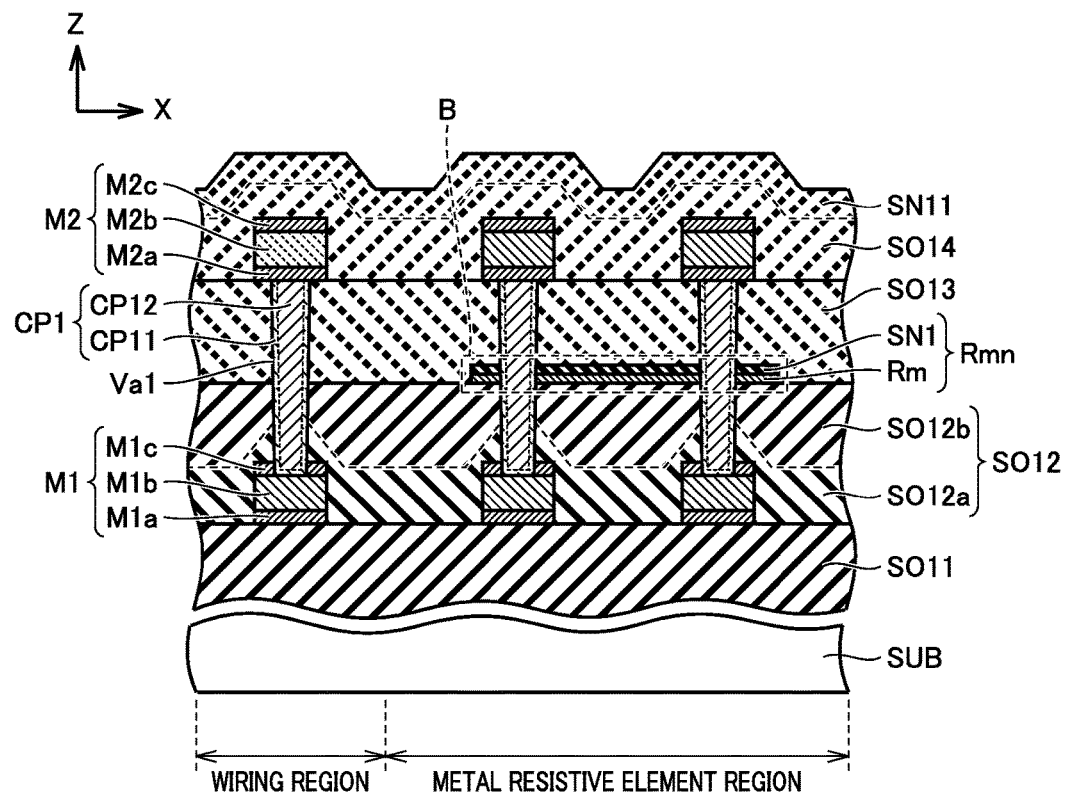
FIG. 3 is a schematic cross-sectional view showing a partial structure of the microcomputer chip in the first embodiment, including a high-speed OCO circuit in FIG. 2.

Referring to FIG. 3, this semiconductor device has an interlayer insulating film SO11 arranged above a (one) main surface of a substrate SUB, and a plurality of first wiring layers M1 formed on interlayer insulating film SO11 so as to be arranged apart from each other in the X direction.

A first insulating film SO12 is formed on interlayer insulating film SO11 so as to cover upper faces of plurality of first wiring layers M1. First insulating film SO12 is composed of a first insulating film lower layer SO12a and a first insulating film upper layer SO12b laminated in this order.

A second insulating film SO13 is formed so as to cover an upper face of first insulating film SO12. A plurality of second wiring layers M2 are formed on an upper face of second insulating film SO13 so as to be arranged apart from each other in the X direction. The plurality of second wiring layers M2 are arranged so as to overlap with first wiring layers M1, respectively, in a planar view.

A region B surrounded by a dotted line in FIG. 3 (metal resistive element layer Rmn) corresponds to region A surrounded by the dotted line in FIG. 2 (metal resistive element layer Rm2 of metal resistive element layer Rmn). Metal resistive element layer Rmn is formed on the upper face of first insulating film SO12 and arranged just below at least one second wiring layer M2 among plurality of second wiring layers M2 so as to overlap with second wiring layer M2 in the planar view. In other words, metal resistive element layer Rmn is arranged just above at least one first wiring layer M1 among plurality of first wiring layers M1 so as to overlap with first wiring layer M1 in the planar view.

More specifically, metal resistive element layer Rmn in FIG. 3 is arranged so as to overlap with first wiring layer M1 and second wiring layer M2 in the planar view, in the vicinity of its one and other ends in the X direction, and metal resistive element layer Rmn is arranged so as to be sandwiched between first wiring layer M1 and second wiring layer M2. Therefore, metal resistive element layer Rmn in FIG. 3 is arranged so as to overlap with two first and second wiring layers M1 and M2 in the planar view, and as a result, first wiring layer M1 and second wiring layer M2 are arranged so as to overlap with each other in the planar view. Metal resistive element layer Rmn has a two-layer structure composed of a metal wiring layer Rm and a reflection preventing film layer SN1.

Among the regions shown in FIG. 3, a region having metal resistive element layer Rmn (region overlapping with metal resistive element layer Rmn in the planar view) is defined as a metal resistive element region, and a region other than the metal resistive element region is defined as a wiring region, in this specification. The metal resistive element region is the region including the metal resistive element serving as the oscillator in the high-speed OCO circuit. The wiring region corresponds to the portion constituting the multilayer wiring especially, in the high-speed OCO circuit. In the wiring region also, first wiring layer M1 and second wiring layer M2 are formed similar to the metal resistive element region, and in the wiring region also, first wiring layer M1 and second wiring layer M2 are arranged so as to overlap with each other in the planar view similar to the metal resistive element region.

First wiring layer M1 has a lower layer M1a, a wiring body M1b, and an upper layer M1c. Similarly, second wiring layer M2 has a lower layer M2a, a wiring body M2b, and an upper layer M2c.

In each of the wiring region and the metal resistive element region, first wiring layer M1 and second wiring layer M2 overlapping with each other in the planar view are electrically connected to each other through contact plug CP1 serving as the conductive layer. The plurality of contact plugs CP1 are formed so as to respectively connect the plurality of first wiring layers M1 to the plurality of second wiring layers M2 overlapping with them in the planar view. Contact plug CP1 is composed of a side and bottom face layer CP11 and an internal filling layer CP12 provided therein.

Contact plug CP1 formed in the metal resistive element region is defined as resistive element region contact plug CP1 serving as a resistive element region conductive layer, and contact plug CP1 formed in the wiring region is defined as wiring region contact plug CP1 serving as a wiring region conductive layer in this specification.

In the wiring region, contact plug CP1 extends in a direction perpendicular to the main surface of substrate SUB (Z direction, for example) between (one, for example) first wiring layer M1 and (one, for example) second wiring layer M2 overlapping with (opposed to) first wiring layer M1 in the planar view to connect wiring layers M1 and M2 to each other. In other words, wiring region contact plug CP1 extends from second wiring layer M2 to first wiring layer M1 in the wiring region.

Meanwhile, in the metal resistive element region, metal resistive element layer Rmn is arranged so as to be sandwiched between first wiring layer M1 and second wiring layer M2. Therefore, contact plug CP1 in the metal resistive element region extends from each of the plurality of (two, for example) second wiring layers M2 arranged in the metal resistive element region to metal resistive element layer Rmn in the Z direction, for example. In addition, contact plug CP1 extends in the Z direction so as to contact metal resistive element layer Rmn, penetrate metal resistive element layer Rmn (including metal wiring layer Rm), and reach each of the plurality of (two, for example) first wiring layers M1 arranged in the metal resistive element region. Thus, in the metal resistive element region also, contact plugs CP1 respectively connect the plurality of second wiring layers M2 to the plurality of opposed (planarly overlapping) first wiring layers M1. As a result, a side face (side and bottom face layer CP11) of contact plug CP1 in the metal resistive element region is in contact with metal wiring layer Rm and (electrically) connected to metal wiring layer Rm. Thus, metal resistive element layer Rmn is penetrated by contact plug CP1 provided between first and second wiring layers M1 and M2. Therefore, according to this embodiment, the wiring layer (second wiring layer M2) is arranged above metal resistive element layer Rmn, and in this respect, metal resistive element layer Rmn is arranged lower than the uppermost layer of the multilayer wiring structure in the high-speed OCO circuit.

Contact plug CP1 arranged at both ends of each of metal resistive element layers Rm1 to Rm4 in FIG. 2 corresponds to contact plug CP1 penetrating metal resistive element layer Rmn in region B in FIG. 3. Therefore, it may be thought that tap layer Ma and tap layer Mb in FIG. 2 correspond to second wiring layer M2 and first wiring layer M1 in the metal resistive element region in FIG. 3, respectively.

In addition, a third insulating film SO14 and a passivation film SN11 are formed and laminated in this order on second insulating film SO13 so as to cover upper faces of the plurality of second wiring layers M2.

Next, a description will be given to a method of manufacturing the microcomputer chip as a method of manufacturing the semiconductor device in this embodiment, with reference to FIGS. 4 to 8. Here, a description will be given to a method of manufacturing the portion shown in FIG. 3 in the microcomputer chip, especially.

Figure 4:
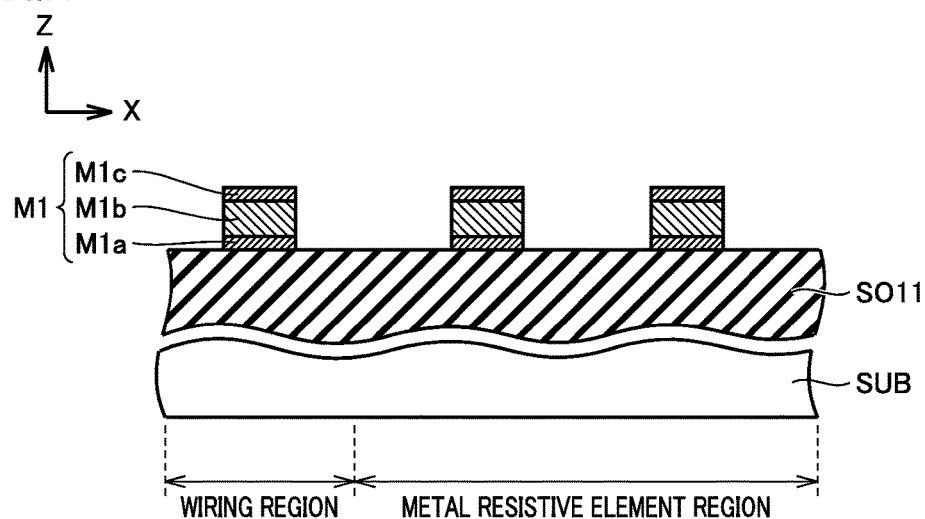
FIG. 4 is a schematic cross-sectional view showing a first step of a method of manufacturing the structure in FIG. 3 especially, in the first embodiment.

Referring to FIG. 4, interlayer insulating film SO11 is formed above the (one) main surface of substrate SUB such as a silicon wafer in such a manner that a well-known multilayer wiring structure is formed at least partially, and a surface is planarized during its process. Interlayer insulating film SO11 is composed of a silicon oxide film and formed by a normal plasma CVD (Chemical Vapor Deposition) method, for example.

Subsequently, the plurality of first wiring layers M1 are formed on interlayer insulating film SO11 so as to be spaced apart from each other in the X direction. First wiring layer M1 is formed such that lower layer M1a, wiring body M1b, and upper layer M1c are laminated in this order. Lower layer M1a is a TiN/Ti film, for example, wiring body M1b is a copper-added aluminum (Al—Cu) film, for example, and upper layer M1c is a Tin/Ti film, for example. Layers M1a to M1c are formed by a normal sputtering method, a photoengraving method, and dry etching processing so that first wiring layers M1 are formed so as to be separated apart from each other as shown in FIG. 4. Here, wiring body M1b may be a thin film formed of aluminum alone, or a thin film formed of copper or tungsten alone. A film thickness of first wiring layer M1 in total is preferably between several hundred nm and 1 μm.

In addition, although not shown in FIG. 4, the same wiring layer as first wiring layer M1 may be formed between substrate SUB and interlayer insulating film SO11 (in the Z direction) such that the one layer is formed or the two or more layers are laminated (so as to constitute a part of the multilayer wiring structure), or such wiring layer may not be formed between them.

Figure 5:
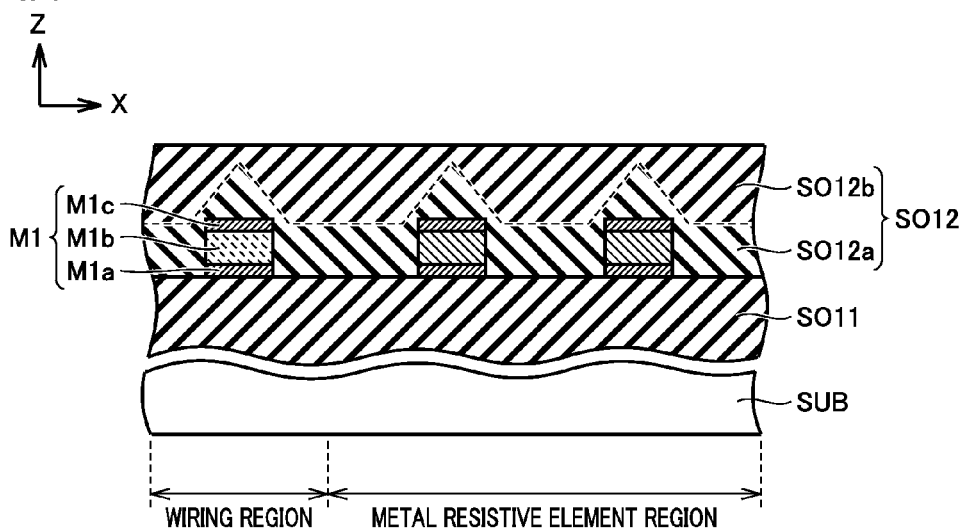
FIG. 5 is a schematic cross-sectional view showing a second step of the method of manufacturing the structure in FIG. 3 especially, in the first embodiment.

Referring to FIG. 5, first insulating film SO12 is formed so as to cover the upper faces of the plurality of first wiring layers M1. First insulating film SO12 is formed in such a way that first insulating film lower layer SO12a and first insulating film upper layer SO12b are laminated in this order, and each of them is preferably composed of a silicon oxide film. First insulating film lower layer SO12a is a USG (Undoped Silicate Glass) film formed by HDP (High Density Plasma)-CVD method (HDP-USG) and superior in step coverage to a silicon oxide film formed by a method other than HDP-CVD method. Thus, first insulating film lower layer SO12a can absorb a difference in level generated due to first wiring layer M1. In addition, first insulating film upper layer SO12b is preferably a TEOS film (P-TEOS) formed by plasma CVD method. After these two layers have been laminated, the upper face (upper face of first insulating film upper layer SO12b) is polished so as to be planarized by CMP (Chemical Mechanical Polishing) method. Thus, first insulating film SO12 having the polarized upper face is formed.

Figure 6:
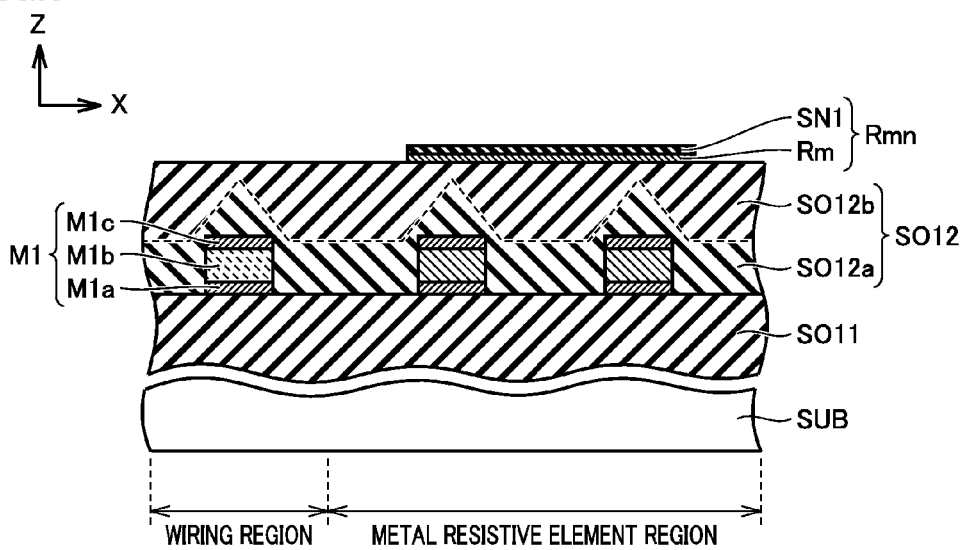
FIG. 6 is a schematic cross-sectional view showing a third step of the method of manufacturing the structure in FIG. 3 especially, in the first embodiment.

Referring to FIG. 6, metal resistive element layer Rmn is formed on the upper face of first insulating film SO12 so as to be positioned just above at least one first wiring layer M1 among the plurality of first wiring layers M1. More specifically, metal resistive element layer Rmn is formed just above two first wiring layers M1 in the metal resistive element region. Metal resistive element layer Rmn has the two-layer structure composed of metal wiring layer Rm and reflection preventing film layer SN1. As for metal wiring layer Rm, a TiN film is formed as one example of high melting point metal, by the normal sputtering method, photoengraving method, and dry etching processing. Through these steps, metal resistive element layers Rm1 to Rm4 (including dummy metal resistive element layer Rmd) are formed into a stripe shape by patterning as shown in the plan view in FIG. 2.

Metal wiring layer Rm is formed so as to have a film thickness of about 30 nm, for example in order to obtain a resistance value of about 40Ω/□ as a resistive element. As for reflection preventing film layer SN1, a plasma nitride (P—SiN) film is used and formed by the CVD method. A film thickness of reflection preventing film layer SN1 is about 45 nm, for example.

In addition, as for metal wiring layer Rm, a TaN film may be formed instead of the above TiN film. In addition, as for reflection preventing film layer SN1, silicon oxide film may be formed instead of the above SiN film.

Figure 7:
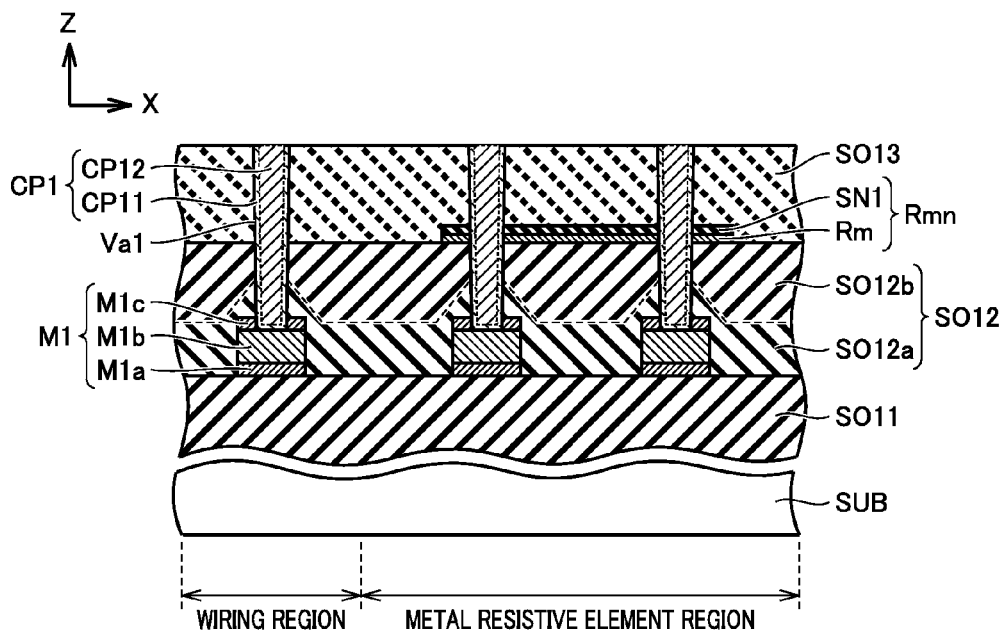
FIG. 7 is a schematic cross-sectional view showing a fourth step of the method of manufacturing the structure in FIG. 3 especially, in the first embodiment.

Referring to FIG. 7, second insulating film SO13 is formed so as to cover the upper faces of metal resistive element layer Rmn and first insulating film SO12. As for second insulating film SO13, a TEOS film (P-TEOS) formed by plasma CVD method is preferably used. An upper face of second insulating film SO13 may be polished by the CMP method, or may not be polished.

Subsequently, the plurality of conductive layers CP1 are formed so as to extend from the upper face of second insulating film SO13 to metal resistive element layer Rmn in the direction perpendicular to the main surface of substrate SUB (that is, the Z direction).

More specifically, in the metal resistive element region, for example, two contact holes Va1 are formed so as to extend from regions just above two first wiring layers M1 in FIG. 7, respectively in the upper face of second insulating film SO13 to metal resistive element layer Rmn, and penetrate metal resistive element layer Rmn (including metal wiring layer Rm), and reach first wiring layers M1 provided just below metal resistive element layer Rmn. Meanwhile, in the wiring region, for example, one contact hole Va1 is formed so as to extend from the region just above one first wiring layer M1 in FIG. 7 in the upper face of second insulating film SO13 to metal resistive element layer Rmn (that is, downward in the Z direction), go through a position of metal resistive element layer Rnm (including metal wiring layer Rm) in the Z direction, and reach first wiring layer M1 provided just below the position.

After that, contact plugs CP1 are formed in contact holes Va1. Here, contact plugs CP1 include resistive element region contact plug CP1 in the metal resistive element region, and wiring region contact plug CP1 in the wiring region. More specifically, in contact hole Va1, side and bottom face layer CP11 composed of a TiN/Ti laminated film is formed as a barrier metal by the sputtering method, and then internal filling layer CP12 composed of a tungsten (W) film is formed by the CVD method. After that, the upper faces of the side and bottom face layer CP11 and internal filling layer CP12 are planarized by the CMP method. Thus, three contact plugs CP1 are formed in total in FIG. 7.

Since resistive element region contact plug CP1 penetrates metal resistive element layer Rmn (including metal wiring layer Rm), the side face of the resistive element region contact plug CP1 is connected to metal wiring layer Rm.

Figure 8:
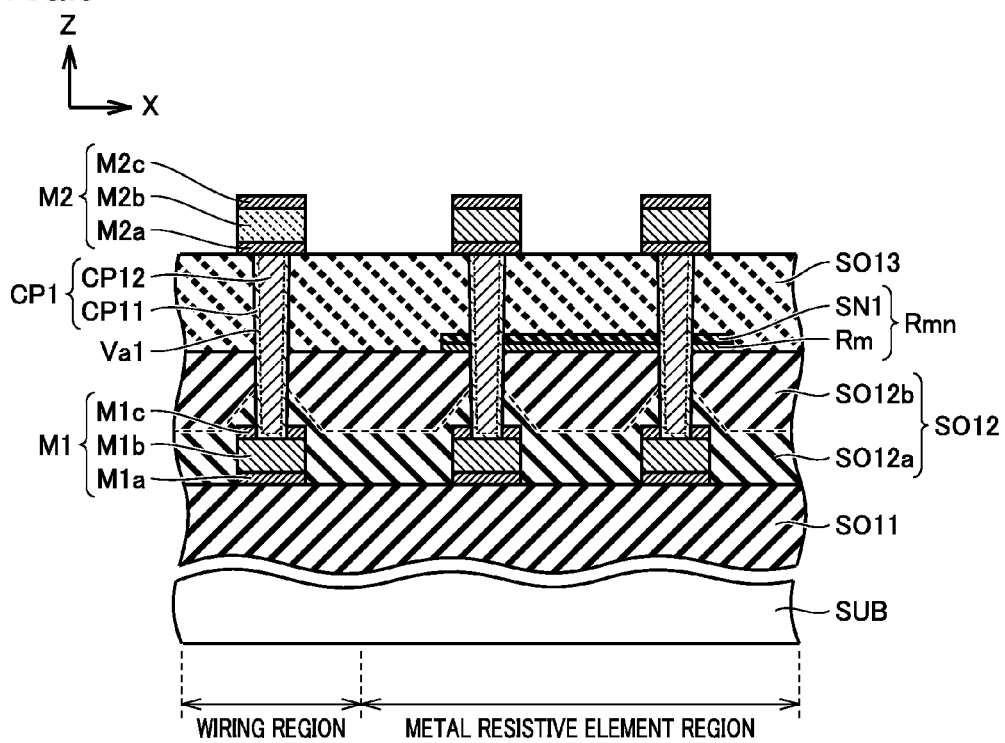
FIG. 8 is a schematic cross-sectional view showing a fifth step of the method of manufacturing the structure in FIG. 3 especially, in the first embodiment.

Referring to FIG. 8, the plurality of second wiring layers M2 are formed on second insulating film SO13 apart from each other in the X direction so as to cover the plurality of conductive layers CP1. Second wiring layer M2 is formed in such a way that lower layer M2a, wiring body M2b, and upper layer M2c are laminated in this order. Lower layer M2a is a TiN/Ti film, for example, wiring body M2b is a copper-added aluminum (Al—Cu) film, for example, and upper layer M2c is a Tin/Ti film, for example. Layers M2a to M2c are basically formed similarly to layers M1a to M1c of first wiring layer M1.

In addition, although not shown in the drawing, a plasma oxynitride film (P—SiON) may be formed as a reflection preventing film by the normal CVD method, so as to cover the upper face of upper layer M2c of second wiring layer M2.

When second wiring layer M2 is formed, it is said that contact plug CP1 in the metal resistive element region is formed from second wiring layer M2 to first wiring layer M1 through metal resistive element layer Rmn, and it is said that contact plug CP1 in the wiring region is formed from second wiring layer M2 to first wiring layer M1.

Referring to FIG. 3 again, after that, third insulating film SO14 and passivation film SN11 are formed on second insulating film SO13 in this order so as to cover the upper faces of second wiring layers M2. As for third insulating film SO14, a silicon oxide film composed of the P-TEOS film is formed by the CVD method. As for passivation film SN11, a P—SiN film is formed by the CVD method. Third insulating film SO14 and passivation film SN11 are patterned by the normal photoengraving technique and the dry etching processing as needed.

Next, an operational advantage of this embodiment will be described with reference to comparison examples in FIGS. 9 to 11. First, a description will be given to a part of a multilayer wiring structure of a high-speed OCO circuit in the comparison example with reference to FIG. 9.

Figure 9:
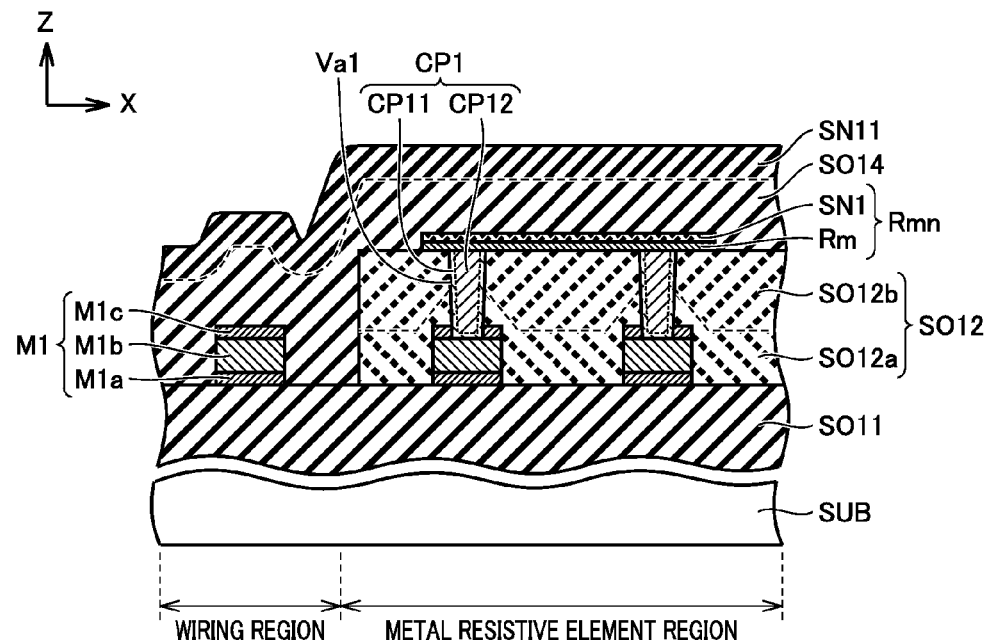
FIG. 9 is a schematic cross-sectional view showing a partial structure of a microcomputer chip in a comparison example, including the high-speed OCO circuit in FIG. 2.

FIG. 9 shows a region in the comparison example similarly to FIG. 3, that is, metal resistive element layer Rmn in FIG. 9 corresponds to metal resistive element layer Rmn in FIG. 3 (this is also applied to the following embodiments). Referring to FIG. 9, in the comparison example, metal resistive element layer Rmn is an uppermost layer in a multilayer wiring structure in the metal resistive element region, and second wiring layer M2 and second insulating film SO13 are not formed on an upper face of this layer. Contact plug CP1 in the metal resistive element region extends from metal resistive element layer Rnm to first wiring layer M1 in the Z direction in the drawing.

In the wiring region in FIG. 9, first wiring layer M1 is an uppermost layer in a multilayer wiring structure, and second wiring layer M2 and second insulating film SO13 are not formed on an upper face of this layer. Third insulating film SO14 is formed so as to cover an upper face of interlayer insulating film SO11 in the wiring region, while it is formed so as to cover upper faces of metal resistive element layer Rmn and first insulating film SO12 in the metal resistive element region.

In addition, a configuration of the comparison example other than the above is almost the same as the configuration of the first embodiment, so that the same component is marked with the same reference and its description is not repeated.

A method of manufacturing the configuration of the comparison example in FIG. 9 will be described with reference to FIGS. 10 and 11.

Figure 10:
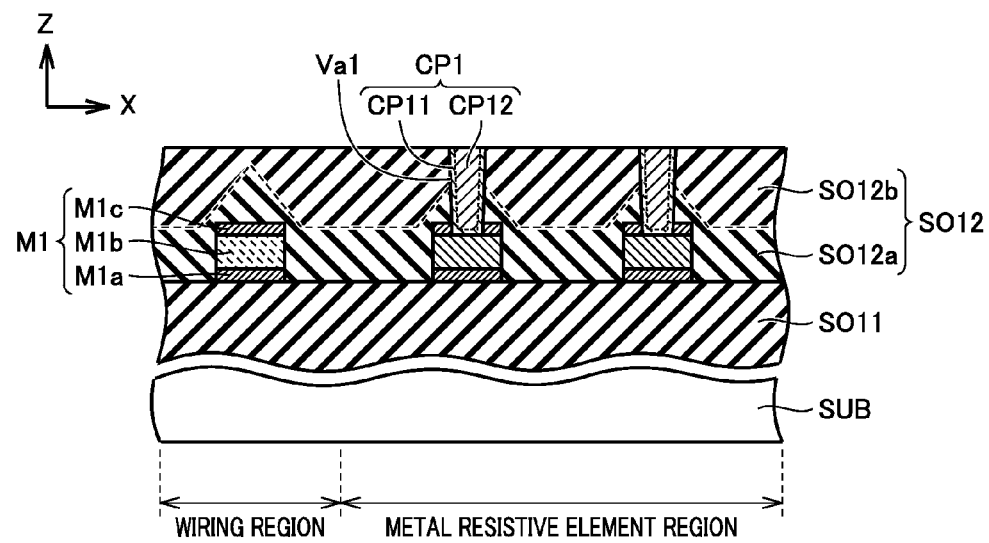
FIG. 10 is a schematic cross-sectional view showing a first step of a method of manufacturing the structure in FIG. 9 especially, in the comparison example.

Referring to FIG. 10, after the same processes as those shown in FIGS. 4 and 5 have been performed, in the metal resistive element region, two contact plugs CP1 (resistive element region contact plug) are formed so as to extend from regions just above two first wiring layers M1 in FIG. 10, in the upper face of first insulating film SO12.

Figure 11:
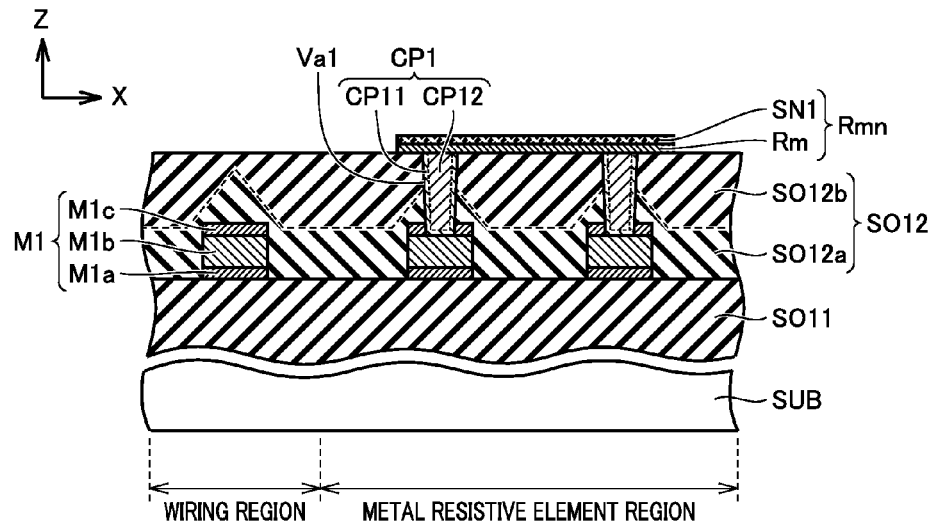
FIG. 11 is a schematic cross-sectional view showing a second step of the method of manufacturing the structure in FIG. 9 especially, in the comparison example.

Referring to FIG. 11, one metal resistive element layer Rmn is formed on first insulating film SO12 in the metal resistive element region so as to cover and stride two contact plugs CP1. After that, third insulating film SO14 and passivation film SN11 are formed so as to cover the whole configuration formed in FIG. 11 similar to the first embodiment.

According to the above comparison example, one mask needs to be prepared in order to form only contact plug CP1 extending from metal resistive element layer Rmn shown in FIG. 10. That is, contact plug CP1 extending from metal resistive element layer Rmn cannot be formed with the same mask as the mask used for forming one contact plug CP1 (not shown) for connecting the one wiring layer and the other wiring layer in the multilayer wiring structure. Therefore, the manufacturing cost is increased due to the mask, and the total process number required is increased. Thus, the cost for manufacturing the multilayer wiring structure could be increased as a whole.

Furthermore, according to the comparison example, since metal resistive element layer Rmn is formed as the uppermost layer in the multilayer wiring structure, a protective film as an uppermost layer such as passivation film SN11 is formed in a region very close to metal resistive element layer Rmn, and passivation film SN11 is formed just above metal resistive element layer Rmn (so as to cover the upper face of uppermost metal resistive element layer Rmn) in some cases. In this case, metal resistive element layer Rmn is likely to receive a stress from passivation film SN11, so that the precision as the oscillator of the OCO circuit including metal resistive element layer Rmn could be lowered.

Thus, according to this embodiment, contact plug CP1 in the metal resistive element region is configured to penetrate metal resistive element layer Rmn, and the side face of contact plug CP1 is configured to be in contact with metal wiring layer Rm especially in metal resistive element layer Rmn. For example, in FIG. 3, an electric signal is inputted to or outputted from metal resistive element layer Rmn through resistive element region contact plug CP1 which extends between first wiring layer M1 and second wiring layer M2, to transfer the electric signal between first wiring layer M1 and second wiring layer M2. Therefore, it is not necessary to prepare the mask for forming only contact plug CP1 for extracting the electric signal from metal resistive element layer Rmn, so that the manufacturing cost can be reduced. Furthermore, there is no need to perform the process for forming only contact plug CP1 for extracting the electric signal from metal resistive element layer Rmn, so that the manufacturing cost can be reduced due to the reduction in number of the processes.

Furthermore, according to this embodiment, since second wiring layer M2 is formed just above metal resistive element layer Rmn, metal resistive element layer Rmn is not directly covered with passivation film SN11. Therefore, it is possible to reduce the possibility that the precision as the oscillator of the high-speed OCO circuit is lowered because metal resistive element layer Rmn receives the stress from passivation film SN11.

Here, resistive element region contact plug CP1 formed in the metal resistive element region is preferably formed so as to extend from second wiring layer M2 to first wiring layer M1 as described above, but another configuration can be employed as long as at least one part of the side face of contact plug CP1 is in contact with metal wiring layer Rm of metal resistive element layer Rmn, and the side face of contact plug CP1 and metal resistive element layer Rm are connected to each other. Therefore, resistive element region contact plug CP1 only needs to be configured to slightly penetrate metal wiring layer Rm. Hereinafter, a variation of this embodiment having such configuration will be described.

Figure 12:
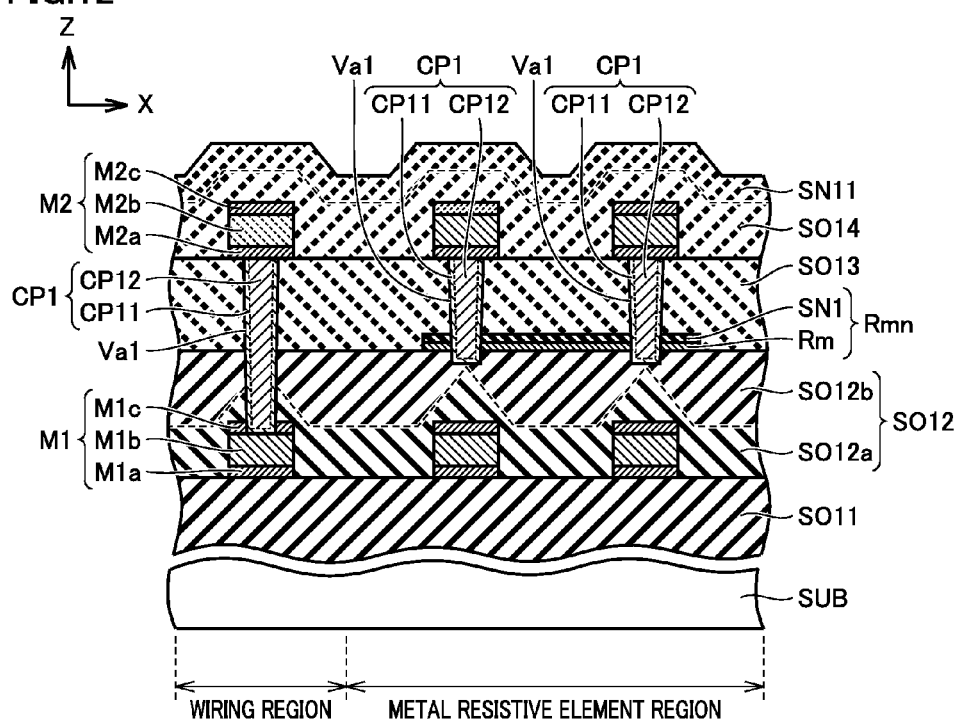
FIG. 12 is a schematic cross-sectional view showing a first variation of the partial structure of the microcomputer chip in the first embodiment, including the high-speed OCO circuit in FIG. 2.

Referring to FIG. 12, according to a first variation of this embodiment, its configuration is basically the same as in FIG. 3 except that resistive element region contact plug CP1 is formed so as to reach a region a little lower than a lowermost portion of metal resistive element layer Rmn (metal wiring layer Rm) without reaching the upper face of first wiring layer M1.

Figure 13:
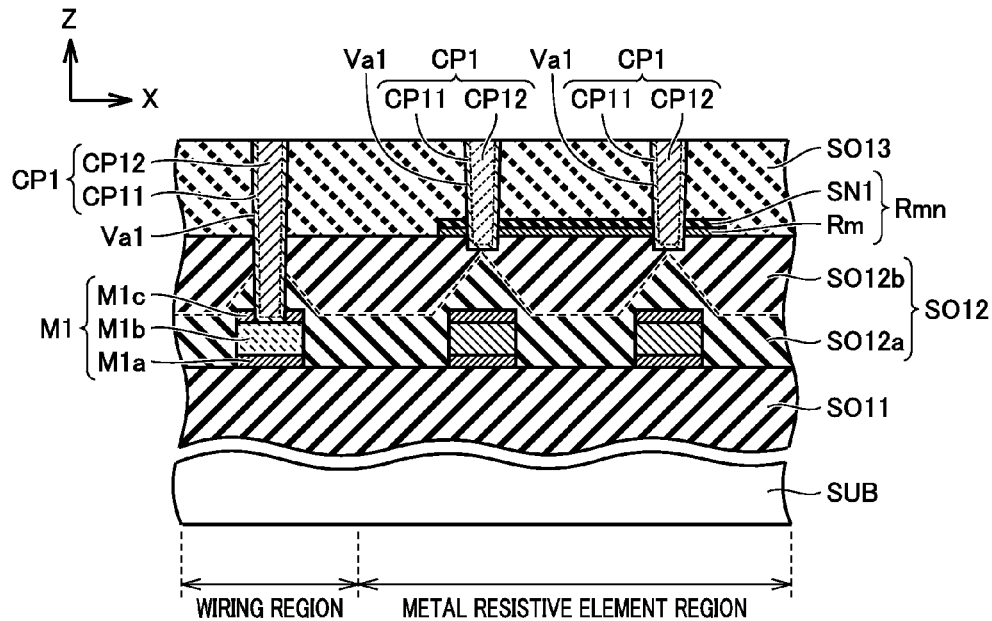
FIG. 13 is a schematic cross-sectional view showing a first step of a method of manufacturing the structure in FIG. 12 especially, in the first variation of the first embodiment.

Referring to FIG. 13, the configuration in FIG. 12 is provided such that contact hole Va1 for forming resistive element region contact plug CP1 only extends to the region a little lower than the lowermost portion of metal resistive element layer Rmn (metal wiring layer Rm), that is, the region not reaching the upper face of first wiring layer M1, in the process shown in FIG. 7 in this embodiment.

Figure 14:
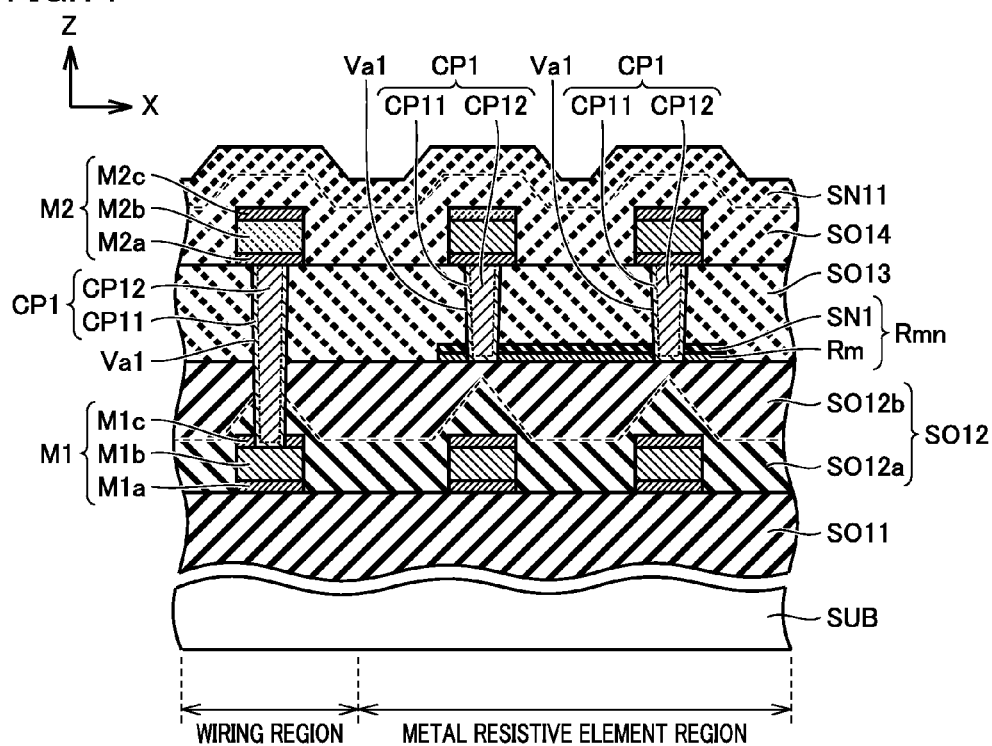
FIG. 14 is a schematic cross-sectional view showing a second variation of the partial structure of the microcomputer chip in the first embodiment, including the high-speed OCO circuit in FIG. 2.

Referring to FIG. 14, according to a second variation of this embodiment, its configuration is basically the same as in FIG. 12 except that resistive element region contact plug CP1 is shorter than that in FIG. 12, and it is formed so as to reach the lowermost portion of metal resistive element layer Rmn (metal wiring layer Rm).

Figure 15:
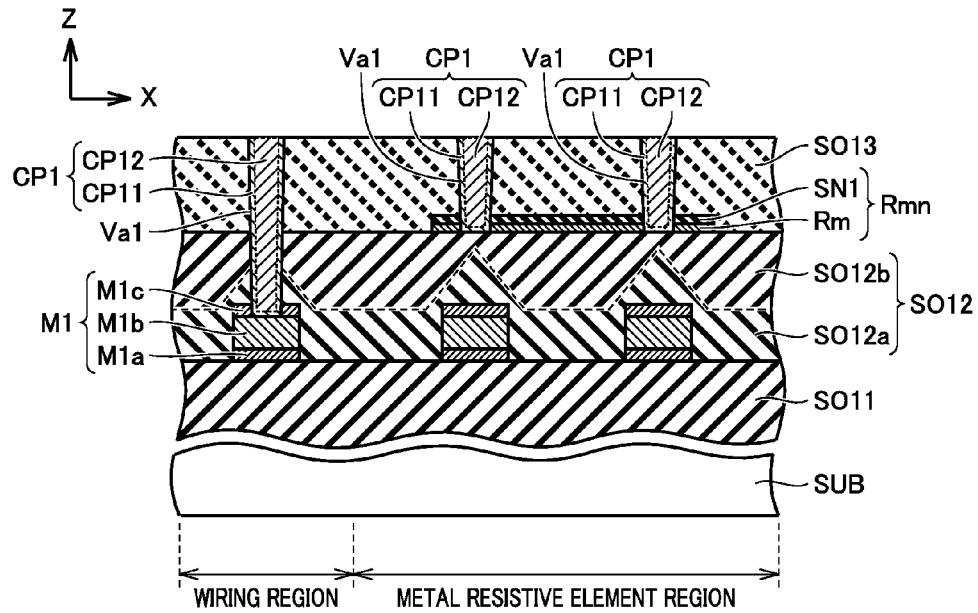
FIG. 15 is a schematic cross-sectional view showing a first step of a method of manufacturing the structure in FIG. 14 especially, in the second variation of the first embodiment.

Referring to FIG. 15, the configuration in FIG. 14 is provided such that contact hole Va1 for forming resistive element region contact plug CP1 only extends to the lowermost portion of metal resistive element layer Rmn (metal wiring layer Rm), that is, the region shallower than that in FIG. 13, in the process shown in FIG. 7 in this embodiment.

In FIGS. 12 to 15, each resistive element region contact plug CP1 is formed so as to penetrate metal wiring layer Rm from an uppermost face (first face) which is in contact with reflection preventing film layer SN1 in the X direction along the main surface of substrate SUB, to a lowermost face (second face) which is opposed to the uppermost face and in contact with an uppermost face of first insulating film SO12 (first insulating film upper layer SO12b).

According to the first and second variations also, contact plug CP1 can electrically connect at least second wiring layer M2 to metal resistive element layer Rmn. In addition, contact plug CP1 can be formed with the same mask as the mask for forming contact plug CP1 extending from second wiring layer M2 to first wiring layer M1, in the wiring region. Therefore, similar to those in FIGS. 3 to 8, the first and second variations also have the same effect of eliminating the process for forming contact plug CP1 only for being connected to metal resistive element layer Rmn.

However, according to the configurations in FIGS. 12 to 15, a depth of contact plug CP1 extending in the Z direction in the wiring region differs from a depth of contact plug CP1 extending in the Z direction in the metal resistive element region, and more specifically, contact plug CP1 in the wiring region is deeper than contact plug CP1 in the metal resistive element region. Since contact hole Va1 of contact plug CP1 in the wiring region and contact hole Va1 of contact plug CP1 in the metal resistive element region are formed at the same time, it is sometimes difficult to control an etching depth of insulating film SO13 in order to form contact holes Va1 having the different depths between the wiring region and the metal resistive element region.

From this viewpoint, as shown in FIGS. 3 and 4 to 8, it is preferable that contact plug CP1 (resistive element region contact plug CP1) in the metal resistive element region has the same depth as that of contact plug CP1 (wiring region contact plug CP1) in the wiring region. Here, the term "the same depth" includes a case where the depths are completely equal to each other, and a case where the depths are not completely equal to each other but not apparently different so that the difference is negligible. For example, the term "the same depth" includes a case where the difference in depth between contact plugs CP1 in both regions is less than or equal to 5% of the depth of the deeper one.

Thus, the depth of contact hole Va1 for forming contact plug CP1 in the metal resistive element region can be equal to the depth of contact hole Va1 for forming contact plug CP1 in the wiring region, so that both contact hole Va1s can be formed at the same time without the need to control the depths of both contact holes Va1. As a result, the manufacturing cost can be reduced.

Second Embodiment

First, a description will be given to a part of a multilayer wiring structure of a high-speed OCO circuit including metal resistive element layer Rmn in this embodiment, with reference to FIG. 16.

Figure 16:
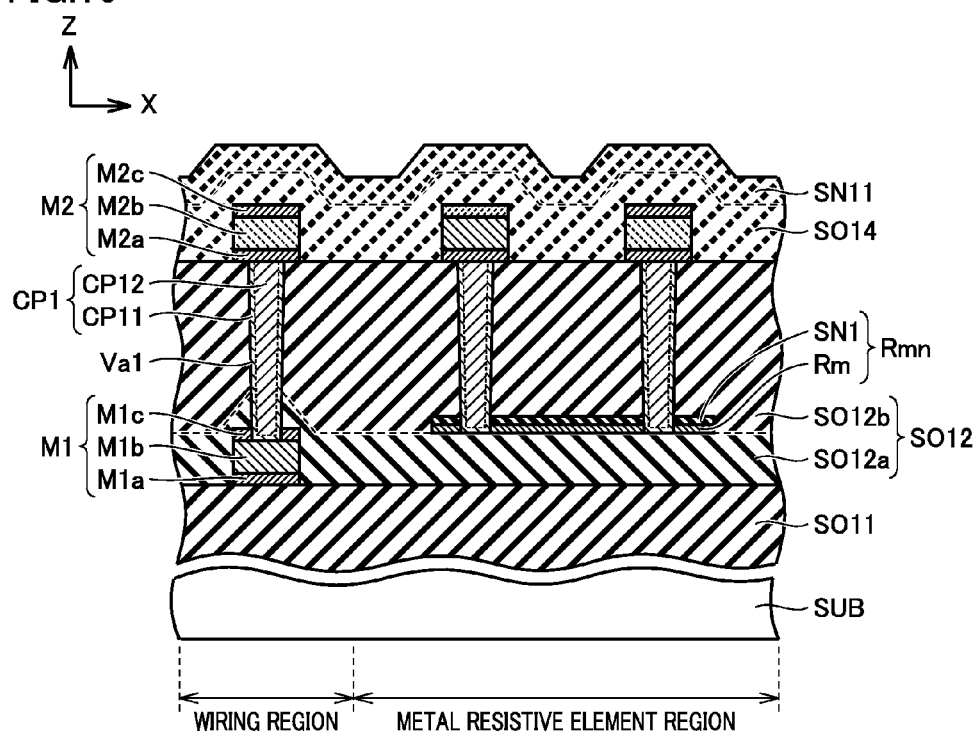
FIG. 16 is a schematic cross-sectional view showing a partial structure of a microcomputer chip in a second embodiment, including the high-speed OCO circuit in FIG. 2.

Referring to FIG. 16, the multilayer structure of the high-speed OCO circuit in a semiconductor device in this embodiment differs from the multilayer wiring structure in the first embodiment in the following points.

According to this embodiment, the plurality of second wiring layers M2 are arranged apart from each other in the X direction, so as to cover the upper face of first insulating film SO12. Second insulating film SO13 is not formed, and third insulating film SO14 and passivation film SN11 are formed so as to be laminated in this order on first insulating film SO12 (first insulating film upper layer SO12b) so as to cover the upper faces of second wiring layers M2.

Metal resistive element layer Rmn only needs to be arranged closer to first wiring layer M1 (that is, lower) than second wiring layer M2 in the Z direction, in the metal resistive element region. Here, metal resistive element layer Rmn is arranged so as to cover the upper face of first insulating film lower layer SO12a (thin film insulating film) in first insulating film SO12 and be positioned just below two second wiring layer M2 arranged in the metal resistive element region, for example. That is, metal resistive element layer Rmn overlaps with second wiring layers M2 (in the metal resistive element region) in the planar view. First insulating film lower layer SO12a is formed so as to cover both upper face of first wiring layer M1 and surface on which first wiring layer M1 is formed (upper face of interlayer insulating film SO11).

As a result, first wiring layer M1 is not formed in the metal resistive element region in this embodiment, but first wiring layer M1 is only formed on interlayer insulating film SO11 in the wiring region. Thus, at least one first wiring layer M1 is formed (in the wiring region, for example).

In the metal resistive element region, (two, for example) contact plugs CP1 are formed so as to extend from two second wiring layers M2, respectively in the Z direction and reach metal resistive element layer Rmn. Here, contact plug CP1 is connected to metal resistive element layer Rmn so as to penetrate metal wiring layer Rm of metal resistive element layer Rmn.

In the wiring region, similar to the first embodiment, contact plug CP1 extends from (one, for example) second wiring layer M2 downward in the Z direction (to metal resistive element layer Rmn) and reaches (one, for example) first wiring layer M1 overlapping with second wiring layer M2 in the planar view, so that second wiring layer M2 is electrically connected to first wiring layer M1.

According to this embodiment, a depth of contact plug CP1 in the metal resistive element region is equal to a depth of contact plug CP1 in the wiring region in the Z direction. The term "equal to" here, includes the case where there is a negligible difference as well as the case where they are completely equal to each other, similar to the first embodiment.

Contact plug CP1 in the wiring region extends from second wiring layer M2 to first wiring layer M1, and contact plug CP1 in the metal resistive element region extends from second wiring layer M2 to metal resistive element layer Rmn. First wiring layer M1 is arranged on interlayer insulating film SO11, and metal resistive element layer Rmn is arranged on first insulating film lower layer SO12a. First wiring layer M1 and metal resistive element layer Rmn are formed on the different layers, but the depths of contact plugs CP1 are equal to each other because thicknesses of first wiring layer M1 and metal resistive element layer Rmn (in the Z direction) are different from each other.

As described above, since first wiring layer M1 and metal resistive element layer Rmn are formed on the different layers, resistive element region contact plug CP1 in the metal resistive element region and wiring region contact plug CP1 in the wiring region can be formed so as to have the equal depth in the Z direction, so that it is not necessary to separately control the depths of contact holes Va1 in the metal resistive element region and the wiring region. As a result, the step can be simplified and the manufacturing cost can be reduced.

Furthermore, a configuration of this embodiment other than the above is almost the same as the configuration of the first embodiment, so that the same component is marked with the same reference and its description is not repeated.

Next, a description will be given to a method of manufacturing a microcomputer chip (portion shown in FIG. 16, especially) as a method of manufacturing the semiconductor device in this embodiment, with reference to FIGS. 17 to 21. The same component marked with the same reference as that of the first embodiment is basically composed of the same material as that of the first embodiment, and formed by the same process as that of the first embodiment, unless otherwise stated (this will be applied to the following embodiments).

Referring to FIG. 17, similar to the first embodiment, substrate SUB is prepared, and interlayer insulating film SO11 is formed above its (one) main surface.

At least one first wiring layer M1 is formed on interlayer insulating film SO11. Here, one first wiring layer M1 is formed in the wiring region, for example.

Referring to FIG. 18, first insulating film lower layer SO12a (thin film insulating film) is formed so as to cover both of the upper face of first wiring layer M1 and the surface of interlayer insulating film SO11 on which first wiring layer M1 is formed, by the HDP-CVD method.

Figure 19:
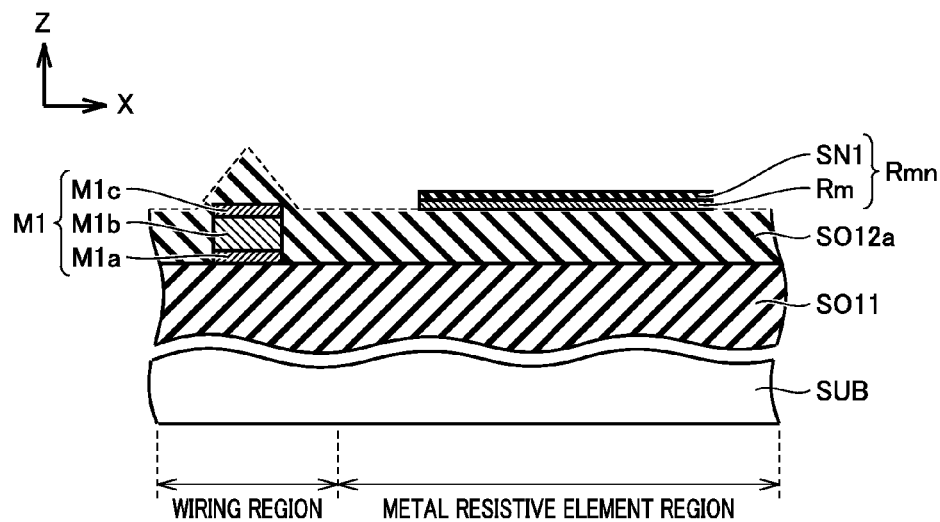
FIG. 19 is a schematic cross-sectional view showing a third step of the method of manufacturing the structure in FIG. 16 especially, in the second embodiment.

Referring to FIG. 19, metal resistive element layer Rmn is formed so as to cover the upper face of first insulating film lower layer SO12a. Here, metal resistive element layer Rmn is formed in a region planarly different from the region in which first wiring layer M1 has been formed. More specifically, while first wiring layer M1 is formed in the wiring region, metal resistive element layer Rmn is formed in the metal resistive element region. Note that metal resistive element layer Rmn has the two-layer structure composed of metal wiring layer Rm and reflection preventing film layer SN1, and they are formed into a stripe shape by patterning in the planar view, similar to the first embodiment.

Figure 20:
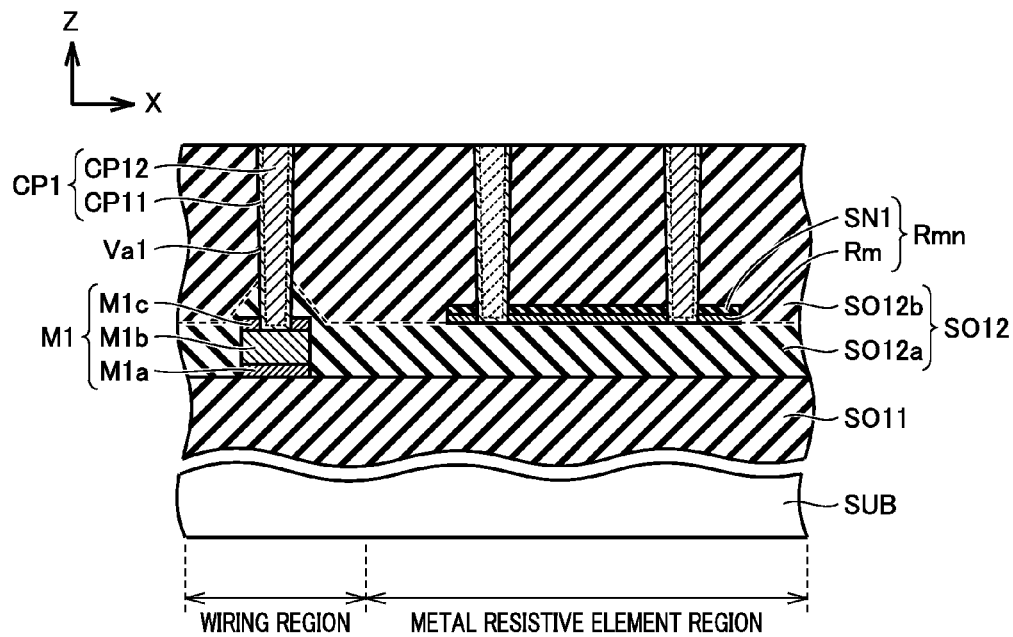
FIG. 20 is a schematic cross-sectional view showing a fourth step of the method of manufacturing the structure in FIG. 16 especially, in the second embodiment.

Referring to FIG. 20, second insulating film upper layer SO12b is formed on first insulating film lower layer SO12a so as to cover the upper face of metal resistive element layer Rmn, and then its upper face is polished to be planarized by the CMP method. Thus, upper faces of first wiring layer M1 and metal resistive element layer Rmn are covered with first insulating film SO12. In addition, here, the upper face of metal resistive element layer Rmn is covered only with first insulating film upper layer SO12b of first insulating film SO12 and not covered with first insulating film lower layer SO12a, but even in this case, metal resistive element layer Rmn is described as being covered with first insulating film SO12.

Subsequently, the plurality of conductive layers CP1 are formed so as to extend from the upper face of first insulating film SO12 to metal resistive element layer Rmn in the direction perpendicular to the main surface of substrate SUB (that is, Z direction).

More specifically, in the metal resistive element region, for example, two contact holes Va1 are formed so as to be spaced apart from each other and planarly overlap with metal resistive element layer Rmn. Two contact holes Va1 are formed so as to extend from the upper face of first insulating film SO12 to metal resistive element layer Rmn. Similarly, in the wiring region, for example, one contact hole Va1 is formed so as to extend from a region just above one first wiring layer M1 in FIG. 20 in the upper face of first insulating film SO12, to first wiring layer M1 in the Z direction. After that, side and bottom face layer CP11 and internal filling layer CP12 are formed in each contact hole Va1, whereby contact plug CP1 is formed.

Figure 21:
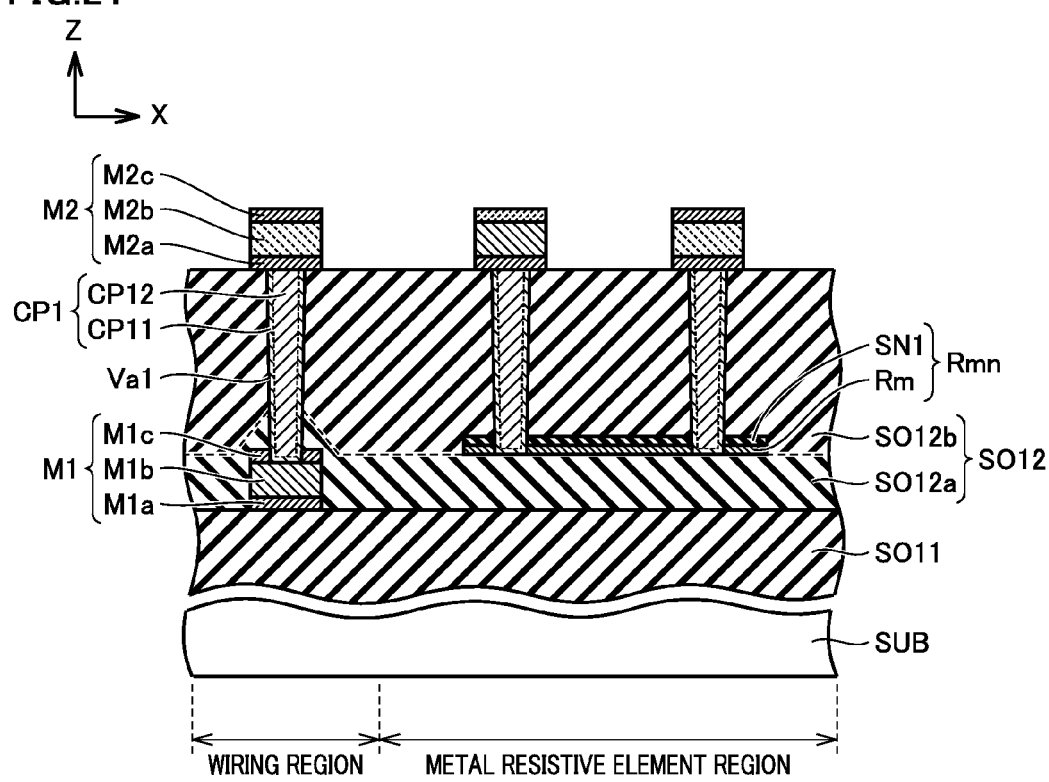
FIG. 21 is a schematic cross-sectional view showing a fifth step of the method of manufacturing the structure in FIG. 16 especially, in the second embodiment.

Referring to FIG. 21, the plurality of second wiring layers M2 are formed on first insulating film SO12 so as to be spaced apart from each other in the X direction and cover the plurality of conductive layers CP1, respectively.

When second wiring layers M2 are formed, it is said that contact plug CP1 in the metal resistive element region is formed from second wiring layer M2 to metal resistive element layer Rmn, and it is said that contact plug CP1 in the wiring region is formed from second wiring layer M2 to first wiring layer M1. Furthermore, metal resistive element layer Rmn is formed closer to first wiring layer M1 (lower) than the plurality of second wiring layers M2 in the Z direction, and formed just below at least one second wiring layer M2 (in the metal resistive element region) among the plurality of second wiring layers M2. Furthermore, contact plug CP1 in the metal resistive element region and contact plug CP1 in the wiring region have the equal depth in the Z direction.

Referring to FIG. 16 again, after that, third insulating film SO14 and passivation film SN11 are formed in this order on first insulating film SO12.

Next, an operational advantage of this embodiment will be described.

According to this embodiment, contact plug CP1 extending from second wiring layer M2 to metal resistive element layer Rmn in the metal resistive element region can be formed with the same mask as the mask used for forming contact plug CP1 extending from second wiring layer M2 to first wiring layer M1 in the wiring region. This is because each of contact plug CP1 in the metal resistive element region and contact plug CP1 in the wiring region is formed from the same face (upper face of first insulating film SO12). Therefore, it is not necessary to separately prepare the mask for forming only contact plug CP1 for being connected to metal resistive element layer Rmn, and contact plug CP1 for metal resistive element layer Rmn can be formed with the mask for forming the multilayer wiring structure. As a result, the manufacturing cost can be reduced.

According to this embodiment, similar to the configuration of the first embodiment in FIGS. 3 to 8, the depth of contact hole Va1 for forming contact plug CP1 in the metal resistive element region can be equal to the depth of contact hole Va1 for forming contact plug CP1 in the wiring region, so that both contact holes Va1 can be formed at the same time without the need to separately control the depths of both contact holes Va1. As a result, the manufacturing cost can be reduced.

When the depth of contact hole Va1 for forming contact plug CP1 in the metal resistive element region is equal to the depth of contact hole Va1 for forming contact plug CP1 in the wiring region, both depths can be small, so that contact hole Va1 can be easily filled with internal filling layer CP12.

Furthermore, according to this embodiment, since second wiring layer M2 is formed just above metal resistive element layer Rmn, metal resistive element layer Rmn is not directly covered with passivation film SN11. Therefore, it is possible to reduce the possibility that the precision as the oscillator of the high-speed OCO circuit is lowered because metal resistive element layer Rmn receives the stress from passivation film SN11.

Third Embodiment

First, a description will be given to a part of a multilayer wiring structure of a high-speed OCO circuit including metal resistive element layer Rmn in this embodiment, with reference to FIG. 22.

Figure 22:
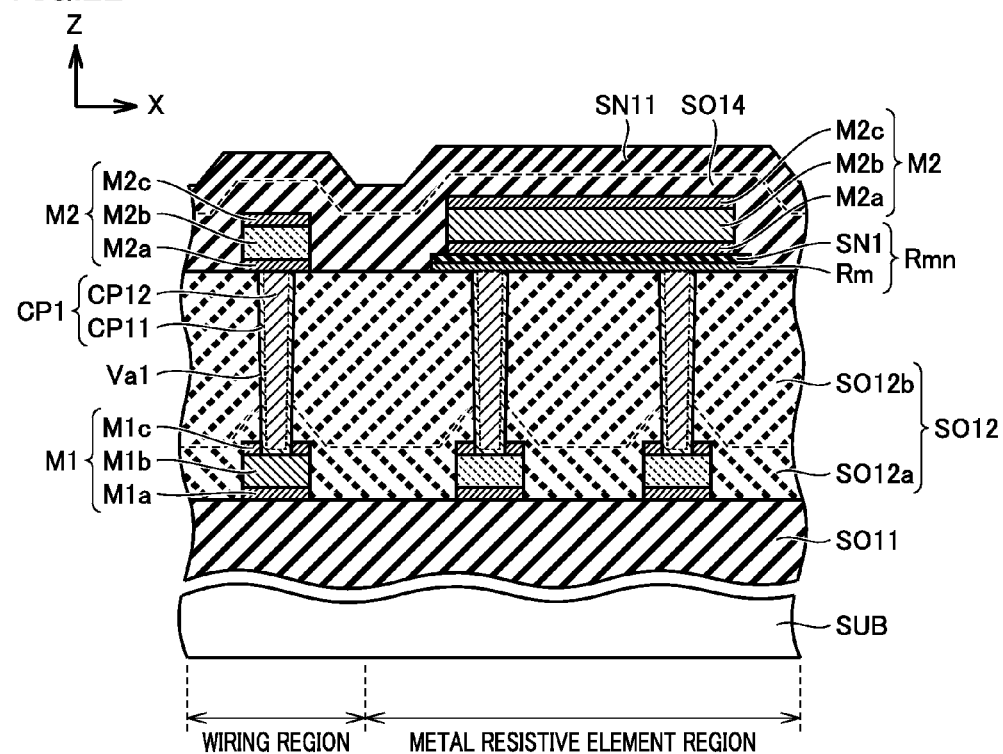
FIG. 22 is a schematic cross-sectional view showing a partial structure of a microcomputer chip in a third embodiment, including the high-speed OCO circuit in FIG. 2.

Referring to FIG. 22, the multilayer structure of the high-speed OCO circuit in a semiconductor device in this embodiment differs from the multilayer wiring structure in the first embodiment in the following points.

According to this embodiment, (one, for example) metal resistive element layer Rmn is arranged on first insulating film SO12 so as to be positioned just above (two, for example) first wiring layers M1, formed in the metal resistive element region, especially, among the plurality of first wiring layers M1. Here, metal resistive element layer Rmn is arranged above first wiring layers M1 so as to stride two first wiring layers M1 arranged apart from each other in the x direction in the metal resistive element region.

Meanwhile, the plurality of second wiring layers M2 are arranged on first insulating film SO12. The plurality of second wiring layers M2 include second wiring layer M2 arranged so as to cover the upper face of metal resistive element layer Rmn formed on the upper face of first insulating film SO12, and second wiring layer M2 arranged on the upper face of first insulating film SO12 so as to planarly overlap with first wiring layer M1 in the wiring region. Thus, according to this embodiment, at least one of the plurality of second wiring layers M2 is formed so as to cover the upper face of metal resistive element layer Rmn.

In each of the metal resistive element region and the wiring region, contact plug CP1 is formed so as to extend from a region which planarly overlaps with each of the plurality of first wiring layers M1, in the upper face of first insulating film SO12, to at least one of the plurality of first wiring layers M1 in the Z direction. More specifically, in the metal resistive element region, contact plug CP1 is formed so as to extend from metal resistive element layer Rmn (metal wiring layer Rm) on which second wiring layer M2 is formed, to first wiring layer M1 just below metal resistive element layer Rmn in the Z direction. Furthermore, in the wiring region, contact plug CP1 is formed so as to extend from second wiring layer M2 to first wiring layer M1 just below second wiring layer M2 in the Z direction. Thus, in the metal resistive element region, metal wiring layer Rm and first wiring layer M1 just below are electrically connected through contact plug CP1, and in the wiring region, second wiring layer M2 and first wiring layer M1 just below are electrically connected through contact plug CP1.

According to this embodiment, second insulating film SO13 is not formed, and in each of the wiring region and the metal resistive element region, third insulating film SO14 and passivation film SN11 are formed on first insulating film SO12 so as to cover the upper faces of second wiring layers M2.

Figure 23:
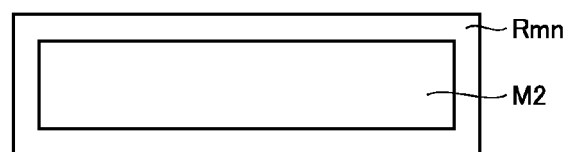
FIG. 23 is a schematic plan view of a metal resistive element layer and a second wiring layer formed thereon in FIG. 22.

Referring to FIG. 23, according to this embodiment, metal resistive element layer Rmn preferably larger in size than second wiring layer M2 arranged on its upper face in planar view. Therefore, it is preferable that a center portion of second wiring layer M2 on metal resistive element layer Rmn is arranged so as to almost coincide with a center portion of metal resistive element layer Rmn in the planar view, and there is a region having a constant width between an outermost edge of metal resistive element layer Rmn and an outermost edge of second wiring layer M2 (in the vicinity of an outer periphery of metal resistive element layer Rmn).

In addition, a configuration of this embodiment other than the above is almost the same as the configuration of the first embodiment, so that the same component is marked with the same reference and its description is not repeated.

Next, a description will be given to a method of manufacturing a microcomputer chip (portion shown in FIG. 22, especially) as a method of manufacturing the semiconductor device in this embodiment, with reference to FIGS. 24 to 26.

Figure 24:
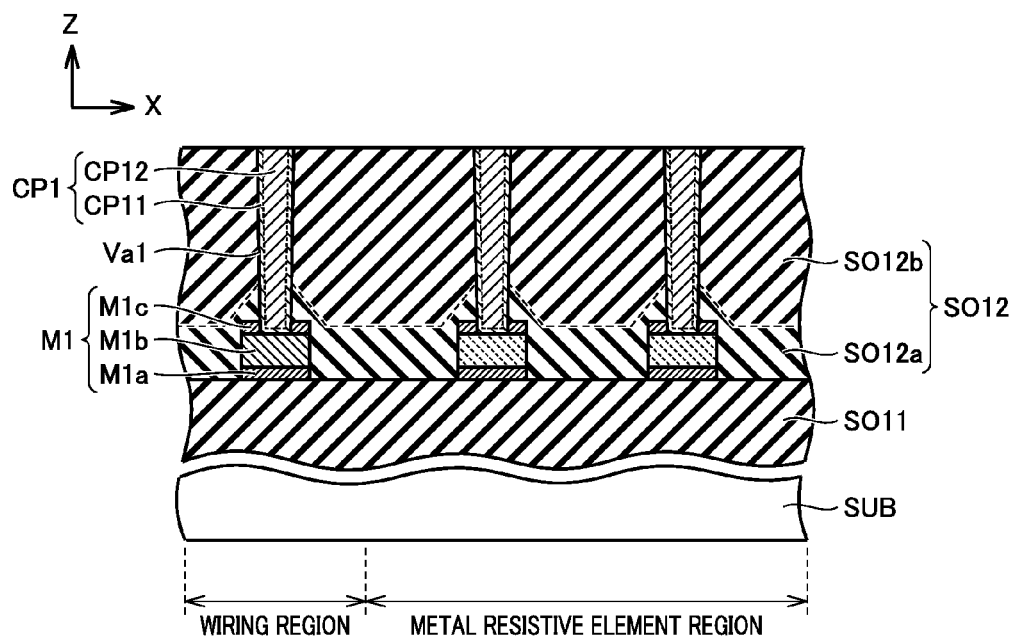
FIG. 24 is a schematic cross-sectional view showing a first step of a method of manufacturing the structure in FIG. 22 especially, in the third embodiment.

Referring to FIG. 24, substrate SUB is prepared similar to the first embodiment, and interlayer insulating film SO11 is formed above its (one) main surface. Subsequently, the plurality of first wiring layers M1 are formed on interlayer insulating film SO11 so as to be spaced apart from each other in the X direction. Subsequently, first insulating film lower layer SO12a and first insulating film upper layer SO12b as first insulating film SO12 are formed so as to cover the upper faces of the plurality of first wiring layer M1, and its upper face is polished by the CMP method.

Subsequently, the plurality of contact plugs CP1 are formed so as to extend from the upper face of first insulating film SO12 to first wiring layer M1 just below (planarly overlapping region) in the direction perpendicular to the main surface of substrate SUB (that is, the Z direction). Here, in each of the metal resistive element region and the wiring region, contact plug CP1 is formed so as to extend from the region just above one first wiring layer M1 in FIG. 24, in the upper face of first insulating film SO12, to first wiring layer M1 in the Z direction.

Figure 25:
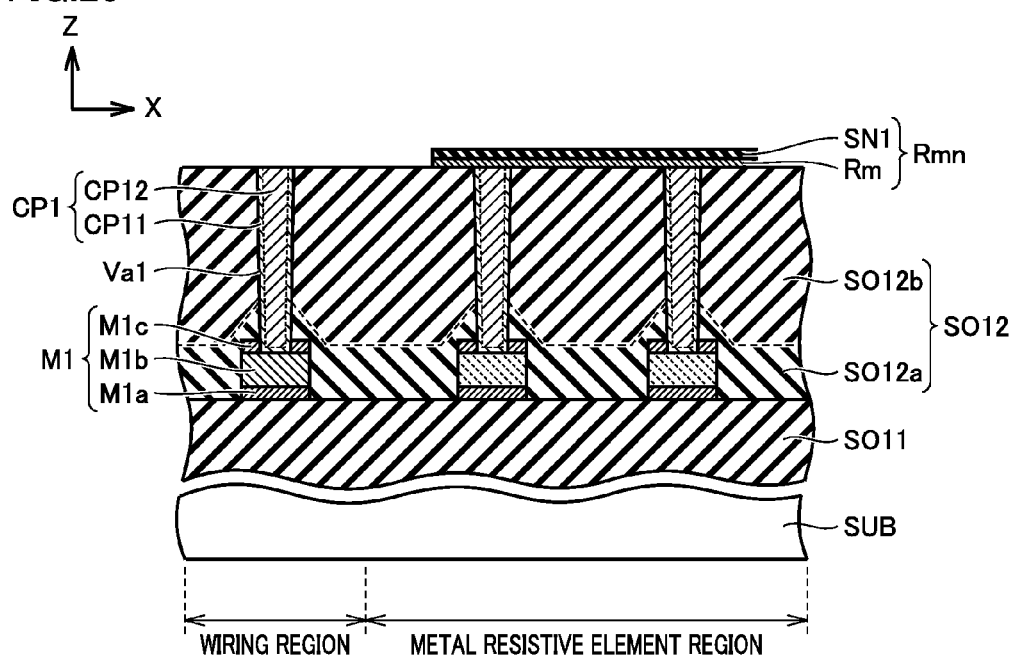
FIG. 25 is a schematic cross-sectional view showing a second step of the method of manufacturing the structure in FIG. 22 especially, in the third embodiment.

Referring to FIG. 25, at least one metal resistive element layer Rmn is formed on the upper face of first insulating film SO12 so as to be positioned just above two contact plugs CP1 and stride two contact plugs CP1 which are formed apart from each other in the X direction in the metal resistive element region, for example.

Figure 26:
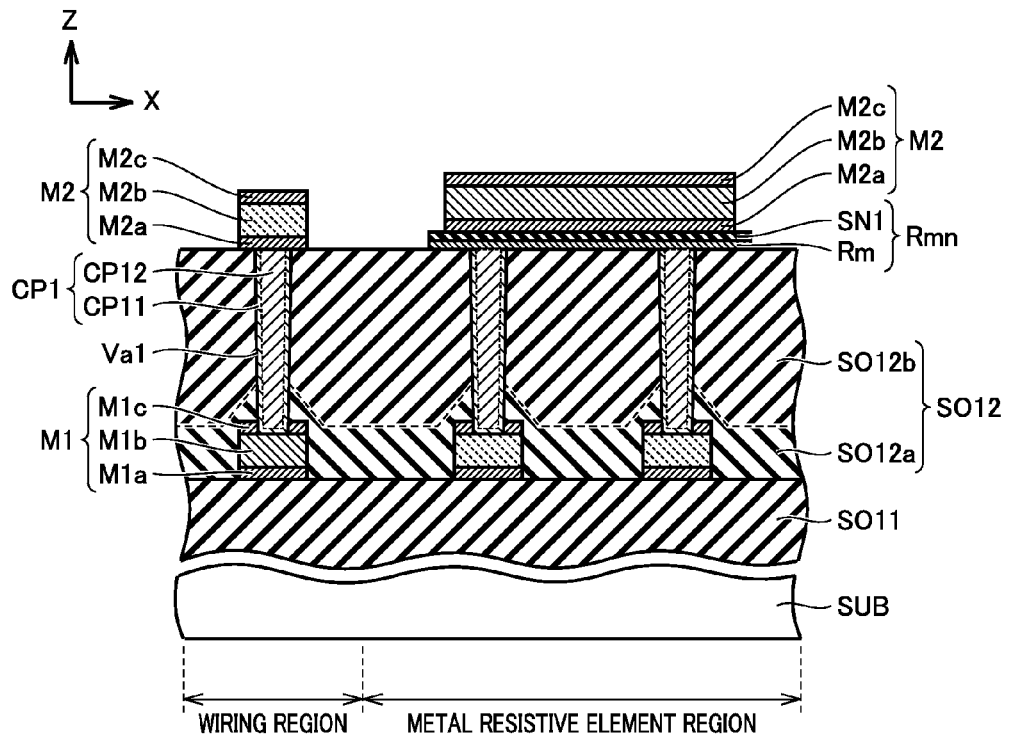
FIG. 26 is a schematic cross-sectional view showing a third step of the method of manufacturing the structure in FIG. 22 especially, in the third embodiment.

Referring to FIG. 26, the plurality of second wiring layers M2 are formed on first insulating film SO12. More specifically, second wiring layer M2 is formed so as to cover the upper face of metal resistive element layer Rmn in the metal resistive element region, and second wiring layer M2 is formed so as to cover the upper face of first insulating film SO12 and planarly overlap with first wiring layer M1 in the wiring region.

Referring to FIG. 22 again, after that, third insulating film SO14 and passivation film SN11 are formed in this order on first insulating film SO12 so as to cover the upper faces of second wiring layers M2.

Next, an operational advantage of this embodiment will be described.

According to this embodiment, the upper face of metal resistive element layer Rmn is covered with second wiring layer M2 which is equivalent to second wiring layer M2 in the wiring region, and this second wiring layer M2 serves as a protective film for metal resistive element layer Rmn to protect metal resistive element layer Rmn. Therefore, reliability of metal resistive element layer Rmn can be further improved, and reliability of the high-speed OCO circuit can be further improved. Especially, due to the protective film, it is possible to reduce the possibility that at the time of dry etching for an aluminum material of second wiring layer M2, metal resistive element layer Rmn just below is unintentionally etched and its shape is problematically changed.

In addition, according to this embodiment, contact plug CP1 extending from metal resistive element layer Rmn to first wiring layer M1 can be formed with the same mask as the mask used for forming contact plug CP1 extending from second wiring layer M2 to first wiring layer M1 in the wiring region. This is because each of contact plug CP1 extending from metal resistive element layer Rmn to first wiring layer M1 and contact plug CP1 extending from second wiring layer M2 to first wiring layer M1 in the wiring region is formed from the same face (upper face of first insulating film SO12).

Fourth Embodiment

First, a description will be given to a part of a multilayer wiring structure of a high-speed OCO circuit including metal resistive element layer Rmn in this embodiment, with reference to FIG. 27.

Figure 27:
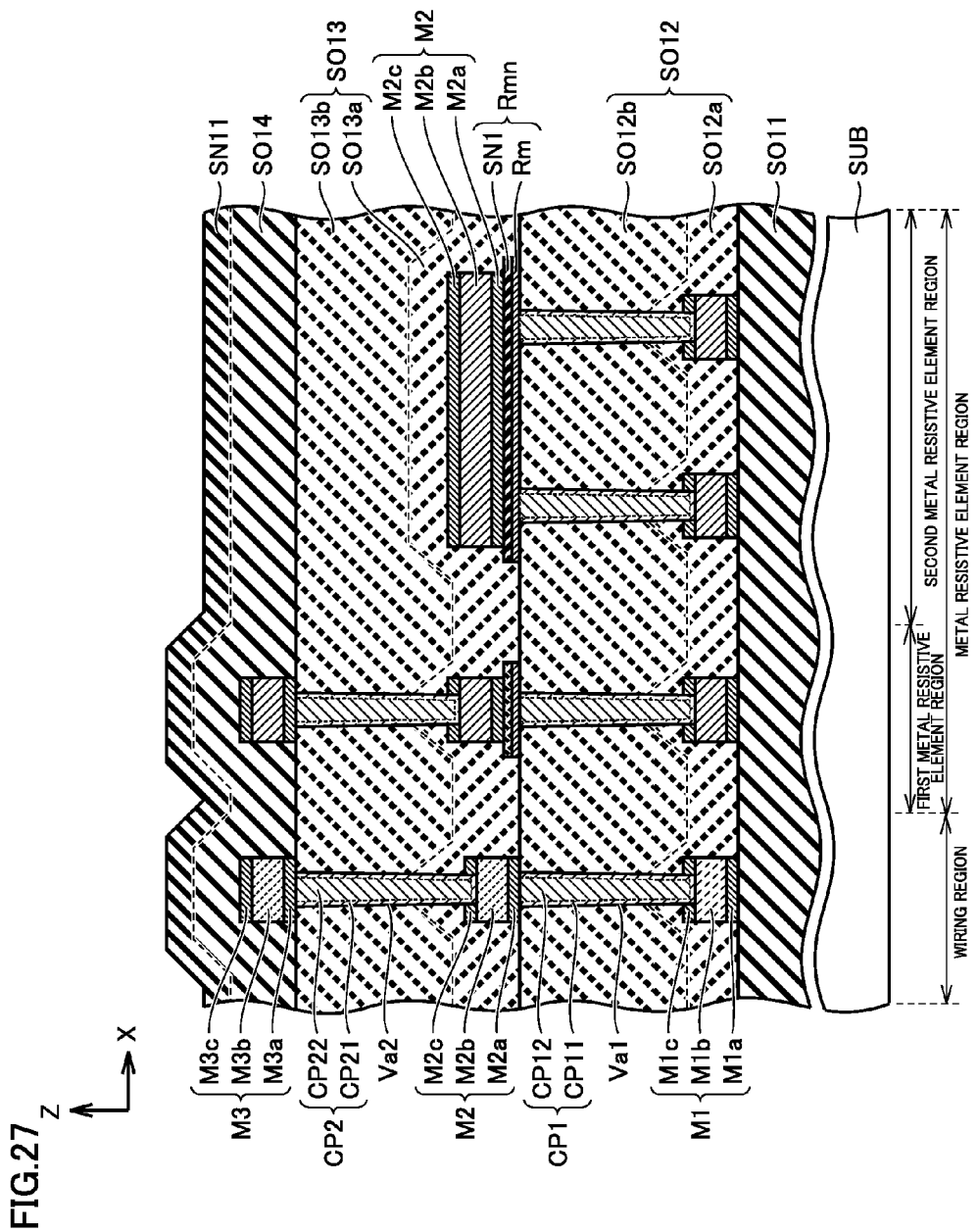
FIG. 27 is a schematic cross-sectional view showing a partial structure of a microcomputer chip in a fourth embodiment, including the high-speed OCO circuit in FIG. 2.

Referring to FIG. 27, the metal resistive element region and the wiring region are also formed in this embodiment, and second wiring layer M2 is formed so as to cover the upper face of metal resistive element layer Rmn in the metal resistive element region. This embodiment is the same as the third embodiment in this respect.

However, according to this embodiment, the metal resistive element region is divided into two metal resistive element regions such as a first metal resistive element region and a second metal resistive element region, and at least one metal resistive element region Rmn is arranged in each of the two metal resistive element regions. Metal resistive element layer Rmn (second metal resistive element layer) in the second metal resistive element region is connected to the plurality of (two) first wiring layers M1 through the plurality of (two) contact plugs CP1, similar to metal resistive element layer Rmn in the third embodiment.

Meanwhile, in the first metal resistive element region, metal resistive element layer Rmn (first metal resistive element layer) connected to one first wiring layer M1 through one contact plug CP1 is similarly formed on the upper face of first insulating film SO12 on which metal resistive element layer Rmn serving as the second metal resistive element layer and second wiring layer M2 in the wiring region are formed. The first metal resistive element region has the same configuration as that of the wiring region except that metal resistive element layer Rmn is arranged so as to be sandwiched between second wiring layer M2 and first insulating film SO12. First metal resistive element layer Rmn has second wiring layer M2 formed on its upper face, similar to second metal resistive element layer Rmn.

That is, each of the plurality of (two, for example) second wiring layers M2 which cover the upper faces of first and second metal resistive element layers Rmn serves as the second wiring layer for protection to protect metal resistive element layer Rmn from the stress of the upper layer, similar to second wiring layer M2 covering the upper face of metal resistive element layer Rmn in the third embodiment. Meanwhile, (one, for example) second wiring layer M2 in the wiring region serves as the second wiring layer for wiring which is formed on the same layer with metal resistive element layer Rmn (on upper face of first insulating film SO12) so as to be spaced apart from metal resistive layers Rmn.

First metal resistive element layer Rmn and its upper face, that is, second wiring layer M2 constitute a capacitive element. This will be described below. Metal resistive element layer Rmn has the two-layer structure composed of metal wiring layer Rm and reflection preventing film layer SN1 as described above. Second wiring layer M2 is formed so as to cover the upper face of reflection preventing film layer SN1. Thus, its configuration is provided such that the reflection preventing film layer SN1 composed of an insulator is sandwiched between metal wiring layer Rm and second wiring layer M2 each composed of a conductor, so that it is said that the capacitive element is constituted.

According to the configuration in FIG. 27, the following configuration is added, compared with the configuration in the third embodiment (FIG. 22). That is, second insulating film SO13 is formed on first insulating film SO12 so as to cover upper faces of second wiring layers M2 for protection and wiring, and contact plugs CP2 serving as another conductive layers are formed so as to extend from the upper faces of second wiring layer M2 in the capacitive element and second wiring layer M2 for wiring upward in the Z direction (in a direction opposite to substrate SUB). In addition, a third wiring layer M3 is formed just above each of contact plugs CP2. Contact plug CP2 as the other conductive layer is connected to third wiring layer M3. Therefore, according to this embodiment, in the metal resistive element region, at least one (two, for example) resistive element region contact plugs CP1 and CP2 are formed, and in the wiring region, at least one (two, here) wiring region contact plugs CP1 and CP2 are formed. Then, third insulating film SO14 and passivation film SN11 are laminated in this order on second insulating film SO13 so as to cover the upper faces of third wiring layers M3.

Second insulating film SO13 is composed of second insulating film lower layer SO13a and second insulating film upper layer SO13b, and this configuration is similar to first insulating film lower layer SO12a and first insulating film upper layer SO12b of first insulating film SO12. Contact plug CP2 is composed of side and bottom face layer CP21 and internal filling layer CP22 provided inside, and this configuration is similar to side and bottom face layer CP11 and internal filling layer CP12 of contact plug CP1. Furthermore, third wiring layer M3 is composed of a lower layer M3a, a wiring body M3b, and an upper layer M3c laminated in this order. Layers M3a to M3c are basically similar to layers M1a to M1c, and layers M2a to M2c of first and second wiring layers M1 and M2.

In addition, a configuration of this embodiment other than the above is almost the same as the configuration of the third embodiment, so that the same component is marked with the same reference and its description is not repeated.

Next, a description will be given to a method of manufacturing a microcomputer chip (portion shown in FIG. 27, especially) as a method of manufacturing the semiconductor device in this embodiment, with reference to FIGS. 28 to 31.

Figure 28:
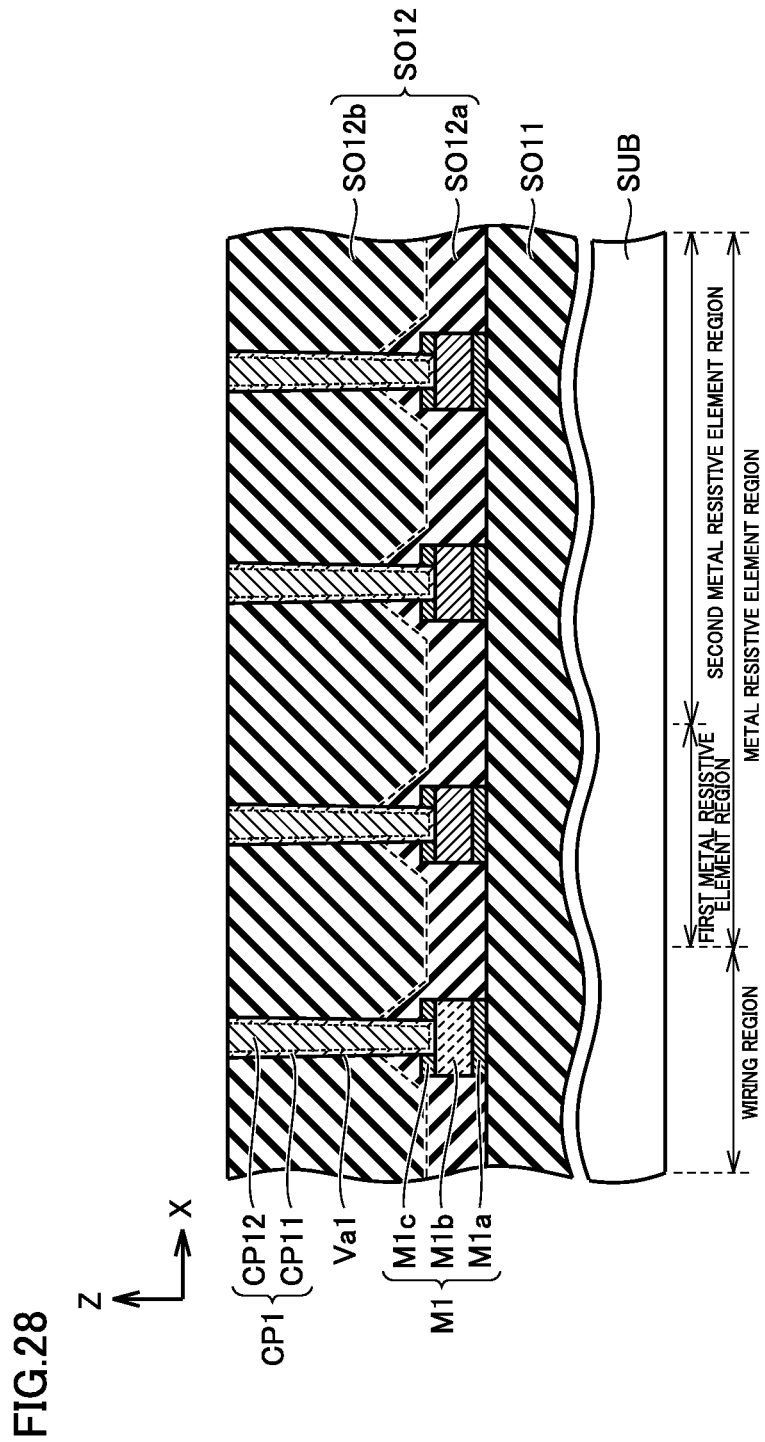
FIG. 28 is a schematic cross-sectional view showing a first step of a method of manufacturing the structure in FIG. 27 especially, in the fourth embodiment.

Referring to FIG. 28, substrate SUB is prepared similar to the third embodiment, and first wiring layers M1, first insulating film SO12, and contact plugs CP1 are formed by the similar processes as those in the third embodiment. However, according to this embodiment, the metal resistive element region includes the first metal resistive element region having first metal resistive element layer Rmn, and the second metal resistive element region having second metal resistive element layer Rmn, so that the numbers of first wiring layers M1 and contact plugs CP1 need to be decided based on it.

Figure 29:
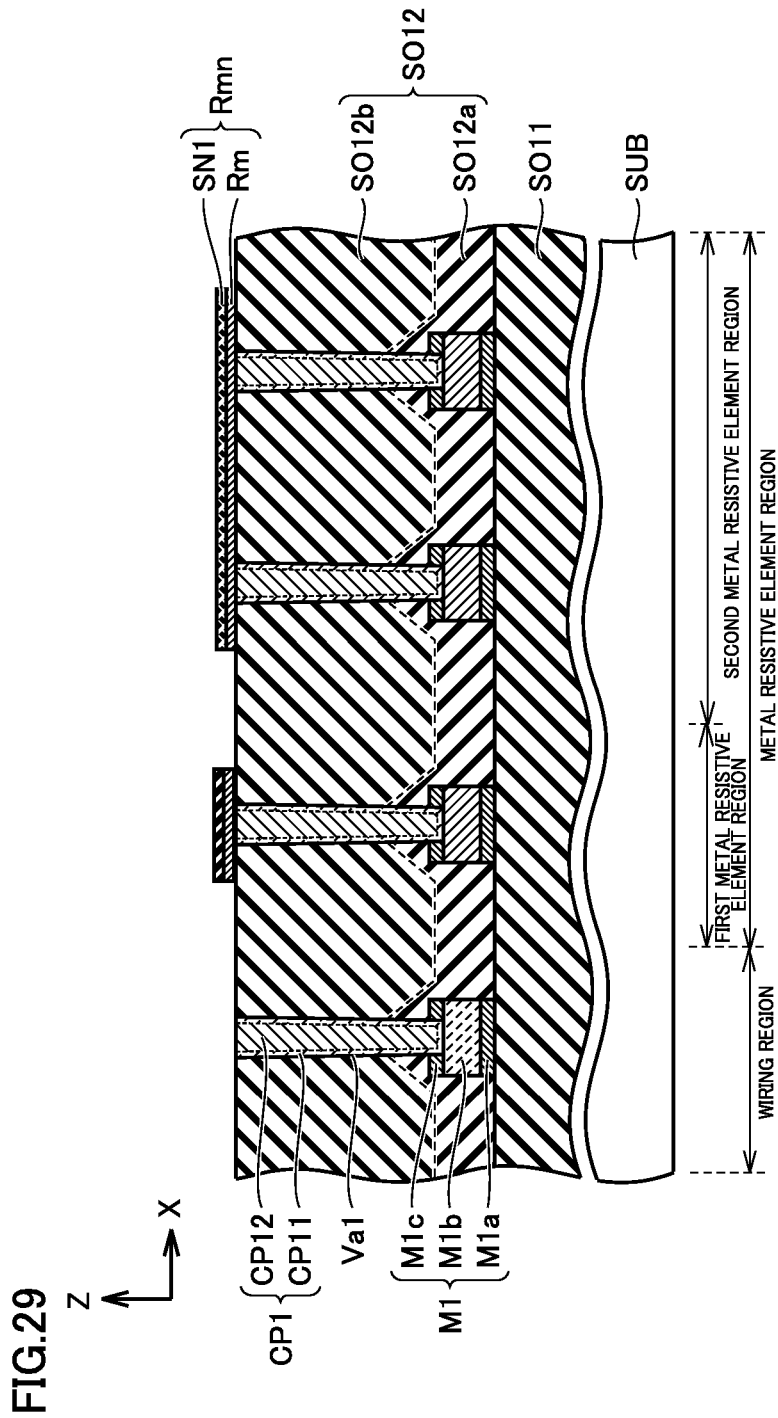
FIG. 29 is a schematic cross-sectional view showing a second step of the method of manufacturing the structure in FIG. 27 especially, in the fourth embodiment.

Referring to FIG. 29, in the first metal resistive element region, at least one metal resistive element layer Rmn is formed just above contact plug CP1 so as to cover contact plug CP1. At this time, metal wiring layer Rm is formed and its upper face is covered with reflection preventing film layer SN1. In addition, in the second metal resistive element region, one metal resistive element layer Rmn is formed just above two contact plugs CP1 so as to stride two contact plugs CP1 formed so as to be spaced apart from each other in the X direction. At this time, metal wiring layer Rm and reflection preventing film layer SN1 that covers the upper face of metal wiring layer Rm are formed.

Figure 30:
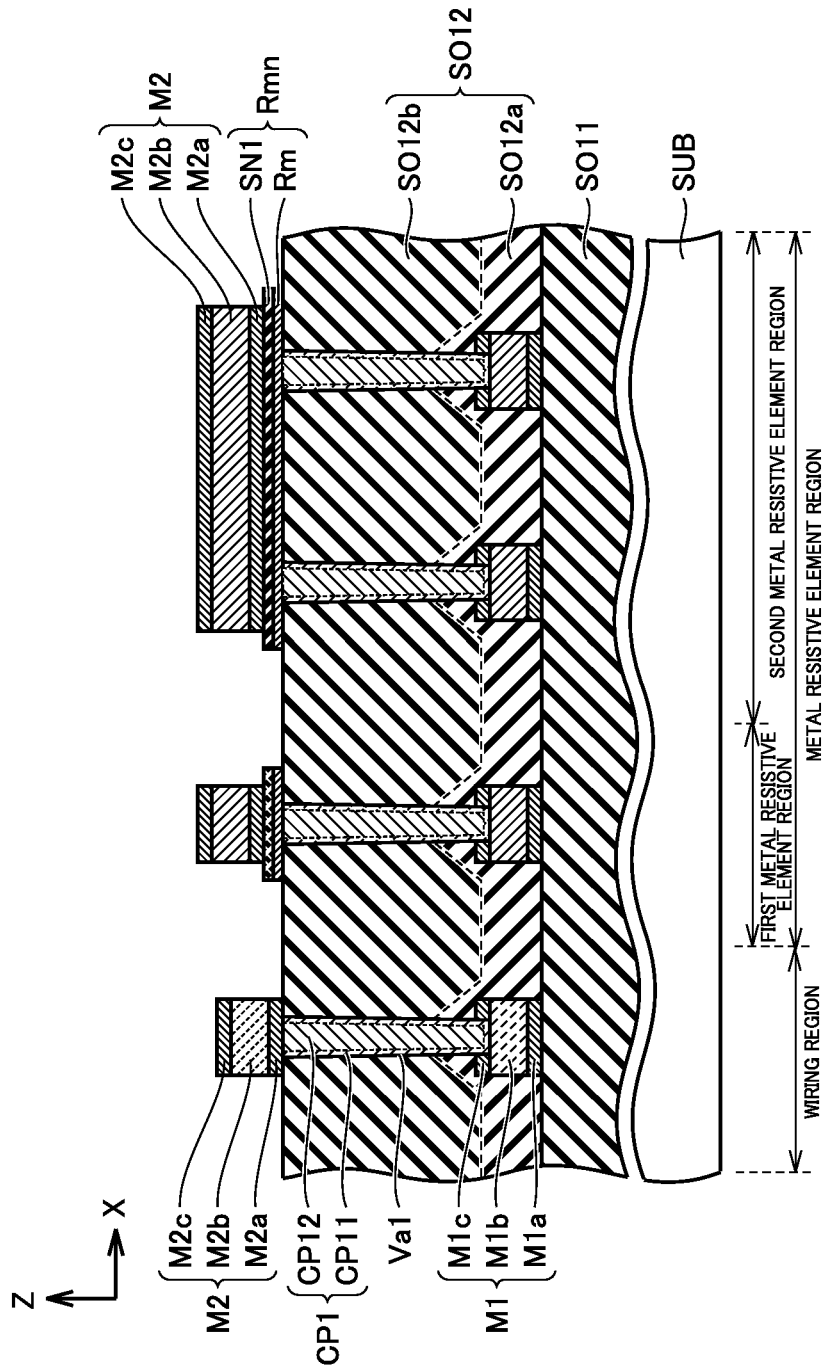
FIG. 30 is a schematic cross-sectional view showing a third step of the method of manufacturing the structure in FIG. 27 especially, in the fourth embodiment.

Referring to FIG. 30, the plurality of second wiring layers M2 are formed on first insulating film SO12. More specifically, in the first and second metal resistive element regions, (two, for example) second wiring layers M2 for protection are formed so as to cover the upper faces of metal resistive element layers Rmn, and in the wiring region, (one, for example) second wiring layer M2 for wiring is formed on the same layer as the first and second metal resistive element layers Rmn so as to cover the upper face of first insulating film SO12 and planarly overlap with first wiring layer M1. Second wiring layer M2 for protection and second wiring layer M2 for wiring are formed at the same time. Thus, in the first metal resistive element region, the capacitive element is formed with metal wiring layer Rm, and reflection preventing film layer SN1 in first metal resistive element layer Rmn, and second wiring layer M2. Furthermore, in the second metal resistive element region, second metal resistive element layer Rmn is formed as the resistive element so as to be electrically connected to (two) first wiring layers M1.

Figure 31:
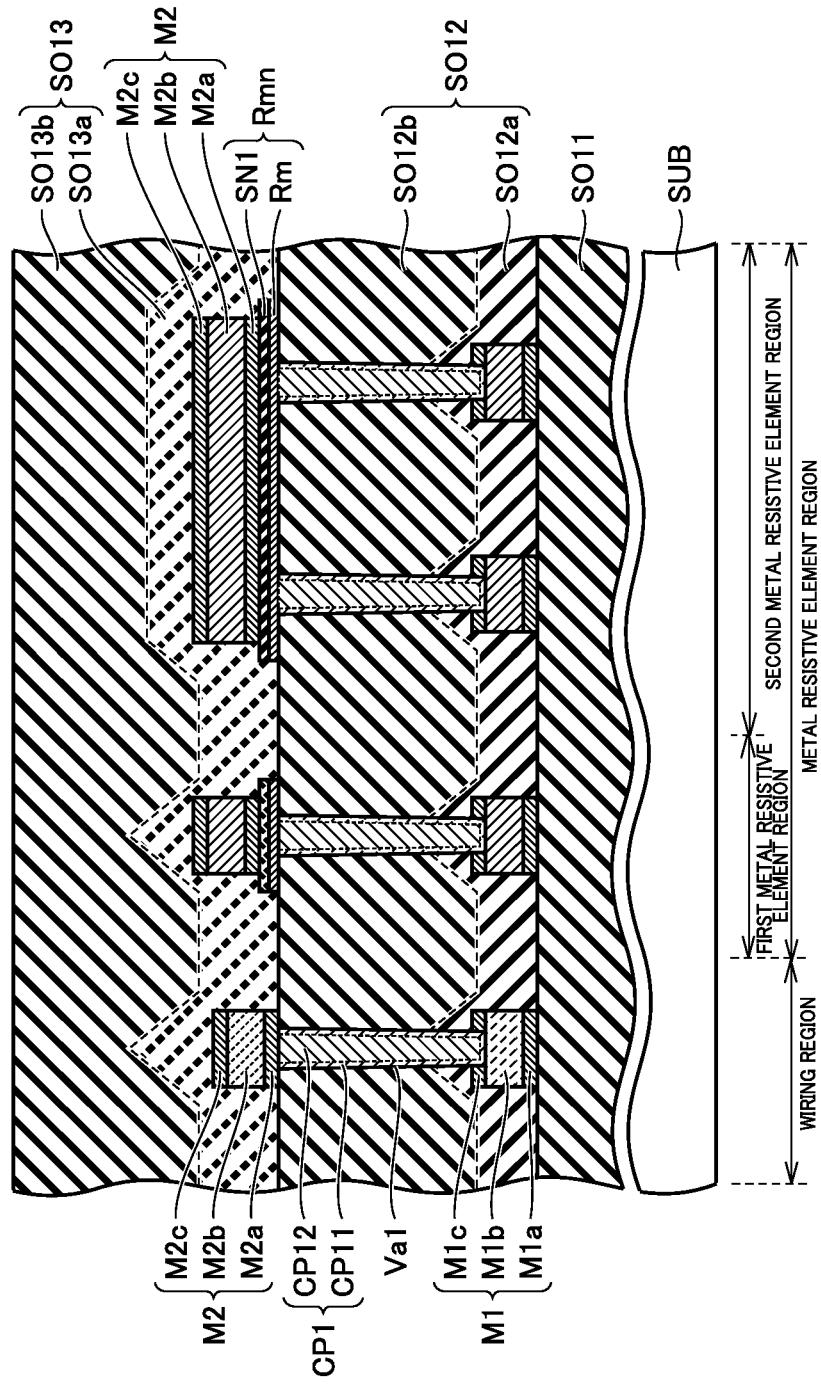
FIG. 31 is a schematic cross-sectional view showing a fourth step of the method of manufacturing the structure in FIG. 27 especially, in the fourth embodiment.

Referring to FIG. 31, second insulating film SO13 is formed on first insulating film SO12 so as to cover the upper faces of second wiring layers M2 for protection and for wiring. Second insulating film SO13 is formed so as to have second insulating film lower layer SO13a and second insulating film upper layer SO13b, and they are formed by the same processes as those for first insulating film lower layer SO12a and first insulating film upper layer SO12b of first insulating film SO12.

Referring to FIG. 27 again, subsequently, the plurality of contact plugs CP2 are formed so as to extend from regions just above second wiring layers M2, in the upper face of second insulating film SO13 (second insulating film upper layer SO13b) to second wiring layers M2 in the Z direction. More specifically, contact holes Va2 are formed so as to extend from the regions just above second wiring layers M2 in FIG. 31, in the upper face of second insulating film SO13, to second wiring layers M2 in the Z direction. Subsequently, side and bottom face layer CP21 and internal filling layer CP22 are formed in contact hole Va2, whereby contact plug CP2 is formed. Side and bottom face layer CP21 and internal filling layer CP22 may be formed by the same processes as those for side and bottom face layer CP11 and internal filling layer CP12. Thus, contact plug CP2 is formed so as to extend upward (opposite to substrate SUB) from each of the upper faces of second wiring layers M2 for protection and wiring in the Z direction.

Subsequently, the plurality of (two, for example) third wiring layers M3 are formed on second insulating film SO13 so as to cover the plurality of conductive layers CP2 (just above second wiring layers M2 for protection and wiring) and be spaced apart from each other in the X direction. Third wiring layer M3 may be formed by the same process as that for first and second wiring layers M1 and M2. Thus, third wiring layer M3 and contact plug CP2 are electrically connected to each other.

After that, third insulating film SO14 and passivation film SN11 are formed in this order on second insulating film SO13 so as to cover upper faces of third wiring layers M3.

Next, an operational advantage of this embodiment will be described.

According to this embodiment, contact plug CP1 extending from metal resistive element layer Rmn to first wiring layer M1 can be formed with the same mask as the mask used for forming contact plug CP1 extending from second wiring layer M2 to first wiring layer M1 in the wiring region. This is because each of contact plug CP1 extending from metal resistive element layer Rmn to first wiring layer M1 and contact plug CP1 extending from second wiring layer M2 to first wiring layer M1 in the wiring region is formed from the same face (upper face of first insulating film SO12).

According to this embodiment, not only the wiring region partially serving as the multilayer wiring structure, but also the first metal resistive element region constituting the capacitive element can be formed at the same time as the second metal resistive element region formed for the resistive element. Therefore, the semiconductor device having the high-speed OCO circuit can be further highly integrated.

According to this embodiment, third wiring layer M3 is further formed above the capacitive element and the metal resistive element layer, so that metal resistive element layer Rmn is not directly covered with passivation film SN11. Therefore, it is possible to reduce the possibility that the precision as the oscillator in the high-speed circuit is lowered because metal resistive element layer Rmn receives the stress from passivation film SN11.

In addition, according to this embodiment also, similar to the third embodiment, since the upper face of metal resistive element layer Rmn is covered with second wiring layer M2, second wiring layer M2 serves as the protective film so that metal resistive element layer Rmn is not etched away unintentionally.

Fifth Embodiment

First, a description will be given to a part of a multilayer wiring structure of a high-speed OCO circuit including metal resistive element layer Rmn in this embodiment with reference to FIG. 32.

Figure 32:
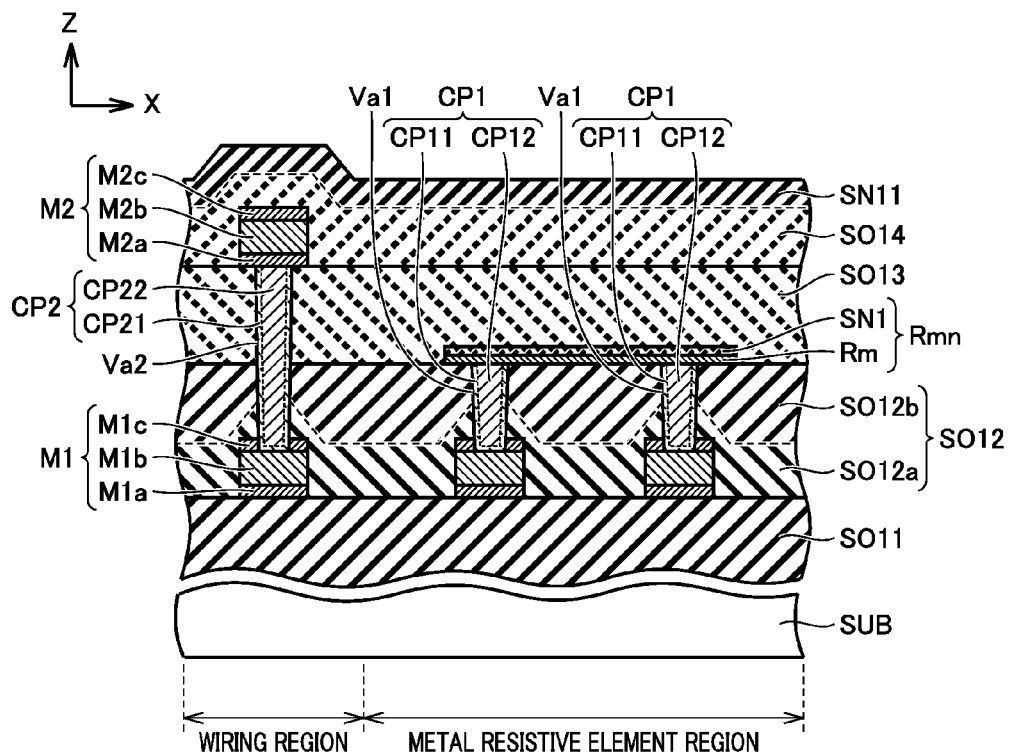
FIG. 32 is a schematic cross-sectional view showing a partial structure of a microcomputer chip in a fifth embodiment, including the high-speed OCO circuit in FIG. 2.

Referring to FIG. 32, the multilayer wiring structure of the high-speed OCO circuit of a semiconductor device according to this embodiment has interlayer insulating film SO11 on the (one) main surface of substrate SUB, and the plurality of first wiring layers M1 arranged on interlayer insulating film SO11 so as to be spaced apart from each other in the X direction. First insulating film lower layer SO12a and first insulating film upper layer SO12b of first insulating film SO12 are formed in this order on interlayer insulating film SO11. In addition, second insulating film SO13 is formed on the upper face thereof so as to cover first insulating film upper layer SO12b, and third insulating film SO14 and passivation film SN11 are formed in this order so as to cover the upper face of second insulating film SO13.

This embodiment also has the metal resistive element region and the wiring region. In the wiring region, at least one second wiring layer M2 is formed on second insulating film SO13 so as to planarly overlap with first wiring layer M1. In addition, in the metal resistive element region, (one, for example) metal resistive element layer Rmn is formed on first insulating film SO12 so as to be arranged just above at least one (two, for example) first wiring layers, formed in the metal resistive element region, among the plurality of first wiring layers M1. Here, metal resistive element layer Rmn is arranged above first wiring layers M1 so as to stride two first wiring layers M1 spaced apart from each other in the X direction, in the metal resistive element region.

In the wiring region, wiring region contact plug CP2 extends from second wiring layer M2 to first wiring layer M1 in the Z direction, so that first wiring layer M1 and second wiring layer are electrically connected. In addition, in the metal resistive element region, resistive element region contact plug CP1 extends from metal resistive element layer Rmn to first wiring layer M1 direction. Thus, each of contact plugs CP1 and CP2 extends to first wiring layer M1 in the Z direction.

Furthermore, a configuration other than the above is almost the same as the configuration of the first embodiment, so that the same component is marked with the same reference and its description is not repeated.

Next, a description will be given to a method of manufacturing a microcomputer chip (portion shown in FIG. 32, especially) as a method of manufacturing the semiconductor device in this embodiment, with reference to FIGS. 33 and 34.

Figure 33:
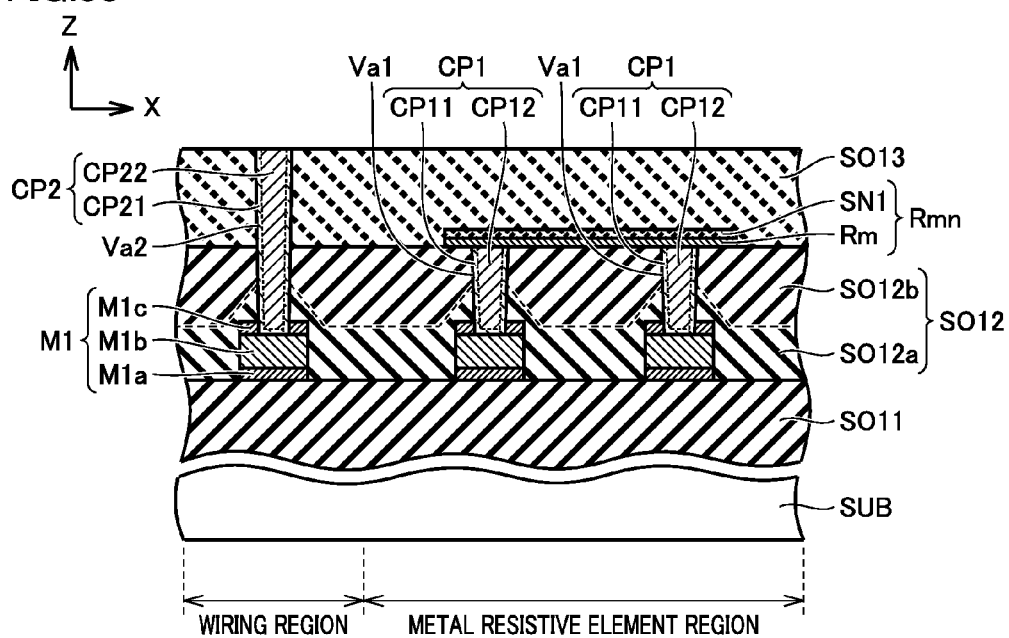
FIG. 33 is a schematic cross-sectional view showing a first step of a method of manufacturing the structure in FIG. 32 especially, in the fifth embodiment.

Referring to FIG. 33, substrate SUB is prepared similar to the first embodiment, and interlayer insulating film SO11 is formed above its (one) main surface. Then, the same processes as those shown in FIGS. 4, 5, 10, and 11 are performed. More specifically, the plurality of first wiring layers M1 are formed on the main surface of substrate SUB, and first insulating film SO12 is formed so as to the upper faces of first wiring layers M1. With respect to at least one first wiring layer M1 among the plurality of first wiring layers M1, especially with respect to first wiring layer M1 in the metal resistive element region, at least one (two, for example) contact plug CP1 is formed so as to extend from a region which planarly overlaps with first wiring layer M1, in the upper face of first insulating film SO12 (first insulating film upper layer SO12b), to first wiring layer M1 provided just below in the Z direction.

For example, one metal resistive element layer Rmn is formed just above previously formed contact plugs CP1 so as to cover and stride two contact plugs CP1 in the metal resistive element region. Then, second insulating film SO13 is formed so as to cover the upper faces of metal resistive element layer Rmn and first insulating film SO12.

Subsequently, contact plug CP2 (another conductive layer) is formed especially in the wiring region in which contact plug CP1 was not formed in the previous step, as the conductive layer extending from a region which planarly overlaps with at least one first wiring layer M1 in the upper face of second insulating film SO13, to first wiring layer M1 provided just below in the Z direction. A configuration of contact plug CP2 is the same as that of contact plug CP2 in the fourth embodiment.

Figure 34:
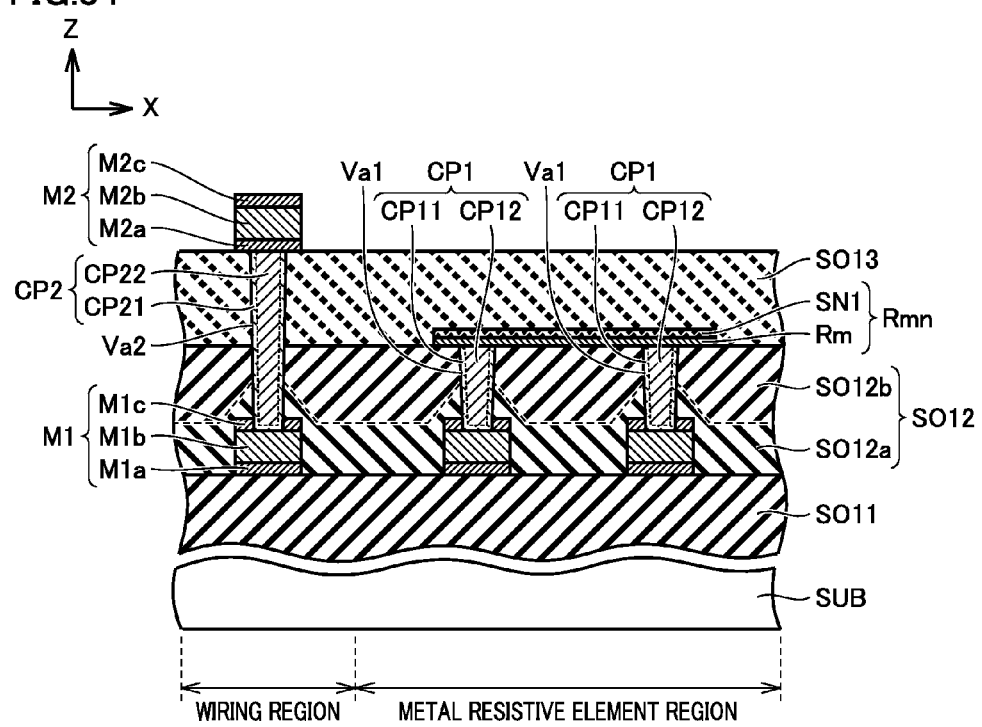
FIG. 34 is a schematic cross-sectional view showing a second step of the method of manufacturing the structure in FIG. 32 especially, in the fifth embodiment.

Referring to FIG. 34, at least one second wiring layer M2 is formed on second insulating film SO13 so as to cover contact plug CP2.

Referring to FIG. 32 again, after than, third insulating film SO14 and passivation film SN11 are formed on second insulating film SO13 in this order so as to cover the upper face of second wiring layer M2. In addition, detailed descriptions of the omitted steps are basically the same as those in each embodiment.

Next, an operational advantage of this embodiment will be described.

According to this embodiment, metal resistive element layer Rmn is arranged on a side (substrate SUB side) lower than second wiring layer M2 serving as the uppermost wiring layer. Therefore, it is possible to reduce the possibility that the precision as the oscillator of the high-speed OCO circuit is lowered because metal resistive element layer Rmn receives the stress from passivation film SN11.

Sixth Embodiment

First, a description will be given to a part of a multilayer wiring structure of a high-speed OCO circuit including metal resistive element layer Rmn in this embodiment with reference to FIG. 35.

Figure 35:
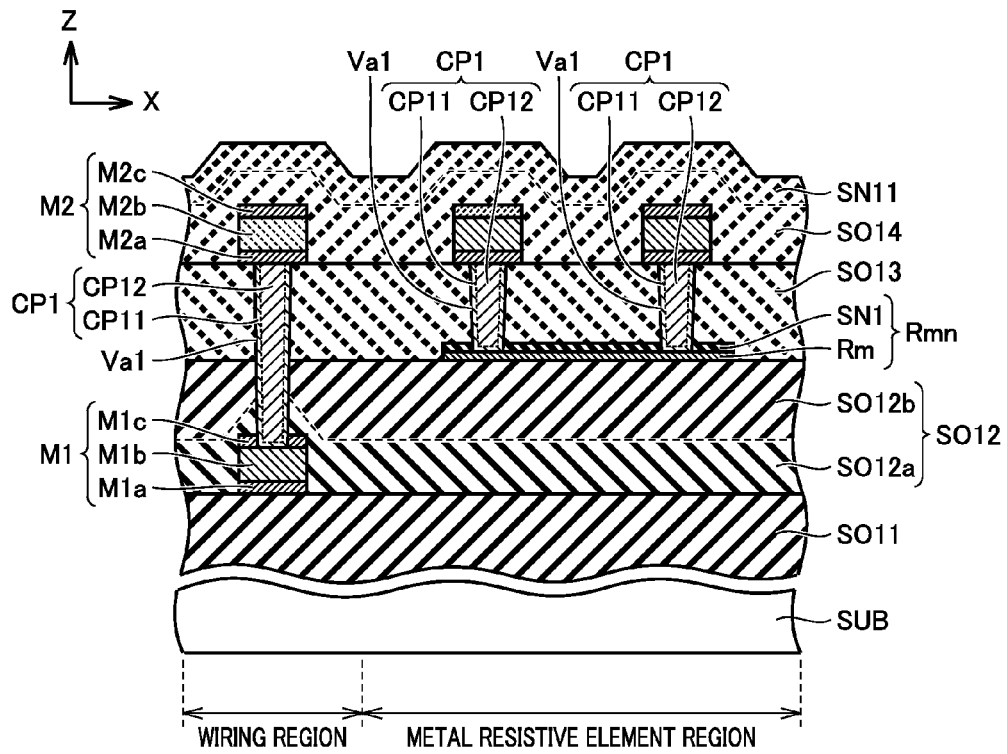
FIG. 35 is a schematic cross-sectional view showing a partial structure of a microcomputer chip in a sixth embodiment, including the high-speed OCO circuit in FIG. 2.

Referring to FIG. 35, the multilayer wiring structure of the high-speed OCO circuit of a semiconductor device in this embodiment has interlayer insulating film SO11 above the (one) main surface of substrate SUB, and at least one first wiring layer M1 on interlayer insulating film SO11. First insulating film lower layer SO12a and first insulating film upper layer SO12b as first insulating film SO12 are formed in this order on interlayer insulating film SO11 so as to cover the upper faces of the plurality of first wiring layers M1. Furthermore, second insulating film SO13 is formed so as to cover its upper face, and third insulating film SO14 and passivation layer SN11 are formed in this order so as to cover the upper face of second insulating film SO13.

This embodiment also has the metal resistive element region and the wiring region. In the wiring region, for example, one second wiring layer M2 is formed on second insulating film SO13 so as to planarly overlap with first wiring layer M1. In addition, in the metal resistive element region, the plurality of (two, for example) second wiring layers M2 are arranged on second insulating film SO13, and spaced apart from each other in the X direction so as to planarly overlap with metal resistive element layer Rmn.

In the metal resistive element region, metal resistive element layer Rmn is arranged so as to cover the upper face of first insulating film upper layer SO12b of first insulating film SO12, and positioned just below at least one (two, for example) second wiring layer M2 arranged in the metal resistive element region.

In the metal resistive element region, resistive element region contact plug CP1 is formed so as to extend from at least one (two, for example) second wiring layer M2 to metal resistive element layer Rmn in the Z direction. Here, contact plug CP1 is connected to metal resistive element layer Rmn so as to reach metal wiring layer Rm of metal resistive element layer Rmn. In the wiring region, similar to the first embodiment, wiring region contact plug CP1 extends from second wiring layer M2 to first wiring layer M1 overlapping with second wiring layer M2 in the planar view in the Z direction (direction from second wiring layer M2 to metal resistive element layer Rmn), and electrically connects second wiring layer M2 to first wiring layer M1.

Furthermore, a configuration other than the above is almost the same as the configuration of the first embodiment, so that the same component is marked with the same reference and its description is not repeated.

Next, a description will be given to a method of manufacturing a microcomputer chip (portion shown in FIG. 35, especially) as a method of manufacturing the semiconductor device in this embodiment, with reference to FIGS. 36 to 38.

Figure 36:
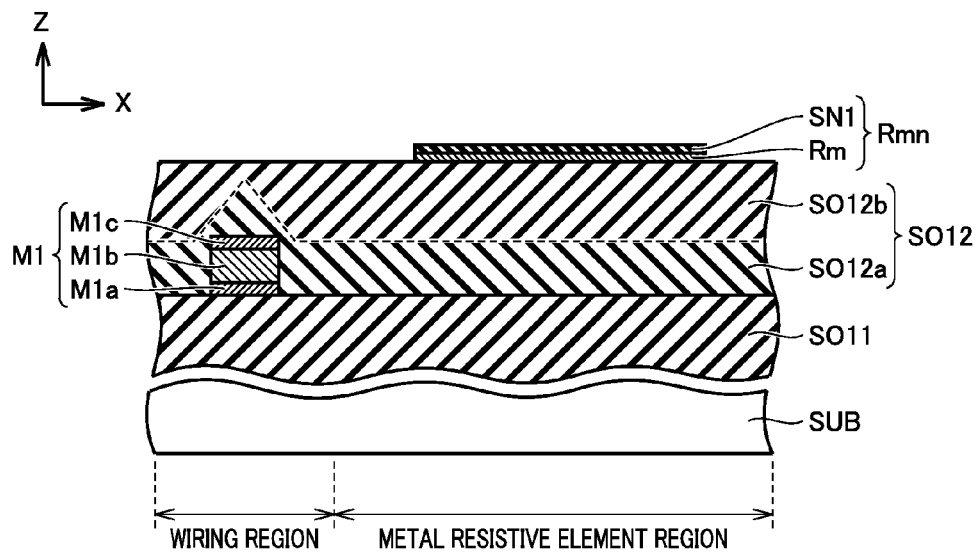
FIG. 36 is a schematic cross-sectional view showing a first step of a method of manufacturing the structure in FIG. 35 especially, in the sixth embodiment.

Referring to FIG. 36, substrate SUB is prepared similar to the first embodiment, and interlayer insulating film SO11 is formed above its (one) main surface. Then, the same processes as those shown in FIGS. 17 and 18 are performed. More specifically, for example, at least one first wiring layer M1 is formed in the wiring region, and first insulating film SO12 (first insulating film lower layer SO12a and first insulating film upper layer SO12b) is formed so as to cover the upper face of first wiring layer M1.

Metal resistive element layer Rmn is formed so as to cover the upper face of first insulating film upper layer SO12b. Here, metal resistive element layer Rmn is formed in a region which planarly does not overlap with a region in which first wiring layer M1 is formed. More specifically, while first wiring layer M1 is formed in the wiring region, metal resistive element layer Rmn is formed in the metal resistive element region.

Figure 37:
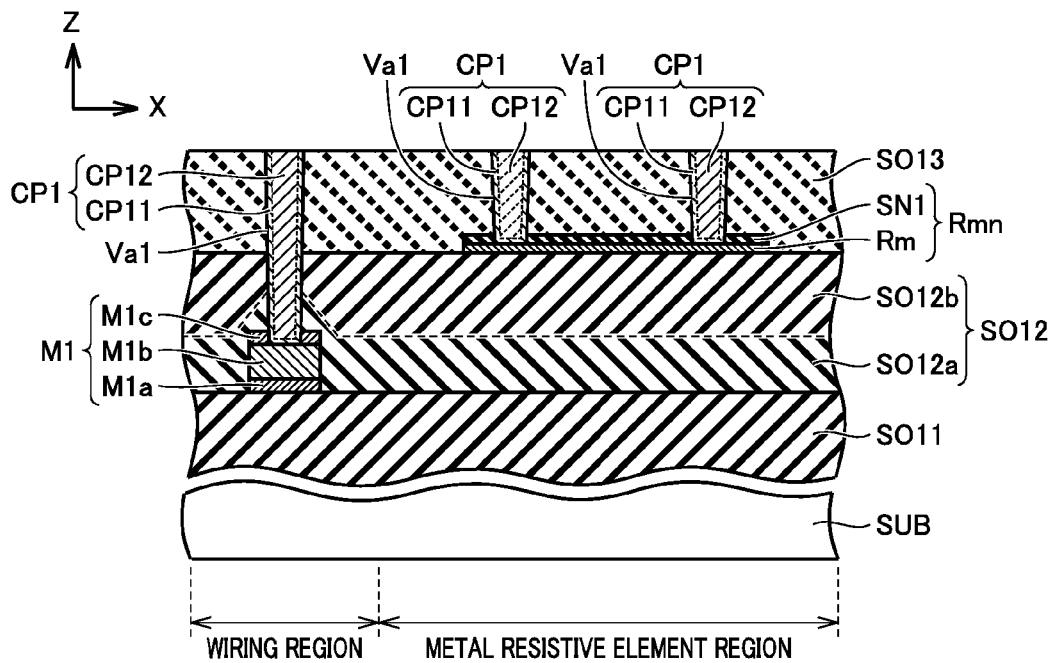
FIG. 37 is a schematic cross-sectional view showing a second step of the method of manufacturing the structure in FIG. 35 especially, in the sixth embodiment.

Referring to FIG. 37, second insulating film SO13 is formed so as to cover upper faces of metal resistive element layer Rmn and first insulating film SO12. Then, the plurality of conductive layers CP1 (contact plugs CP1) are formed so as to extend from the upper face of second insulating film SO13 to metal resistive element layer Rmn in the direction perpendicular to the main surface of substrate SUB (that is, the Z direction). Here, in the wiring region, contact plug CP1 is formed so as to extend from second wiring layer M2 to first wiring layer M1, and in the metal resistive element region, contact plug CP1 is formed so as to extend from second wiring layer M2 to metal resistive element layer Rmn.

Figure 38:
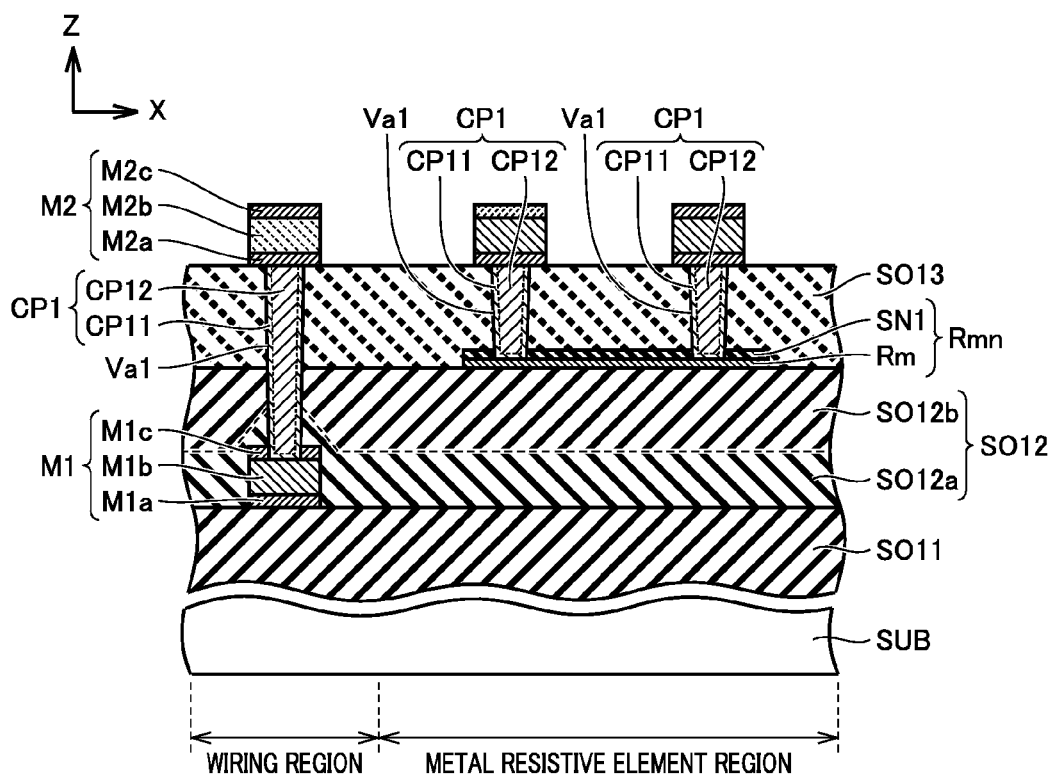
FIG. 38 is a schematic cross-sectional view showing a third step of the method of manufacturing the structure in FIG. 35 especially, in the sixth embodiment.

Referring to FIG. 38, in each of the metal resistive element region and wiring region, the plurality of second wiring layers M2 are formed so as to cover the plurality of contact plugs CP1.

Referring to FIG. 35 again, after than, third insulating film SO14 and passivation film SN11 are formed on second insulating film SO13 in this order so as to cover the upper faces of second wiring layers M2. In addition, detailed descriptions of the omitted steps are basically the same as those in each embodiment.

Next, an operational advantage of this embodiment will be described.

According to this embodiment, similar to the second embodiment, contact plug CP1 extending from second wiring layer M2 to metal resistive element layer Rmn in the metal resistive element region can be formed with the same mask as the mask used for forming contact plug CP1 extending from second wiring layer M2 to first wiring layer M1 in the wiring region. Therefore, it is not necessary to prepare the mask for forming only contact plug CP1 for being connected to metal resistive element layer Rmn, and contact plug CP1 for metal resistive element layer Rmn can be formed with the mask for forming the multilayer wiring structure. As a result, the manufacturing cost can be reduced.

Seventh Embodiment

First, a description will be given to a part of a multilayer wiring structure of a high-speed OCO circuit including metal resistive element layer Rmn in this embodiment with reference to FIG. 39.

Figure 39:
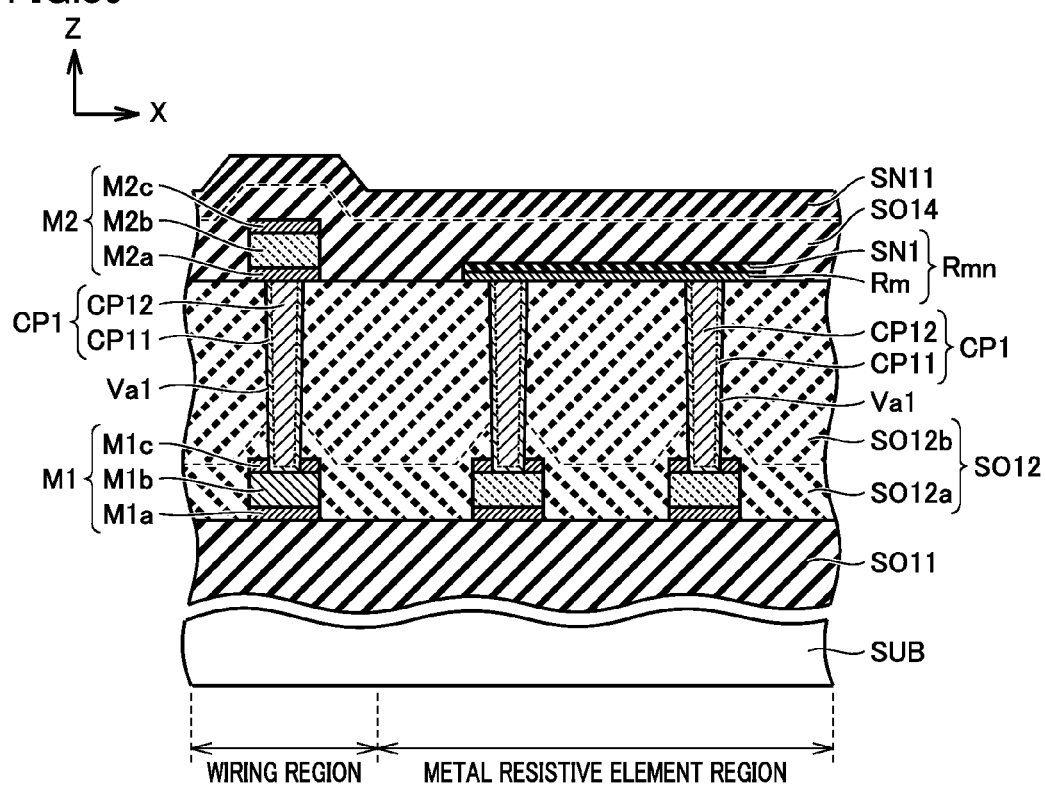
FIG. 39 is a schematic cross-sectional view showing a partial structure of a microcomputer chip in a seventh embodiment, including the high-speed OCO circuit in FIG. 2.

Referring to FIG. 39, the multilayer wiring structure of the high-speed OCO circuit of a semiconductor device in this embodiment has interlayer insulating film SO11 above the (one) main surface of substrate SUB, and the plurality of first wiring layers M1 on interlayer insulating film SO11. First insulating film SO12 (first insulating film lower layer SO12a and first insulating film upper layer SO12b) is formed on interlayer insulating film SO11 so as to cover the upper faces of the plurality of first wiring layers M1.

This embodiment also has the metal resistive element region and the wiring region. In the metal resistive element region, (at least one) metal resistive element layer Rmn is arranged on first insulating film SO12 so as to be positioned just above (two, for example) first wiring layers M1, formed especially in the metal resistive element region, among the plurality of first wiring layers M1. Here, metal resistive element layer Rmn is arranged above first wiring layers M1 so as to stride two first wiring layers M1 arranged apart from each other in the X direction in the metal resistive element region.

In the wiring region, at least one second wiring layer M2 is formed on first insulating film SO12 so as to planarly overlap with first wiring layer M1. Second wiring layer M2 is arranged on the same layer with (at least one) metal resistive element layer Rmn. In other words, second wiring layer M2 and metal resistive element layer Rmn are arranged on the same face, that is, on insulating film SO12 (first insulating film upper layer SO12b).

In the wiring region having second wiring layer M2, wiring region contact plug CP1 extends from second wiring layer M2 to first wiring layer M1 in the Z direction, and thus first wiring layer M1 and second wiring layer M2 are electrically connected to each other. Furthermore, in the metal resistive element region having metal resistive element layer Rmn, resistive element region contact plug CP1 extends from metal resistive element layer Rmn to at least one opposed first wiring layer M1 (two first wiring layers M1, for example) in the Z direction. Thus, among the plurality of contact plugs CP1, at least one resistive element region contact plug CP1 and at least one other wiring region contact plug CP1 extend to the plurality of first wiring layers M1, respectively.

Furthermore, a configuration other than the above is almost the same as the configuration of the third embodiment, so that the same component is marked with the same reference and its description is not repeated.

Next, a description will be given to a method of manufacturing a microcomputer chip (portion shown in FIG. 39, especially) as a method of manufacturing the semiconductor device in this embodiment, with reference to FIG. 40.

Figure 40:
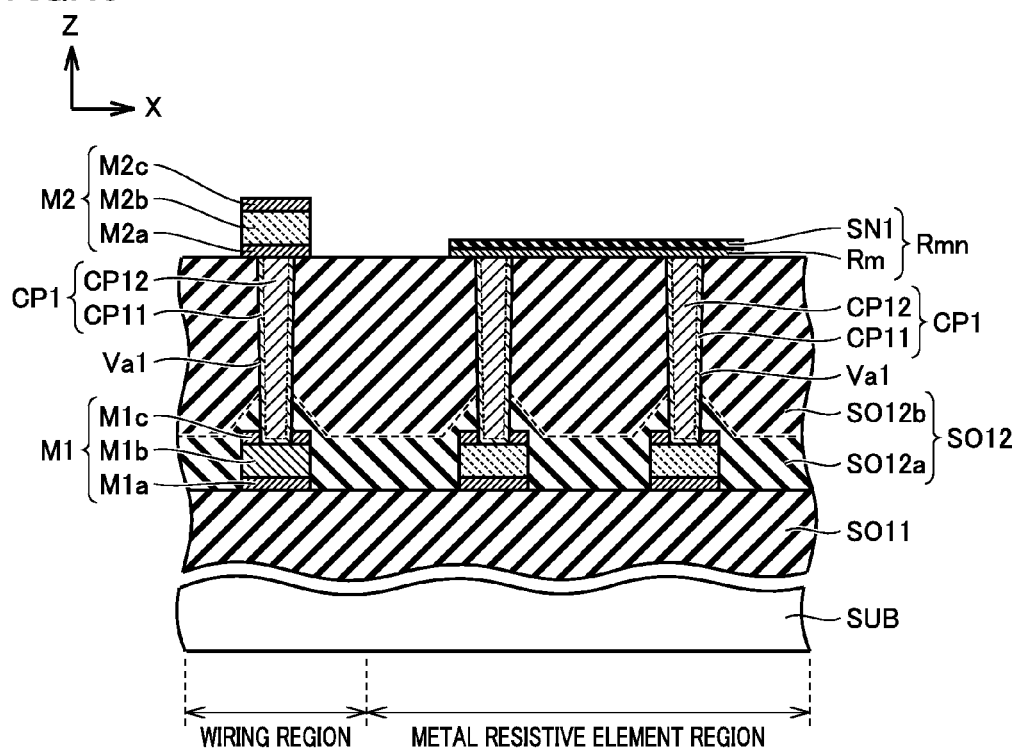
FIG. 40 is a schematic cross-sectional view showing a first step of a method of manufacturing the structure in FIG. 39 especially, in the seventh embodiment.

Referring to FIG. 40, the same processes as shown in FIGS. 24 and 25 in the third embodiment, for example are performed. That is, substrate SUB is prepared similar to the first embodiment, and interlayer insulating film SO11, the plurality of first wiring layers M1, and first insulating film SO12 are formed. The plurality of contact plugs CP1 are formed so as to extend from the upper face of first insulating film SO12 to first wiring layers M1 just below (planarly overlapping region) in the direction perpendicular to the main surface of substrate SUB (that is, Z direction). At least one metal resistive element layer Rmn is formed on the upper face of first insulating film SO12 so as to be positioned just above the plurality of (two, for example) contact plugs CP1 and stride two contact plugs CP1 formed apart from each other in the X direction (the metal resistive element region is formed). In the wiring region, second wiring layer M2 is formed so as to cover the upper face of first insulating film SO12 and planarly overlap with first wiring layer M1 (the wiring region is formed).

Referring to FIG. 39 again, after than, third insulating film SO14 and passivation film SN11 are formed on first insulating film SO12 in this order so as to cover the upper faces of second wiring layers M2. In addition, detailed descriptions of the omitted steps are basically the same as those in each embodiment.

Next, an operational advantage of this embodiment will be described.

According to this embodiment, contact plug CP1 extending from metal resistive element layer Rmn to first wiring layer M1 in the metal resistive element region can be formed with the same mask as the mask used for forming contact plug CP1 extending from second wiring layer M2 to first wiring layer M1 in the wiring region. This is because each of contact plug CP1 in the metal resistive element region and contact plug CP1 in the wiring region is formed from the same face (upper face of first insulating film SO12). Therefore, it is not necessary to separately prepare the mask for forming only contact plug CP1 for being connected to metal resistive element layer Rmn, so that contact plug CP1 for metal resistive element layer Rmn can be formed with the mask for forming the multilayer wiring structure. As a result, the manufacturing cost can be reduced.

Eighth Embodiment

First, a description will be given to a part of a multilayer wiring structure of a high-speed OCO circuit including metal resistive element layer Rmn in this embodiment with reference to FIG. 41.

Figure 41:
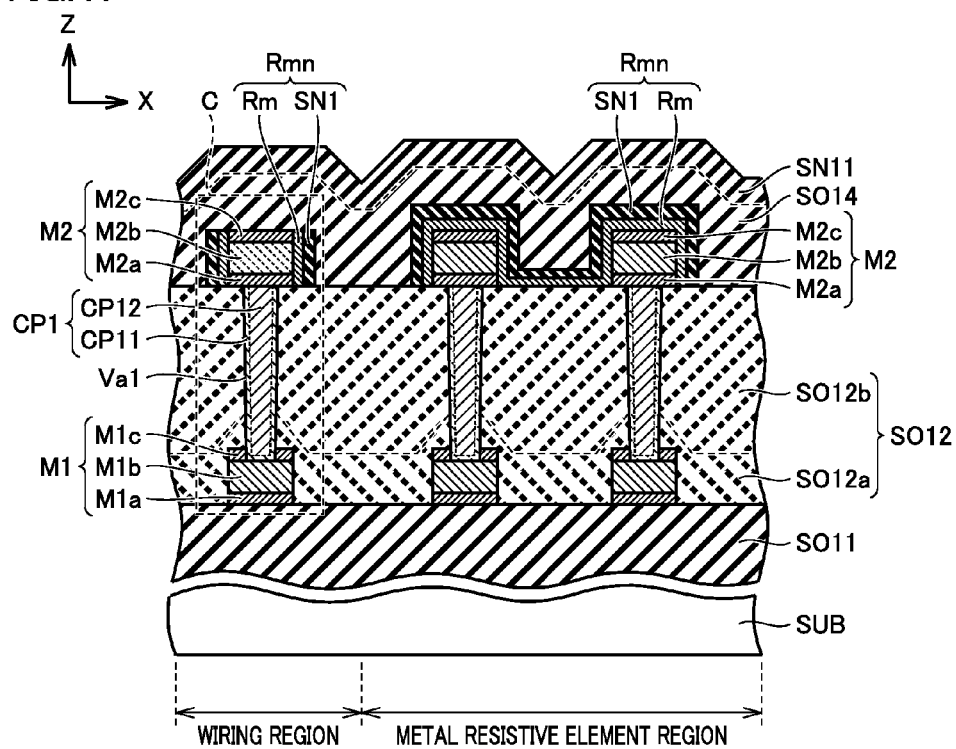
FIG. 41 is a schematic cross-sectional view showing a partial structure of a microcomputer chip in an eighth embodiment, including the high-speed OCO circuit in FIG. 2.

Referring to FIG. 41, according to the multilayer wiring structure of the high-speed OCO circuit of a semiconductor device in this embodiment, similar to the seventh embodiment, second wiring layer M2 (in the wiring region) and metal resistive element layer Rmn (in the metal resistive element region) are formed at least partially on the same first insulating film SO12 (first insulating film upper layer SO12b). However, in FIG. 41, in the metal resistive element region, metal resistive element layer Rmn is formed so as to cover upper face and side face of each of the plurality of (paired) second wiring layers M2 adjacent to each other, and cover first insulating film SO12 provided between the plurality of (paired) second wiring layers M2 adjacent to each other. As described above, metal resistive element layer Rmn has the two-layer structure composed of metal wiring layer Rm and reflection preventing film layer SN1, and metal wiring layer Rm is arranged on a lower side in the drawing, that is, arranged so as to be in contact with second wiring layer M2 and first insulating film SO12b. Therefore, pair of second wiring layers M2 (each having metal resistive element layer Rmn on its upper face and side face) adjacent to each other are electrically connected in the metal resistive element region.

According to this embodiment, in each of the wiring region and the metal resistive element region, contact plug CP1 extends from second wiring layer M2 to first wiring layer M1 in the Z direction. However, second wiring layer M2 in the metal resistive element region is electrically connected to metal wiring layer Rm of metal resistive element layer Rmn covering the upper face of second wiring layer M2, so that metal resistive element layer Rmn (metal wiring layer Rm) in the metal resistive element region is electrically connected to resistive element region contact plug CP1.

In addition, in FIG. 41, a side face of second wiring layer M2 in the wiring region is covered with another metal resistive element layer Rmn. Other metal resistive element layer Rmn is formed as the same layer as metal resistive element layer Rmn (metal resistive element layer Rmn is divided), so that similar to metal resistive element layer Rmn, it has the two-layer structure composed of metal wiring layer Rm and reflection preventing film layer SN1.

Figure 42:
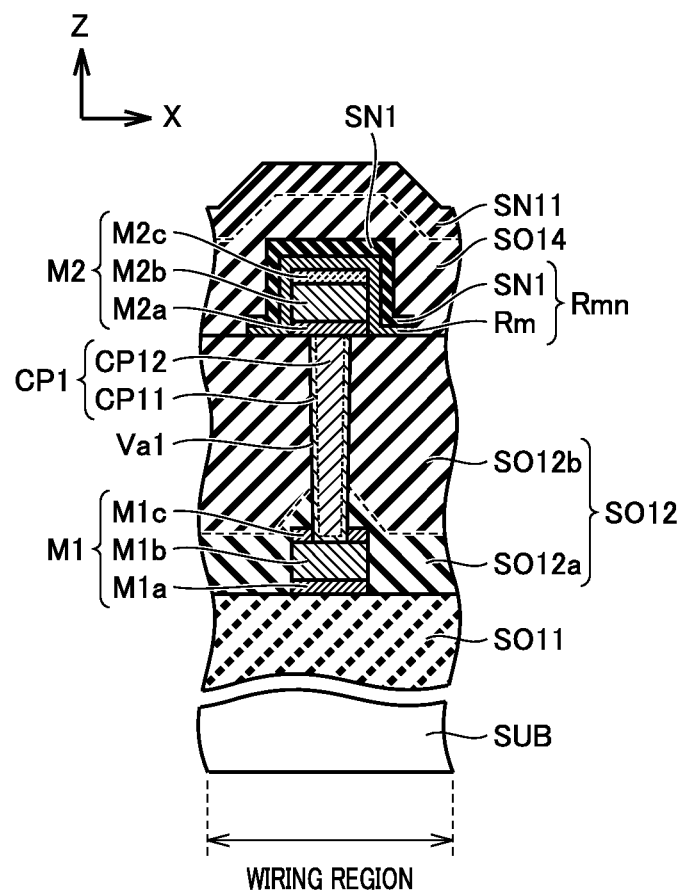
FIG. 42 is a schematic cross-sectional view showing a first variation of a structure of a wiring region shown in FIG. 41.
Figure 43:
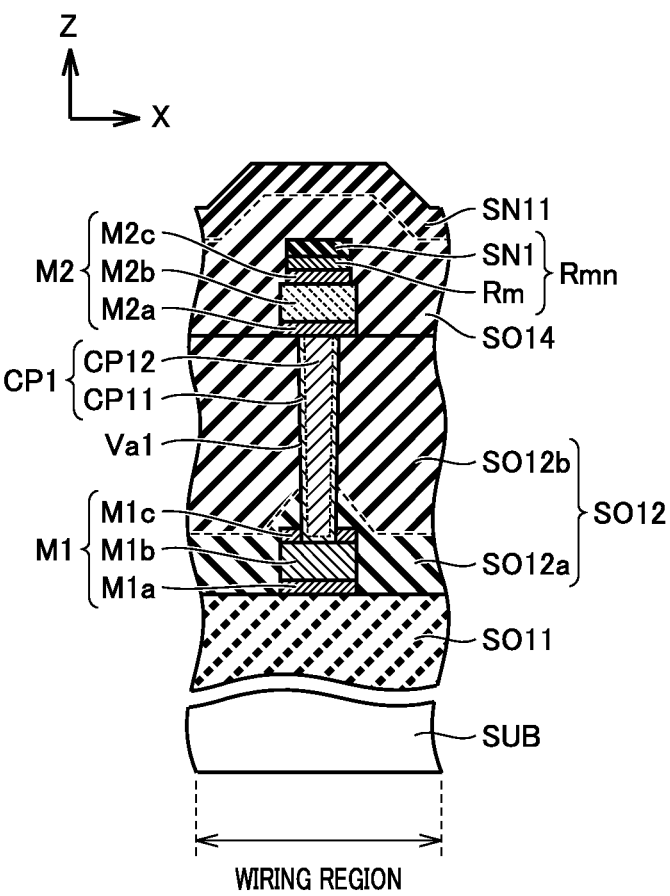
FIG. 43 is a schematic cross-sectional view showing a second variation of the structure of the wiring region shown in FIG. 41.

Referring to FIG. 42, in a region C surrounded by a dotted line FIG. 41 in the wiring region, both upper face and side face of second wiring layer M2 may be covered with other metal resistive element layer Rmn, or referring to FIG. 43, in region C surrounded by a dotted line FIG. 41 in the wiring region, only the upper face of second wiring layer M2 may be covered with other metal resistive element layer Rmn. That is, in the wiring region, at least one of the upper face and the side face of second wiring layer M2 is covered with other metal resistive element layer Rmn including the same layer with metal resistive element layer Rmn.

In addition, as shown in FIG. 43, according to this embodiment, in the case where metal resistive element layer Rmn is formed (only) on the upper face of second wiring layer M2 in the wiring region, metal resistive element layer Rmn is preferably smaller in size than second wiring layer M2 in the planar view. Therefore, second metal resistive element layer Rmn is arranged on second wiring layer M2 such that its center portion almost coincides with a center portion of second wiring layer M2, and a region having a constant width is provided between the outermost edge of metal resistive element layer Rmn and the outermost edge of second wiring layer M2 (in the vicinity of an outer periphery of second wiring layer M2).

In addition, a configuration of this embodiment other than the above is almost the same as the configuration of the seventh embodiment, so that the same component is marked with the same reference and its description is not repeated.

Next, a description will be given to a method of manufacturing a microcomputer chip (portion shown in FIGS. 41 to 43, especially) as a method of manufacturing the semiconductor device in this embodiment, with reference to FIGS. 44 to 47.

Figure 44:
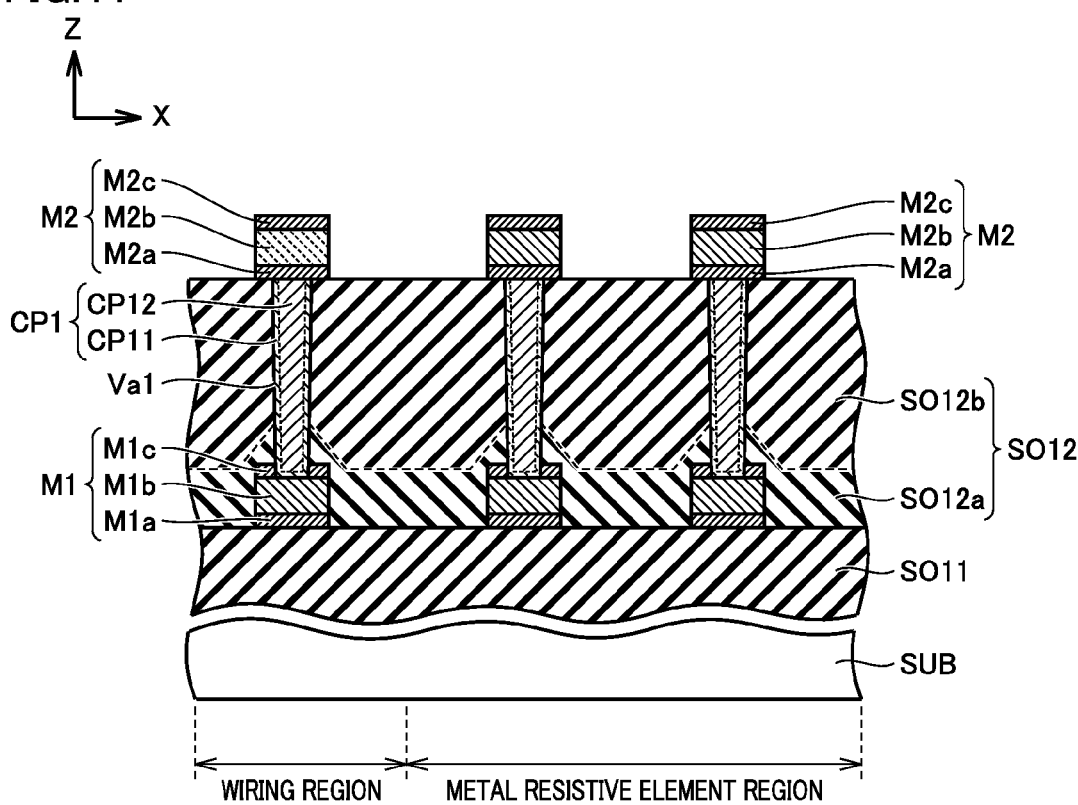
FIG. 44 is a schematic cross-sectional view showing a first step of a method of manufacturing the structure in FIG. 41 especially, in the eighth embodiment.

Referring to FIG. 44, a configuration shown in FIG. 44 is formed by basically the same process as the step in FIG. 40. However, FIG. 44 differs from FIG. 40 in that in the metal resistive element region, similar to the wiring region, the plurality of (two, for example) second wiring layers M2 are formed so as to planarly overlap with the plurality of (two, for example) first wiring layers M1, respectively. In each of the wiring region and the metal resistive element region, first wiring layer M1 and opposed second wiring layer M2 are connected through contact plug CP1.

Figure 45:
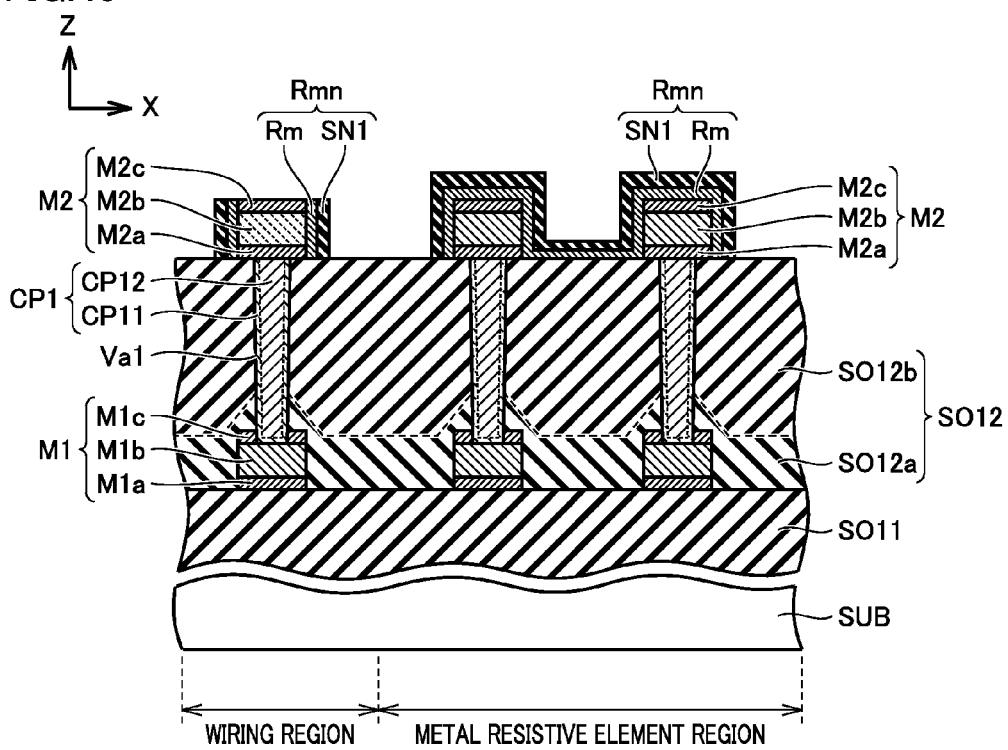
FIG. 45 is a schematic cross-sectional view showing a second step of the method of manufacturing the structure in FIG. 41 especially, in the eighth embodiment.

Referring to FIG. 45, metal resistive element layer Rmn is formed on first insulating film SO12 so as to cover the upper faces and the side faces of the plurality of second wiring layers M2 formed in the step in FIG. 44. After that, in the metal resistive element region, metal resistive element layer Rmn is patterned by photoengraving technique and dry etching processing so that metal resistive element layer Rmn is left on the upper faces and the side faces of one pair of second wiring layers M2 adjacent to each other, and on first insulating film SO12 provided between one pair of second wiring layers M2 adjacent to each other. Thus, metal resistive element layer Rmn is also formed so as to be left just above contact plug CP1 (with second wiring layer M2 interposed therebetween).

At this time, in the wiring region, metal resistive element layer Rmn may be patterned by photoengraving technique and dry etching processing so that metal resistive element layer Rmn is left (as other metal resistive element layer Rmn) on the side face of second wiring layer M2. Alternatively, referring to FIG. 46, in the wiring region, metal resistive element layer Rmn may be patterned by photoengraving technique and dry etching processing so that metal resistive element layer Rmn is left (as other metal resistive element layer Rmn) on the upper face and the side face of second wiring layer M2. Alternatively, referring to FIG. 47, in the wiring region, metal resistive element layer Rmn may be patterned by photoengraving technique and dry etching processing so that metal resistive element layer Rmn is left (as other metal resistive element layer Rmn) on the upper face of second wiring layer M2.

Figure 46:
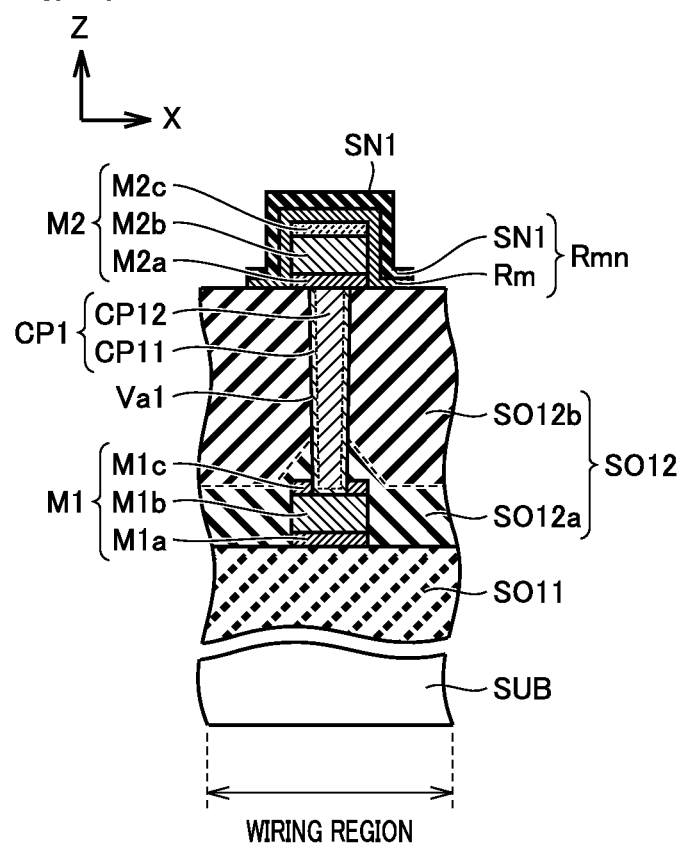
FIG. 46 is a schematic cross-sectional view showing a first variation of a structure of a wiring region formed by the step in FIG. 45.
Figure 47:
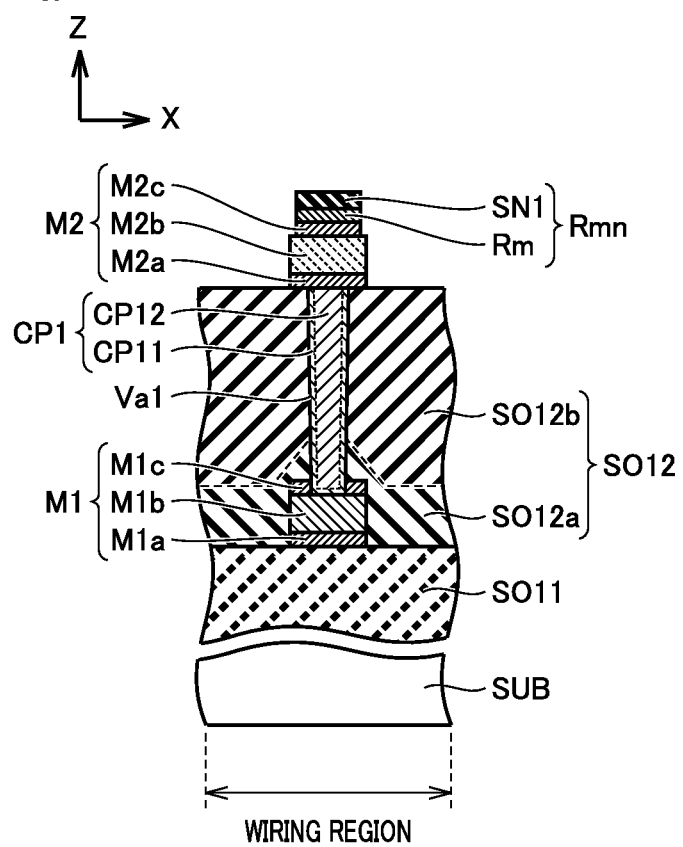
FIG. 47 is a schematic cross-sectional view showing a second variation of the structure of the wiring region formed by the step in FIG. 45.

More specifically, in the case where metal resistive element layer Rmn is larger in size than second wiring layer M2 in the planar view, for example, metal resistive element layer Rmn is formed so as to cover both upper face and side face of second wiring layer M2 as shown in FIG. 46 (FIG. 42). Alternatively, in the case where metal resistive element layer Rmn is smaller in size than second wiring layer M2 in the planar view, for example, metal resistive element layer Rmn is formed so as to cover only upper face of second wiring layer M2 as shown in FIG. 47 (FIG. 43).

Referring to FIGS. 41 to 43 again, after that, third insulating film SO14 and passivation film SN11 are formed on first insulating film SO12 in this order so as to cover the upper faces of second wiring layers M2. Note that detailed descriptions of the omitted steps are basically the same as those in each embodiment.

Next, an operational advantage of this embodiment will be described.

According to this embodiment also, contact plugs CP1 in the metal resistive element region and the wiring region can be formed with the same mask, so that the manufacturing cost can be reduced. In addition, according to this embodiment, the upper face and the side face of second wiring layer M2 in the metal resistive element region are covered with metal resistive element layer Rmn, so that second wiring layer M2 is protected by metal resistive element layer Rmn. Therefore, the reliability of second wiring layer M2 can be enhanced in the metal resistive element region. Furthermore, at least one of the upper face and the side face of second wiring layer M2 is covered with metal resistive element layer Rmn in the wiring region, so that second wiring layer M2 is protected by metal resistive element layer Rmn. Therefore, the reliability of second wiring layer M2 can be enhanced in the wiring region.

Figure 48:
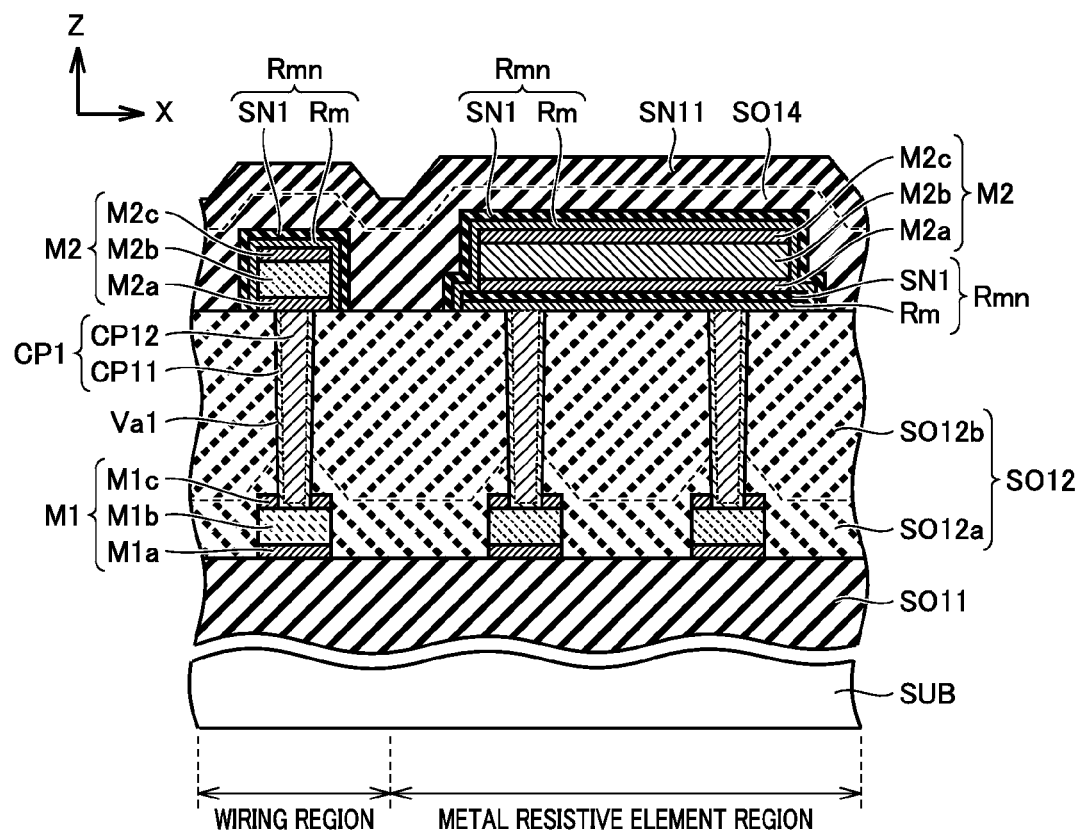
FIG. 48 is a schematic cross-sectional view showing a first variation of the partial structure of the microcomputer chip in the eighth embodiment, including the high-speed OCO circuit in FIG. 2.
Figure 49:
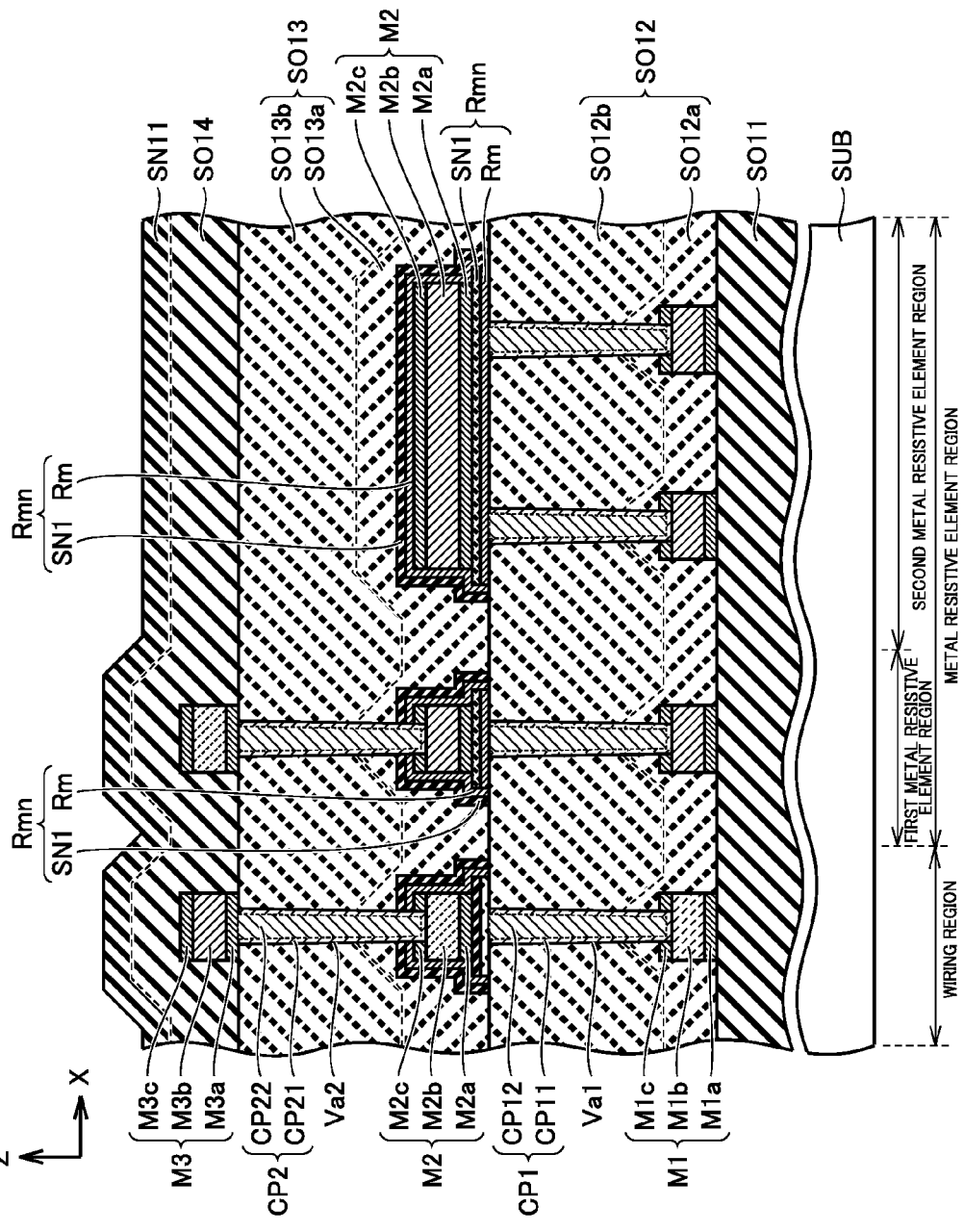
FIG. 49 is a schematic cross-sectional view showing a second variation of the partial structure of the microcomputer chip in the eighth embodiment, including the high-speed OCO circuit in FIG. 2.

Referring to a first variation of this embodiment in FIG. 48, this shows a structure in which both upper face and side face of second wiring layer M2 are covered with metal resistive element layer Rmn in each of the wiring region and the metal resistive element region, which partially corresponds to the multilayer wiring structure shown in FIG. 22 in the third embodiment. Referring to a second variation of this embodiment in FIG. 49, this shows a structure in which the upper face and the side face of second wiring layer M2 are covered with metal resistive element layer Rmn in each of the (first and second) metal resistive element regions, which partially corresponds to the multilayer wiring structure shown in FIG. 27 in the fourth embodiment. In this way, in the metal resistive element region, (other) metal resistive element layer Rmn may be formed so as to cover (at least one of) the upper face and side face of second wiring layer M2 which covers metal resistive element layer Rmn. Furthermore, in the wiring region, (other) metal resistive element layer Rmn may be formed so as to cover (at least one of) the upper face and the side face of wiring layer M2. Similar to the step in FIG. 45, these structures are also formed such that metal resistive element layer Rmn is formed on first insulating film SO12, and patterned into the shape shown in FIGS. 48 and 49. The upper face or the side face of second wiring layer M2 which is covered with metal resistive element layer Rmn can be prevented from being etched unintentionally at the time of etching of metal resistive element layer Rmn and being problematically changed in shape.

In addition, the contents described in the embodiments are partially described (additionally) below.

(1) A semiconductor device includes a plurality of first wiring layers, a first insulating film, a second insulating film, at least one second wiring layer, a metal resistive element layer, and a plurality of conductive layers. The plurality of first wiring layers are arranged on a main surface of a substrate. The first insulating film is arranged so as to cover upper faces of the plurality of first wiring layers. The second insulating film is arranged so as to cover an upper face of the first insulating film. At least one second wiring layer is arranged on the second insulating film. The metal resistive element layer is arranged on the upper face of the first insulating film so as to be positioned just above at least one of the plurality of first wiring layers. The plurality of conductive layers extend to the plurality of first wiring layers, respectively in a direction perpendicular to the main surface. At least one conductive layer among the plurality of conductive layers extends from the metal resistive element layer to the first wiring layer in the direction perpendicular to the main surface.

(2) A semiconductor device includes at least one first wiring layer, a first insulating film, a second insulating film, a plurality of second wiring layers, a metal resistive element layer, and a plurality of conductive layers. At least one first wiring layer is arranged on a main surface of a substrate. The first insulating film is arranged so as to cover an upper face of at least one first wiring layer. The second insulating film is arranged so as to cover an upper face of the first insulating film. The plurality of second wiring layers are arranged on the second insulating film. The metal resistive element layer is arranged on the upper face of the first insulating film so as to be positioned just below at least one second wiring layer among the plurality of second wiring layers. The plurality of conductive layers extend from the plurality of second wiring layers to the metal resistive element layer, respectively in a direction perpendicular to the main surface. At least one conductive layer among the plurality of conductive layers extends from the second wiring layer to the metal resistive element layer in the direction perpendicular to the main surface.

(3) As for the semiconductor device in (2), at least one conductive layer extending to the metal resistive element layer among the plurality of conductive layers is a resistive element region conductive layer arranged in a metal resistive element region so as to planarly overlap with the metal resistive element layer. At least one conductive layer among the plurality of conductive layers is a wiring region conductive layer arranged in a wiring region other than the metal resistive element region so as to extend from at least one second wiring layer among the plurality of second wiring layers to at least one first wiring layer.

(4) A semiconductor device includes a plurality of first wiring layers, a first insulating film, at least one metal resistive element layer, at least one second wiring layer, and a plurality of conductive layers. The plurality of first wiring layers are arranged on a main surface of a substrate. The first insulating film is arranged so as to cover upper faces of the plurality of first wiring layers. At least one metal resistive element layer is arranged on the first insulating layer. At least one second wiring layer includes the same layer with at least one metal resistive element layer. The plurality of conductive layers extend from at least one of the metal resistive element layer and the second wiring layer to the plurality of first wiring layers in the direction perpendicular to the main surface, in each of the metal resistive element region having at least one metal resistive element layer, and the wiring region having at least one second wiring layer.

(5) As for the semiconductor device in (4), at least one of the plurality of conductive layers serves as a resistive element region conductor layer which is arranged in the metal resistive element region so as to planarly overlap with the metal resistive element layer, and extend from at least one metal resistive element layer to at least one first wiring layer among the plurality of first wiring layers. At least one of the plurality of conductive layers serves as a wiring region conductive layer which extends from at least one second wiring layer to at least one first wiring layer among the plurality of first wiring layers, in the wiring region other than metal resistive element region.

(6) As for the semiconductor device in (5), there are several second wiring layers in the metal resistive element region. The metal resistive element layer is formed so as to cover upper faces and side faces of the adjacent one pair of second wiring layers and on the first insulating film between the adjacent one pair of second wiring layers in the metal resistive element region.

(7) As for the semiconductor device in (5), at least one of the upper face and side face of the second wiring layer is covered with another metal resistive element layer including the same layer as the metal resistive element layer, in the wiring region.

(8) According to a method of manufacturing a semiconductor device, a plurality of first wiring layers are formed on a main surface of a substrate. A first insulating film is formed so as to cover upper faces of the plurality of first wiring layers. A metal resistive element layer is formed on an upper face of the first insulating film so as to be positioned just above at least one first wiring layer among the plurality of first wiring layers. A second insulating film is formed so as to cover the upper faces of the metal resistive element layer and the first insulating film. A plurality of conductive layers are formed so as to extend from an upper face of the second insulating film to the metal resistive element layer in a direction perpendicular to the main surface. A plurality of second wiring layers are formed on the second insulating film so as to cover the plurality of conductive layers. The metal resistive element layer includes a metal wiring layer. At least one part of a side face of at least one conductive layer among the plurality of conductive layers is connected to the metal wiring layer.

(9) As for the method of manufacturing the semiconductor device in (8), the metal wiring layer has a first face along the main surface and a second face opposed to the first face. In the step of forming the plurality of conductive layers, at least one conductive layer, connected to the metal wiring layer, among the plurality of conductive layers is formed as a resistive element region conductive layer which planarly overlaps with the metal wiring layer, in the metal resistive element region. The resistive element region conductive layer is formed so as to penetrate the metal wiring layer from the first face to the second face.

(10) As for the method of manufacturing the semiconductor device in (9), the resistive element region conductive layer is formed so as to extend from at least one second wiring layer, formed in the metal resistive element region, among the plurality of second wiring layers, to at least one first wiring layer, formed in the metal resistive element region, among the plurality of first wiring layers through the metal wiring layer.

(11) As for the method of manufacturing the semiconductor device in (9), in the direction perpendicular to the main surface, a depth of the resistive element region conductive layer in the metal resistive element region is equal to a depth of the wiring region conductive layer extending from at least one second wiring layer among the plurality of second wiring layers to at least one first wiring layer among the plurality of first wiring layers in the wiring region other than the metal resistive element region.

(12) According to a method of manufacturing a semiconductor device, at least one first wiring layer and one metal resistive element layer are formed on a main surface of a substrate. A first insulating film is formed so as to cover upper faces of the first wiring layer and the metal resistive element layer. A plurality of conductive layers are formed so as to extend from an upper face of the first insulating film to the metal resistive element layer in a direction perpendicular to the main surface. A plurality of second wiring layers are formed on the first insulating film so as to cover the plurality of conductive layers. In the step of forming the metal resistive element layer, the metal resistive element layer is formed closer to the first wiring layer than to the plurality of second wiring layers in the direction perpendicular to the main surface, and positioned just below at least one second wiring layer among the plurality of second wiring layers. At least one conductive layer among the plurality of conductive layers is a resistive element region conductive layer which is arranged in a metal resistive element region so as to planarly overlap with the metal resistive element layer, and extend from at least one second wiring layer, arranged in the metal resistive element region, among the plurality of second wiring layers, to the metal resistive element layer. At least one conductive layer among the plurality of conductive layers is a wiring region conductive layer extending from at least one second wiring layer among the plurality of second wiring layers to at least one first wiring layer in a wiring region other than the metal resistive element region. A depth of the resistive element region conductive layer in the direction perpendicular to the main surface is equal to a depth of the wiring region conductive layer.

(13) As for the method of manufacturing the semiconductor device in (12), the first insulating film includes a thin film insulating layer which covers both upper face of at least one wiring layer and surface on which at least one wiring layer is formed. The metal resistive element layer is formed so as to cover an upper face of the thin film layer.

(14) According to a method of manufacturing a semiconductor device, a plurality of first wiring layers are formed on a main surface of a substrate. A first insulating film is formed so as to cover upper faces of the plurality of first wiring layers. A plurality of conductive layers are formed on an upper face of the first insulating film so as to extend from regions planarly overlapping with the plurality of first wiring layers to at least one first wiring layer among the plurality of first wiring layers in a direction perpendicular to the main surface. At least one metal resistive element layer is formed on the upper face of the first insulating film so as to be positioned just above at least one conductive layer among the plurality of conductive layers. A plurality of second wiring layers are formed on the first insulating film. An upper face of at least one metal resistive element layer is covered with at least one of the plurality of second wiring layers.

(15) As for the method of manufacturing the semiconductor device in (14), a plurality of metal resistive element layers are formed. The step of forming at least one metal resistive element layer includes a step of forming a metal wiring layer, and a step of forming a reflection preventing film layer covering an upper face of the metal wiring layer. In the step of forming at least one metal resistive element layer, a first metal resistive element layer is formed to constitute a capacitive element composed of the metal wiring layer and the reflection preventing film layer in the metal resistive element layer, and the second wiring layer covering an upper face of the reflection preventing film layer, and a second metal resistive element layer is formed to be connected to each of the plurality of first wiring layers through the plurality of conductive layers.

(16) As for the method of manufacturing the semiconductor device in (15), in the step of forming the plurality of second wiring layers, the plurality of second wiring layers for protection are formed so as to cover upper faces of the first and second metal resistive element layers, and at least one second wiring layer for wiring is formed on the same layer as the first and second metal resistive element layers, so as to be spaced apart from those metal resistive element layers.

(17) As for the method of manufacturing the semiconductor device in (16), a second insulating film is formed on the first insulating film so as to cover an upper face of the second wiring layer for protection in the capacitive element. Another conductive layer is formed so as to extend from the capacitive element to a direction opposite to the substrate in the direction perpendicular to the main surface. A third wiring layer is formed on the second insulating film so as to be positioned just above the capacitive element. The other conductive layer is connected to the third wiring layer.

(18) As for the method of manufacturing the semiconductor device in (16), a second insulating film is formed on the first insulating film so as to cover an upper face of the second wiring layer for wiring. Another conductive layer is formed so as to extend from the upper face of the second wiring layer for wiring to a direction opposite to the substrate in the direction perpendicular to the main surface. A third wiring layer is formed on the second insulating film so as to be positioned just above the second wiring layer for wiring. The other conductive layer is connected to the third wiring layer.

(19) As for the method of manufacturing the semiconductor device in (14), in the step of forming the plurality of conductive layers, at least one of the plurality of conductive layers is formed as a resistive element region conductive layer arranged so as to planarly overlap with the metal resistive element layer in a metal resistive element region, and extend from at least one metal resistive element layer to at least one first wiring layer among the plurality of first wiring layers. At least one of the plurality of conductive layers is formed as a wiring region conductive layer formed so as to extend from at least one second wiring layer among the plurality of second wiring layers to at least one first wiring layer among the plurality of first wiring layers in a wiring region other than the metal resistive element region.

(20) As for the method of manufacturing the semiconductor device in (19), another metal resistive element layer is formed so as to cover at least one of an upper face and a side face of the second wiring layer covering an upper face of the metal resistive element layer, in the metal resistive element region.

(21) As for the method of manufacturing the semiconductor device in (20), at least one of the upper face and the side face of the second wiring layer in the wiring region is covered by the other metal resistive element layer.

(22) According to a method of manufacturing a semiconductor device, a plurality of first wiring layers are formed on a main surface of a substrate. A first insulating film is formed so as to cover upper faces of the plurality of first wiring layers. At least one conductive layer is formed so as to extend from a region which planarly overlaps with at least one first wiring layer among the plurality of first wiring layers in an upper face of the first insulating film, to at least one first wiring layer among the plurality of first wiring layers in a direction perpendicular to the main surface. A metal resistive element layer is formed on the upper face of the first insulating film so as to be positioned just above at least one conductive layer. A second insulating film is formed so as to cover upper faces of the metal resistive element layer and the first insulating film. At least one other conductive layer is formed so as to extend from a region which planarly overlaps with at least one first wiring layer among the plurality of first wiring layers in which the conductive layer is not formed in the step of forming the conductive layer in an upper face of the second insulating film, to the first wiring layer in which at least one conductive layer is not formed, in the direction perpendicular to the main surface. At least one second wiring layer is formed on the second insulating film so as to cover at least one other conductive layer.

(23) According to a method of manufacturing a semiconductor device, at least one first wiring layer is formed on a main surface of a substrate. A first insulating film is formed so as to cover an upper face of at least one first wiring layer. A metal resistive element layer is formed on an upper face of the first insulating film in a region other than a position just above at least one first wiring layer. A second insulating film is formed so as to cover the upper faces of the metal resistive element layer and the first insulating film. A plurality of conductive layers are formed so as to extend from an upper face of the second insulating film to the metal resistive element layer in a direction perpendicular to the main surface. A plurality of second wiring layers are formed on the second insulating film so as to cover the plurality of wiring layers. At least one conductive layer of the plurality of conductive layers extends from the second wiring layer to the metal resistive element layer in the direction perpendicular to the main surface.

(24) As for the method of manufacturing the semiconductor device in (23), in the step of forming the plurality of conductive layers, at least one of conductive layers, which extends to the metal resistive element layer among the plurality of conductive layers is formed as a resistive element region conductive layer arranged so as to planarly overlap with the metal resistive element layer in a metal resistive element region. At least one conductive layer among the plurality of conductive layers is formed as a wiring region conductive layer extending from at least one second wiring layer among the plurality of second wiring layers to at least one first wiring layer in a wiring region other than the metal resistive element region.

(25) According to a method of manufacturing a semiconductor device, a plurality of first wiring layers are formed on a main surface of a substrate. A first insulating film is formed so as to cover upper faces of the plurality of first wiring layers. A plurality of conductive layers are formed so as to each extend from a region which planarly overlaps with each of the plurality of first wiring layers in an upper face of the first insulating film, to at least one first wiring layer of the plurality of first wiring layers in a direction perpendicular to the main surface. In the upper face of the first insulating film, a metal resistive element region is formed in which at least one metal resistive element layer is formed just above at least one of the plurality of conductive layers. A wiring region is formed in which at least one second wiring layer is formed on the first insulating film so as to planarly overlap with at least one first wiring layer. At least one second wiring layer is formed on the same layer with at least one metal resistive element layer.

(26) As for the method of manufacturing the semiconductor device in (25), in the step of forming the plurality of conductive layers, at least one of the plurality of conductive layers is formed as a resistive element region conductive layer arranged so as to planarly overlap with the metal resistive element layer in the metal resistive element region, and extend from at least one metal resistive element layer to at least one first wiring layer among of the plurality of first wiring layers. At least one of the plurality of conductive layers is formed as a wiring region conductive layer formed so as to extend from at least one second wiring layer to at least one first wiring layer among the plurality of first wiring layers in the wiring region other than the metal resistive element region.

(27) As for the method of manufacturing the semiconductor device in (26), in the step of forming the region having the second wiring layer, the plurality of second wiring layers are formed in the metal resistive element region. The metal resistive element layer is formed on an upper face and a side face of the one adjacent pair of second wiring layers, and on the first insulating film provided between the one adjacent pair of second wiring layers in the metal resistive element region.

(28) As for the method of manufacturing the semiconductor device in (26), in the step of forming the metal resistive element layer, at least one of the upper face and the side face of the second wiring layer in the wiring region is covered with the other metal resistive element layer formed on the same layer as the metal resistive element layer.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a plurality of first wiring layers arranged on a main surface of a substrate;
   a first insulating film covering upper faces of said plurality of first wiring layers;
   at least one metal resistive element layer comprising a plurality of metal wiring layers and arranged above at least one said first wiring layer among said plurality of first wiring layers and covering an upper face of said first insulating film;
   a plurality of second wiring layers arranged on said first insulating film; and
   a plurality of conductive layers extending from said at least one metal resistive element layer and at least one of said plurality of second wiring layers to said plurality of first wiring layers in a direction perpendicular to said main surface, wherein
   an upper face of said at least one metal resistive element layer is covered with at least the at least one of said plurality of second wiring layers,
   said at least one metal resistive element layer comprises a plurality of metal resistive element layers,
   said at least one metal resistive element layer further comprises a reflection preventing film layer covering an upper face of at least one of the plurality of metal wiring layers, and
   said plurality of metal resistive element layers further comprises at least one first metal resistive element layer constituting a capacitive element with the at least one of the plurality of metal wiring layers, and said reflection preventing film layer in said metal resistive element layer, and the at least one of said plurality of second wiring layers covering an upper face of said reflection preventing film layer, and at least one of said plurality of second metal resistive element layers connected to each of said plurality of first wiring layers through one of said plurality of conductive layers.

2. The semiconductor device according to claim 1, wherein
   said plurality of second wiring layers further comprise a plurality of second wiring layers covering upper faces of said plurality of first metal resistive element layers and said plurality of second metal resistive element layers, and the at least one of said plurality of second wiring layers is arranged on a same layer with said plurality of first metal resistive element layers and said plurality of second metal resistive element layers and spaced apart from said plurality of metal resistive element layers.

3. The semiconductor device according to claim 2, further comprising:
   a second insulating film arranged on said first insulating film and covering an upper face of the at least one of said plurality of second wiring layers constituting said capacitive element;
   another conductive layer extending from said capacitive element in a direction away from said substrate in the direction perpendicular to said main surface; and
   a third wiring layer formed on said second insulating film and arranged above said capacitive element, wherein
   said other conductive layer is connected to said third wiring layer.

4. The semiconductor device according to claim 2, further comprising:
   a second insulating film arranged on said first insulating film and covering an upper face of the at least one of said plurality of second wiring layers;
   another conductive layer extending from an upper face of the at least one of said plurality of second wiring layers in a direction away from said substrate in the direction perpendicular to said main surface; and
   a third wiring layer formed on said second insulating film and positioned above the at least one of said plurality of second wiring layers, wherein
   said other conductive layer is connected to said third wiring layer.

5. A semiconductor device comprising:
   a plurality of first wiring layers arranged on a main surface of a substrate;
   a first insulating film covering upper faces of said plurality of first wiring layers;
   at least one metal resistive element layer comprising a plurality of metal wiring layers and arranged above at least one said first wiring layer among said plurality of first wiring layers and covering an upper face of said first insulating film;
   a plurality of second wiring layers arranged on said first insulating film; and
   a plurality of conductive layers extending from said at least one metal resistive element layer and at least one of said plurality of second wiring layers to said plurality of first wiring layers in a direction perpendicular to said main surface, wherein
   an upper face of said at least one metal resistive element layer is covered with at least the at least one of said plurality of second wiring layers,
   at least one of said plurality of conductive layers is a resistive element region conductive layer arranged in a metal resistive element region and planarly overlapping with the at least one metal resistive element layer, and extending from the at least one metal resistive element layer to at least one said plurality of first wiring layers,
   at least one of said plurality of conductive layers is a wiring region conductive layer extending from the at least one of said plurality of second wiring layers to the at least one of said plurality of first wiring layers in a wiring region other than said metal resistive element region, and
   another metal resistive element layer covers at least one of an upper face and a side face of the at least one of said plurality of second wiring layers covering the upper face of the at least one metal resistive element layer in said metal resistive element region.

6. A semiconductor device comprising:

a plurality of first wiring layers arranged on a main surface of a substrate;

a first insulating film covering upper faces of said plurality of first wiring layers;

at least one metal resistive element layer comprising a plurality of metal wiring layers and arranged above at least one said first wiring layer among said plurality of first wiring layers and covering an upper face of said first insulating film;

a plurality of second wiring layers arranged on said first insulating film; and a plurality of conductive layers extending from said at least one metal resistive element layer and at least one of said plurality of second wiring layers to said plurality of first wiring layers in a direction perpendicular to said main surface, wherein an upper face of said at least one metal resistive element layer is covered with at least the at least one of said plurality of second wiring layers, at least one of said plurality of conductive layers is a resistive element region conductive layer arranged in a metal resistive element region and planarly overlapping with the at least one metal resistive element layer, and extending from the at least one metal resistive element layer to at least one said plurality of first wiring layers, at least one of said plurality of conductive layers is a wiring region conductive layer extending from the at least one of said plurality of second wiring layers to the at least one of said plurality of first wiring layers in a wiring region other than said metal resistive element region, and at least one of an upper face and a side face of the at least one of said plurality of second wiring layers is covered with another metal resistive element layer in said wiring region.

* * * * *